United States Patent
Kimura

(10) Patent No.: US 9,201,280 B2
(45) Date of Patent: Dec. 1, 2015

(54) SEMICONDUCTOR DEVICE

(71) Applicant: Semiconductor Energy Laboratory Co., Ltd., Atsugi-shi, Kanagawa-ken (JP)

(72) Inventor: Hajime Kimura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/629,772

(22) Filed: Feb. 24, 2015

(65) Prior Publication Data

US 2015/0177543 A1    Jun. 25, 2015

Related U.S. Application Data

(63) Continuation of application No. 13/919,615, filed on Jun. 17, 2013, now Pat. No. 8,999,750, which is a continuation of application No. 12/629,219, filed on Dec. 2, 2009, now Pat. No. 8,476,625.

(30) Foreign Application Priority Data

Dec. 5, 2008    (JP) ................ 2008-311146

(51) Int. Cl.
     *H01L 21/00*      (2006.01)
     *H01L 21/16*      (2006.01)
     (Continued)

(52) U.S. Cl.
     CPC .......... *G02F 1/1368* (2013.01); *G02F 1/13439* (2013.01); *G02F 1/133345* (2013.01);
     (Continued)

(58) Field of Classification Search
     CPC .............. H01L 29/7869; H01L 27/124; H01L 27/1225; H01L 27/1255; H01L 27/3262; H01L 27/3265; H01L 27/0629; H01L 27/0733; H01L 29/458; H01L 29/4908; H01L 21/67011; H01L 21/67086
     See application file for complete search history.

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

CN      001694223 A    11/2005
CN      001776513 A    5/2006
(Continued)

OTHER PUBLICATIONS

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
(Continued)

*Primary Examiner* — Thanh Y Tran
(74) *Attorney, Agent, or Firm* — Eric J. Robinson; Robinson Intellectual Property Law Office, P.C.

(57) ABSTRACT

A semiconductor device includes an oxide semiconductor layer provided over a substrate having an insulating surface; a gate insulating film covering the oxide semiconductor layer; a first conductive layer and a second conductive layer laminated in this order over the gate insulating film; an insulating film covering the oxide semiconductor layer and a gate wiring including a gate electrode (the first and second conductive layers); and a third conductive layer and a fourth conductive layer laminated in this order over the insulating film and electrically connected to the oxide semiconductor layer. The gate electrode is formed using the first conductive layer. The gate wiring is formed using the first conductive layer and the second conductive layer. A source electrode is formed using the third conductive layer. A source wiring is formed using the third conductive layer and the fourth conductive layer.

20 Claims, 31 Drawing Sheets

(51) Int. Cl.

| | |
|---|---|
| *G02F 1/1368* | (2006.01) |
| *H01L 27/12* | (2006.01) |
| *H01L 29/66* | (2006.01) |
| *G02F 1/1333* | (2006.01) |
| *G02F 1/1335* | (2006.01) |
| *G02F 1/1343* | (2006.01) |
| *G02F 1/1362* | (2006.01) |
| *H01L 29/786* | (2006.01) |

(52) U.S. Cl.
CPC .... *G02F1/133528* (2013.01); *G02F 1/136277* (2013.01); *G02F 1/136286* (2013.01); *H01L 27/124* (2013.01); *H01L 27/1225* (2013.01); *H01L 27/1255* (2013.01); *H01L 27/1288* (2013.01); *H01L 29/66969* (2013.01); *H01L 29/7869* (2013.01); *G02F 2201/40* (2013.01)

(56) References Cited

U.S. PATENT DOCUMENTS

| | | |
|---|---|---|
| 6,268,895 B1 | 7/2001 | Shimada et al. |
| 6,294,274 B1 | 9/2001 | Kawazoe et al. |
| 6,515,720 B1 | 2/2003 | Iizuka et al. |
| 6,563,174 B2 | 5/2003 | Kawasaki et al. |
| 6,657,688 B2 | 12/2003 | Nagata et al. |
| 6,727,522 B1 | 4/2004 | Kawasaki et al. |
| 6,864,134 B1 | 3/2005 | Satou et al. |
| 6,933,989 B2 | 8/2005 | Oke et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,323,716 B2 | 1/2008 | Satou et al. |
| 7,361,934 B2 | 4/2008 | Ishii |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,521,368 B2 | 4/2009 | Yamaguchi et al. |
| 7,619,254 B2 | 11/2009 | Lee et al. |
| 7,674,650 B2 | 3/2010 | Akimoto et al. |
| 7,732,819 B2 | 6/2010 | Akimoto et al. |
| 7,737,438 B2 | 6/2010 | Endo et al. |
| 7,768,621 B2 | 8/2010 | Oke et al. |
| 7,821,613 B2 | 10/2010 | Kimura |
| 7,915,650 B2 * | 3/2011 | Lee et al. ...................... 257/259 |
| 8,003,981 B2 | 8/2011 | Iwasaki et al. |
| 8,149,346 B2 | 4/2012 | Kimura |
| 8,372,701 B2 | 2/2013 | Lee et al. |
| 8,441,185 B2 * | 5/2013 | Kuwabara et al. ............ 313/506 |
| 8,576,347 B2 | 11/2013 | Kimura |
| 8,581,260 B2 | 11/2013 | Yamazaki et al. |
| 8,637,869 B2 | 1/2014 | Lee et al. |
| 8,885,114 B2 | 11/2014 | Kimura |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0121673 A1 | 6/2005 | Satou et al. |
| 2005/0199959 A1 | 9/2005 | Chiang et al. |
| 2005/0237464 A1 | 10/2005 | Oke et al. |
| 2005/0250308 A1 | 11/2005 | Yamaguchi et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0029929 A1 * | 2/2007 | Nakamura et al. ............ 313/506 |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0215945 A1 | 9/2007 | Tokunaga et al. |
| 2007/0252928 A1 | 11/2007 | Ito et al. |
| 2007/0272922 A1 | 11/2007 | Kim et al. |
| 2007/0278498 A1 | 12/2007 | Nakamura et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0050895 A1 | 2/2008 | Miyairi et al. |
| 2008/0057607 A1 | 3/2008 | Oke et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0265254 A1 | 10/2008 | Nishiura |
| 2008/0296568 A1 | 12/2008 | Ryu et al. |
| 2008/0308795 A1 | 12/2008 | Lee et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 * | 5/2009 | Sakakura et al. ............... 257/72 |
| 2009/0152506 A1 | 6/2009 | Umeda et al. |
| 2009/0152541 A1 | 6/2009 | Maekawa et al. |
| 2009/0160741 A1 | 6/2009 | Inoue et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0072583 A1 | 3/2010 | Oikawa et al. |

(56) References Cited

U.S. PATENT DOCUMENTS

| | | |
|---|---|---|
| 2010/0092800 A1 | 4/2010 | Itagaki et al. |
| 2010/0109002 A1 | 5/2010 | Itagaki et al. |
| 2010/0117078 A1 | 5/2010 | Kuwabara et al. |
| 2010/0133530 A1 | 6/2010 | Akimoto et al. |
| 2010/0177269 A1 | 7/2010 | Kimura |
| 2011/0256684 A1 | 10/2011 | Iwasaki et al. |
| 2012/0170784 A1 | 7/2012 | Kimura |
| 2015/0129883 A1 | 5/2015 | Kimura |

FOREIGN PATENT DOCUMENTS

| | | |
|---|---|---|
| CN | 101252134 A | 8/2008 |
| EP | 1737044 A | 12/2006 |
| EP | 2006824 A | 12/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-235939 A | 8/1994 |
| JP | 07-092491 A | 4/1995 |
| JP | 08-069009 A | 3/1996 |
| JP | 08-264794 A | 10/1996 |
| JP | 09-311351 A | 12/1997 |
| JP | 10-253976 A | 9/1998 |
| JP | 11-505377 | 5/1999 |
| JP | 2000-044236 A | 2/2000 |
| JP | 2000-150900 A | 5/2000 |
| JP | 2000-187248 A | 7/2000 |
| JP | 2001-343670 A | 12/2001 |
| JP | 2002-072248 A | 3/2002 |
| JP | 2002-076356 A | 3/2002 |
| JP | 2002-090779 A | 3/2002 |
| JP | 2002-289859 A | 10/2002 |
| JP | 2003-086000 A | 3/2003 |
| JP | 2003-086808 A | 3/2003 |
| JP | 2003-131590 A | 5/2003 |
| JP | 2003-332581 A | 11/2003 |
| JP | 2004-014982 A | 1/2004 |
| JP | 2004-103957 A | 4/2004 |
| JP | 2004-273614 A | 9/2004 |
| JP | 2004-273732 A | 9/2004 |
| JP | 2006-286773 A | 10/2006 |
| JP | 2007-081362 A | 3/2007 |
| JP | 2007-096055 A | 4/2007 |
| JP | 2007-123700 A | 5/2007 |
| JP | 2007-123861 A | 5/2007 |
| JP | 2007-220817 A | 8/2007 |
| JP | 2007-250983 A | 9/2007 |
| JP | 2007-299833 A | 11/2007 |
| JP | 2008-072025 A | 3/2008 |
| JP | 2008-176262 A | 7/2008 |
| JP | 2008-275937 A | 11/2008 |
| KR | 2000-0011686 A | 2/2000 |
| KR | 2007-0041363 A | 4/2007 |
| TW | 589499 | 6/2004 |
| WO | WO-2004/114391 | 12/2004 |
| WO | WO-2007/119386 | 10/2007 |
| WO | WO-2007/119727 | 10/2007 |

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)3$, and $Ga_2O_3(ZnO)m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of The 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

(56) References Cited

OTHER PUBLICATIONS

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devces Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by PEALD Grown ZnO TFT", IMID '07 Digest, 2007, pp. 1249-1252.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YbFe2O4, andYb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures of 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies In ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.

(56) References Cited

OTHER PUBLICATIONS

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Chinese Office Action (Application No. 200910253848.4) Dated Feb. 25, 2014.

Taiwanese Office Action (Application No. 098141377) Dated Dec. 17, 2014.

Korean Office Action (Application No. 2014-0168976) Dated Sep. 15, 2015.

\* cited by examiner

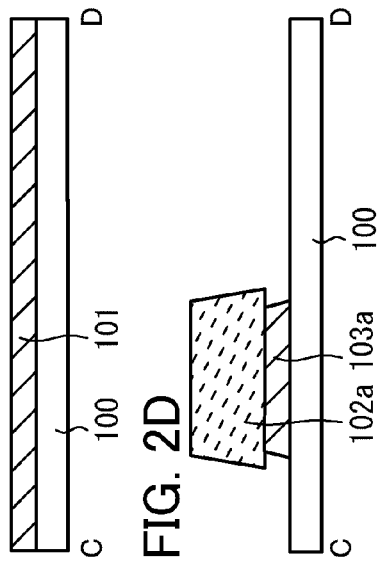
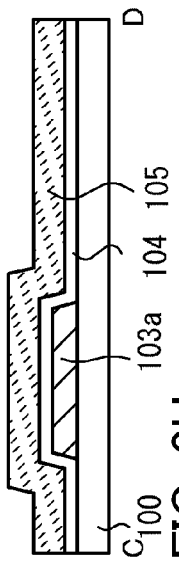
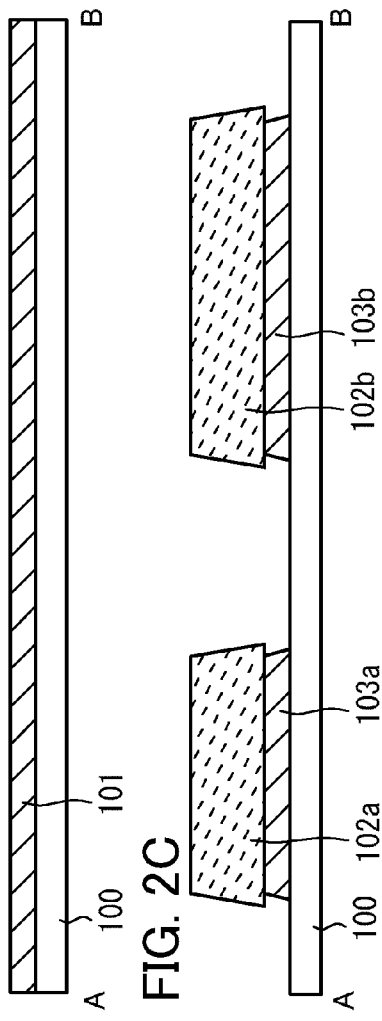
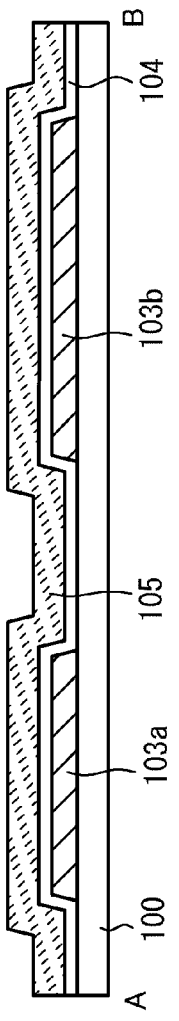

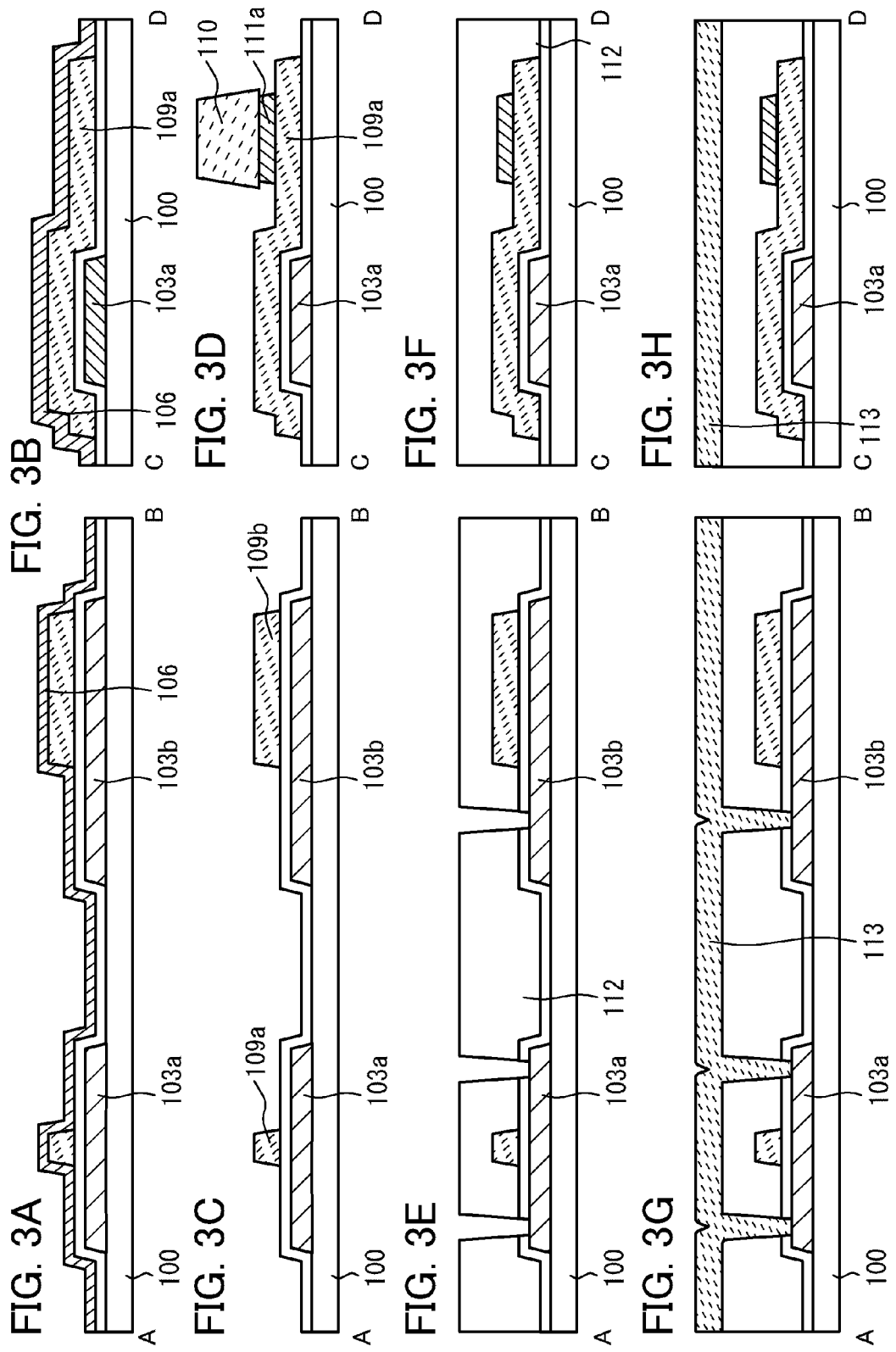

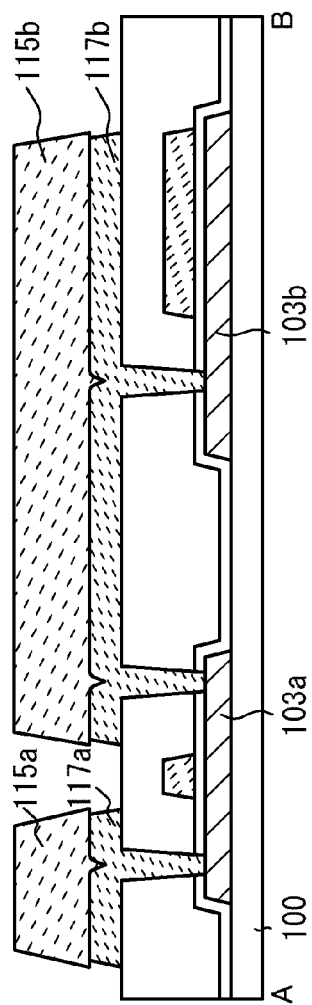
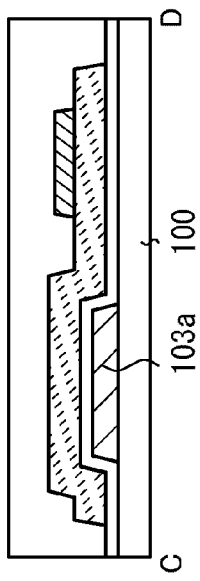
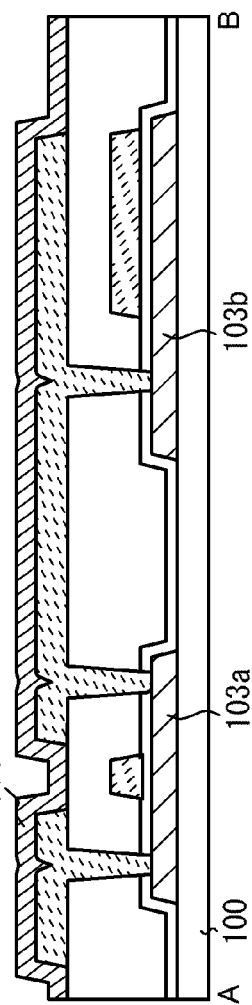
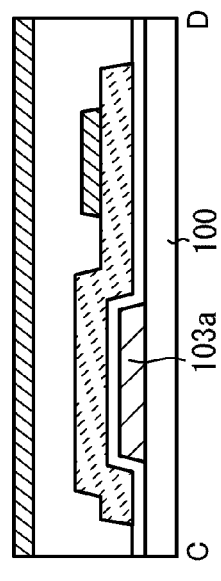
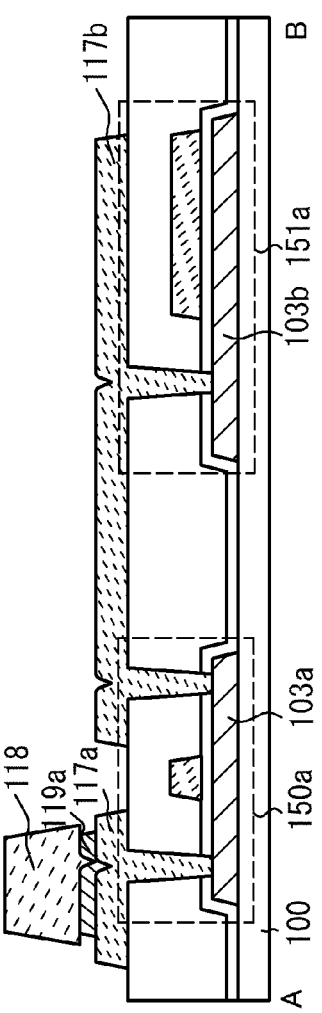
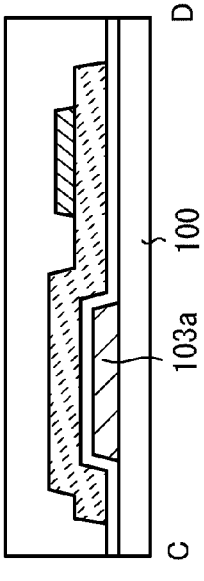

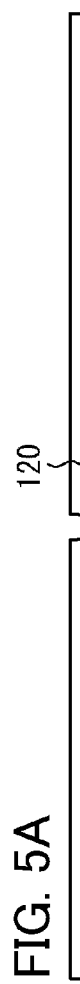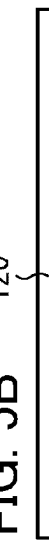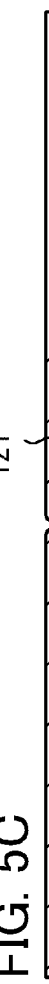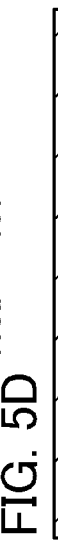

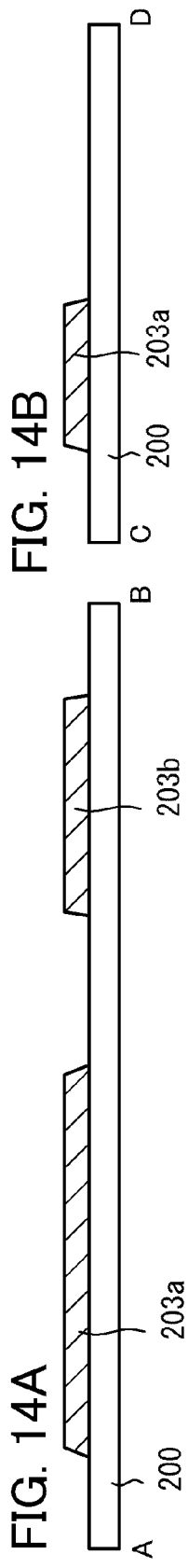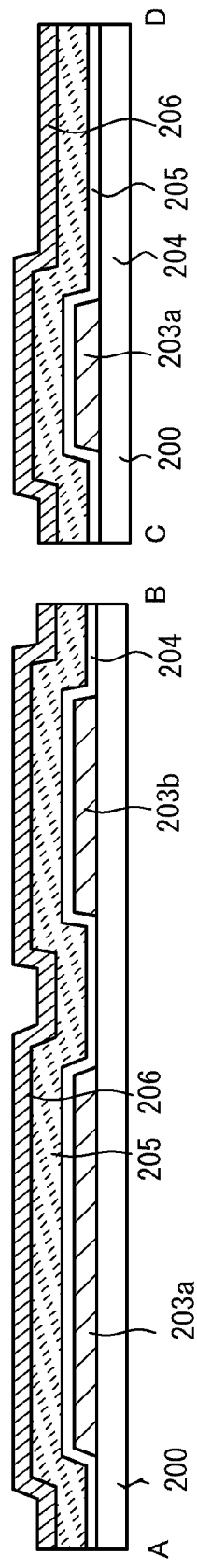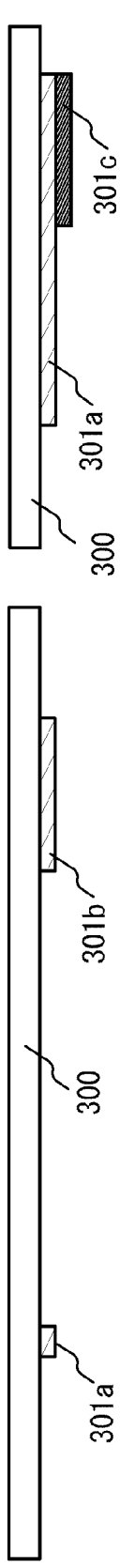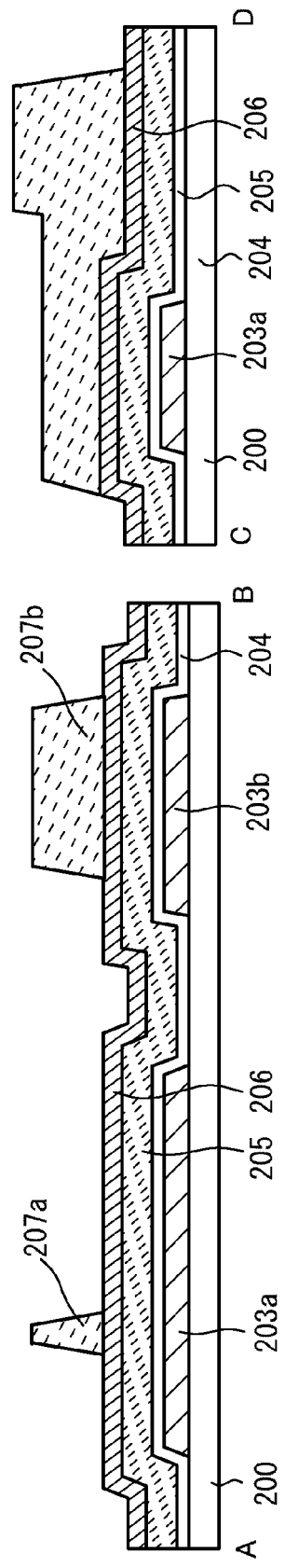

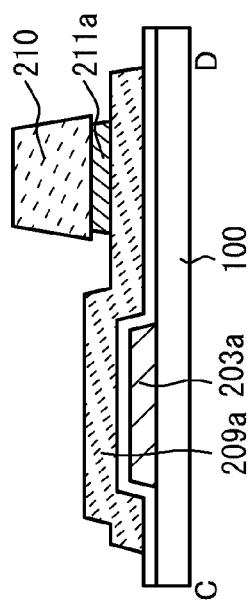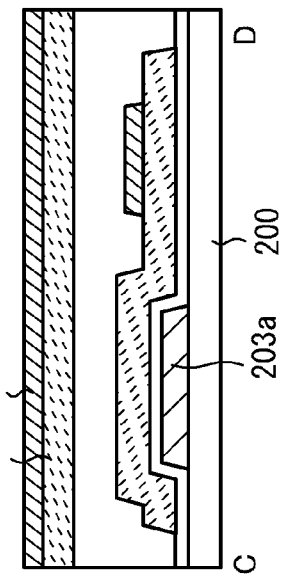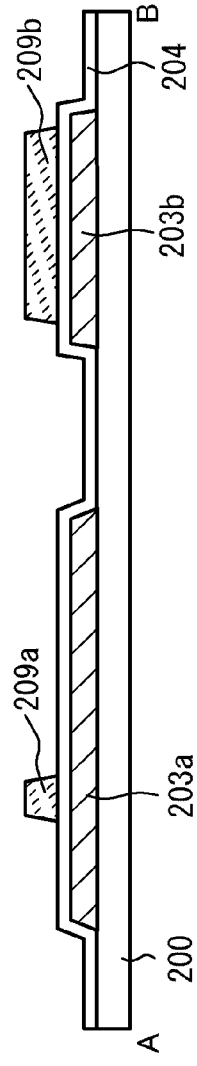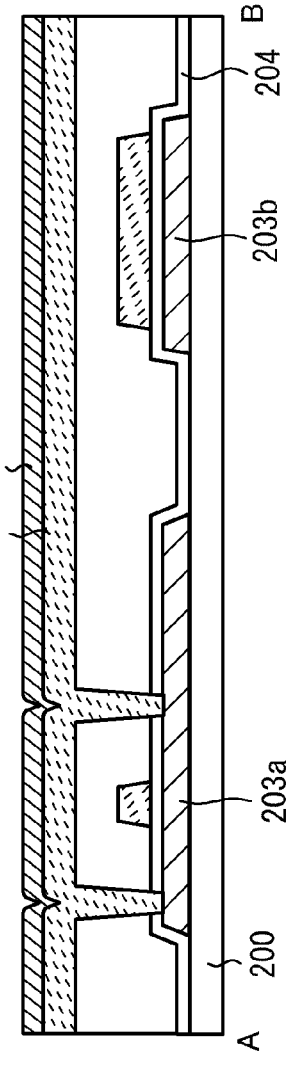
FIG. 16A  FIG. 16B
FIG. 16C  FIG. 16D

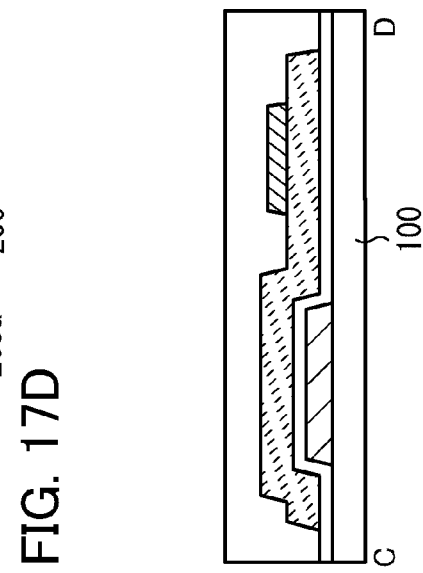
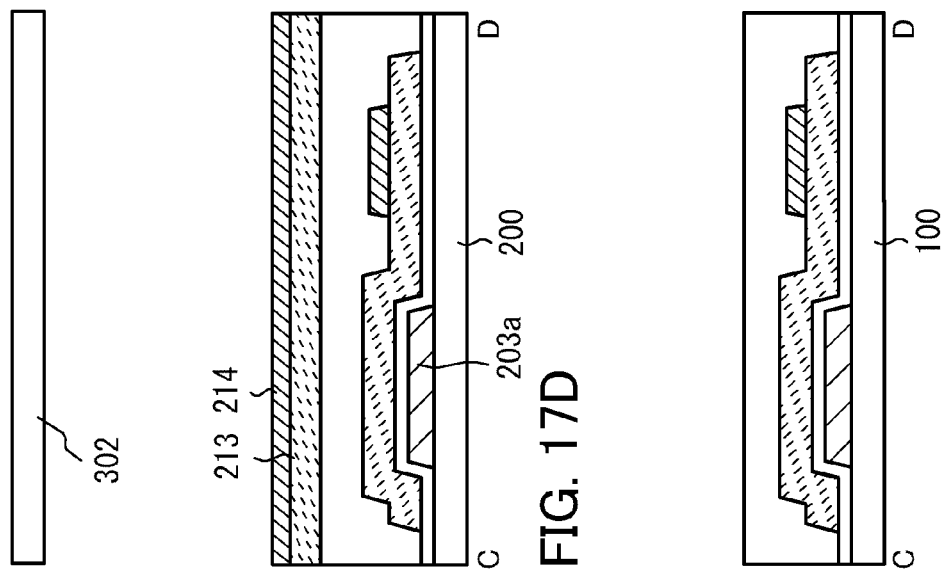
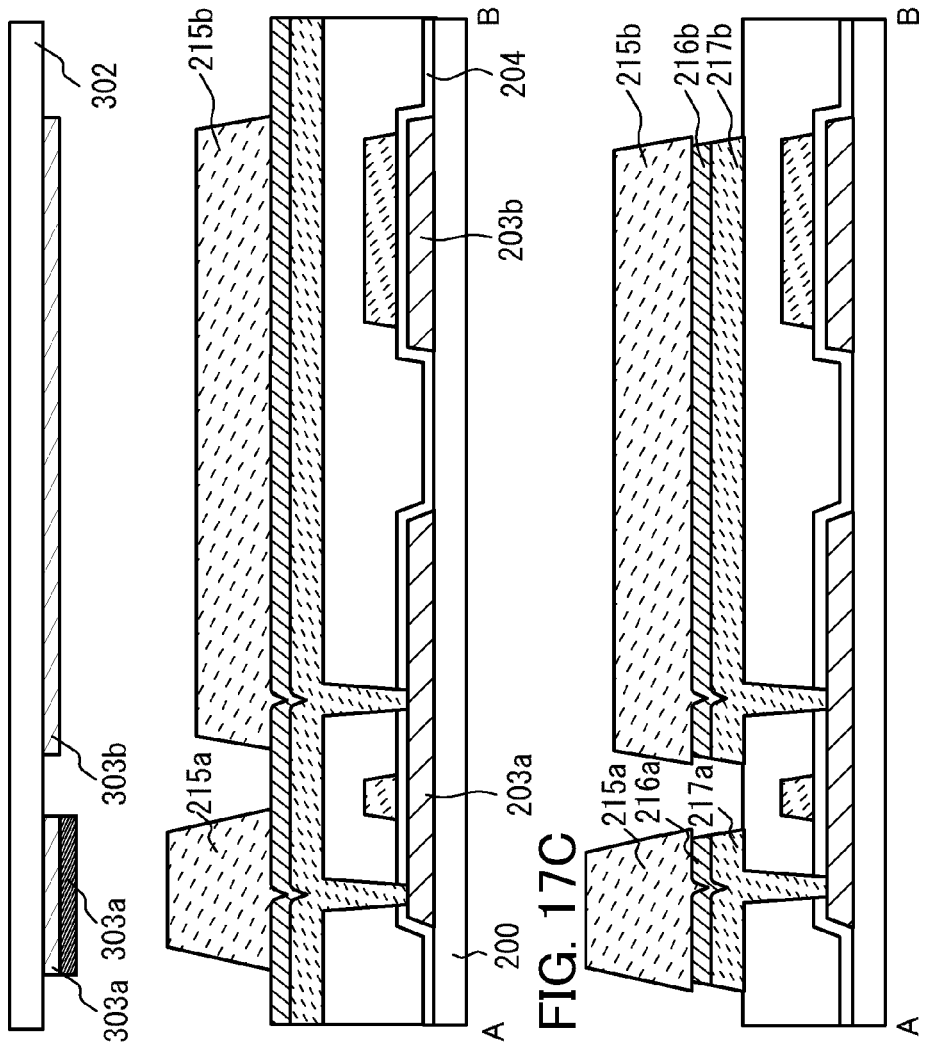

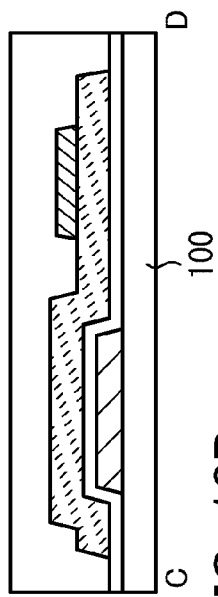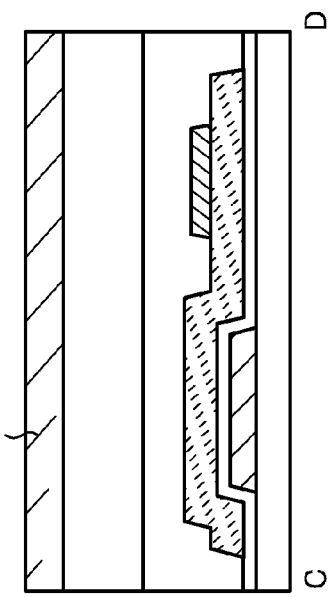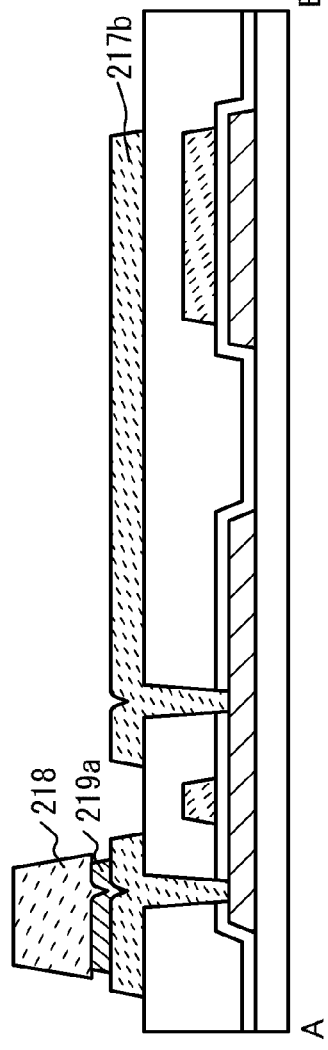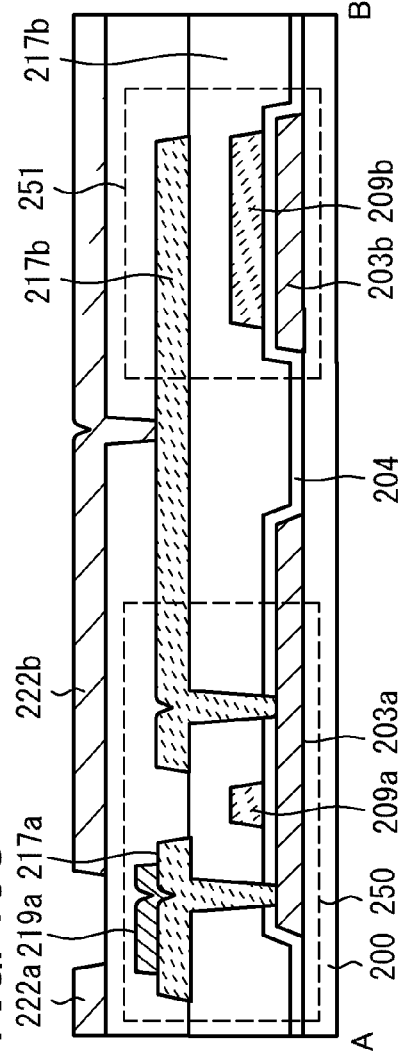

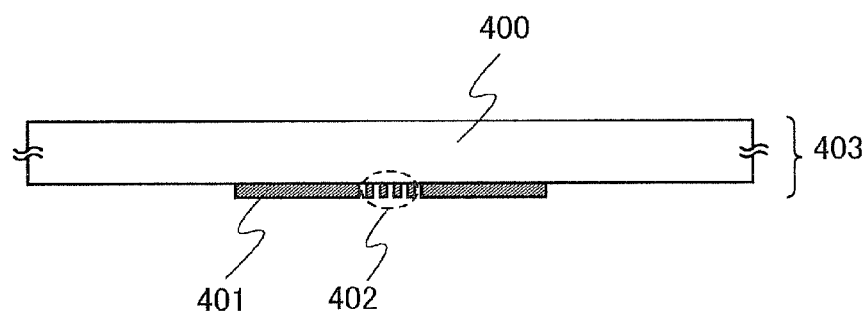
FIG. 19A1
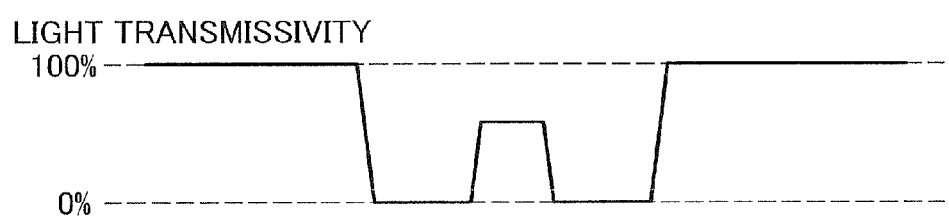
FIG. 19A2
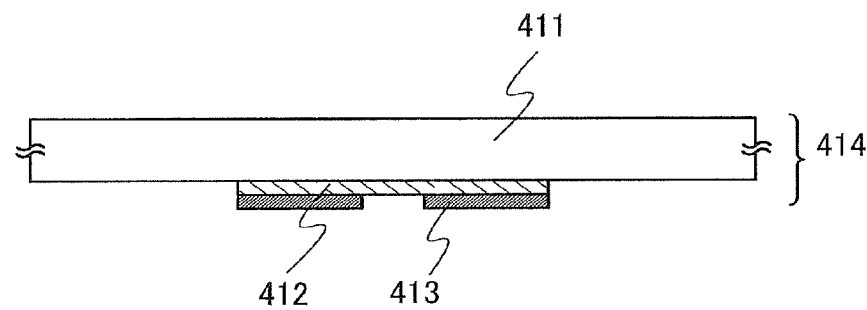
FIG. 19B1
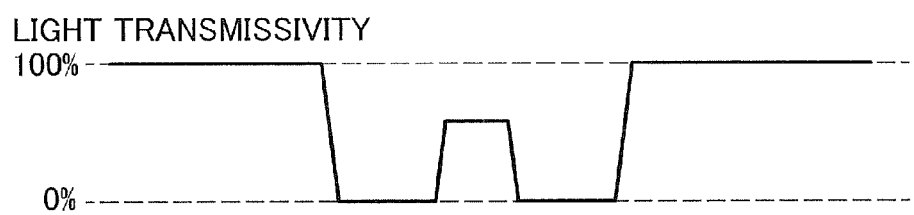
FIG. 19B2

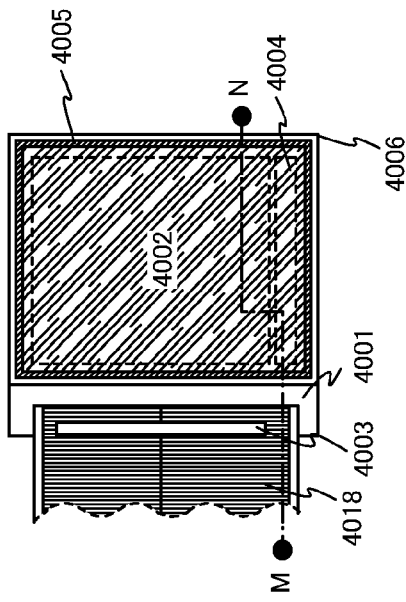
FIG. 26A1
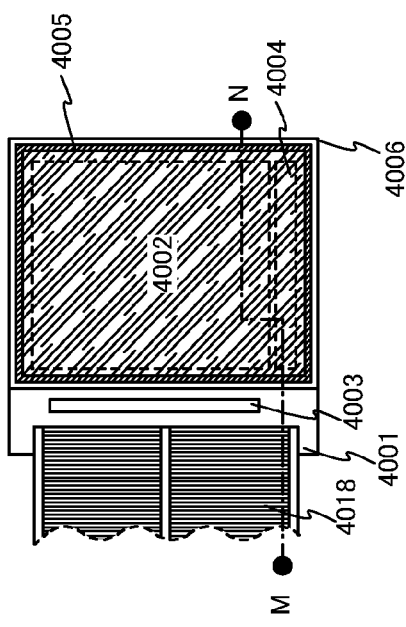
FIG. 26A2
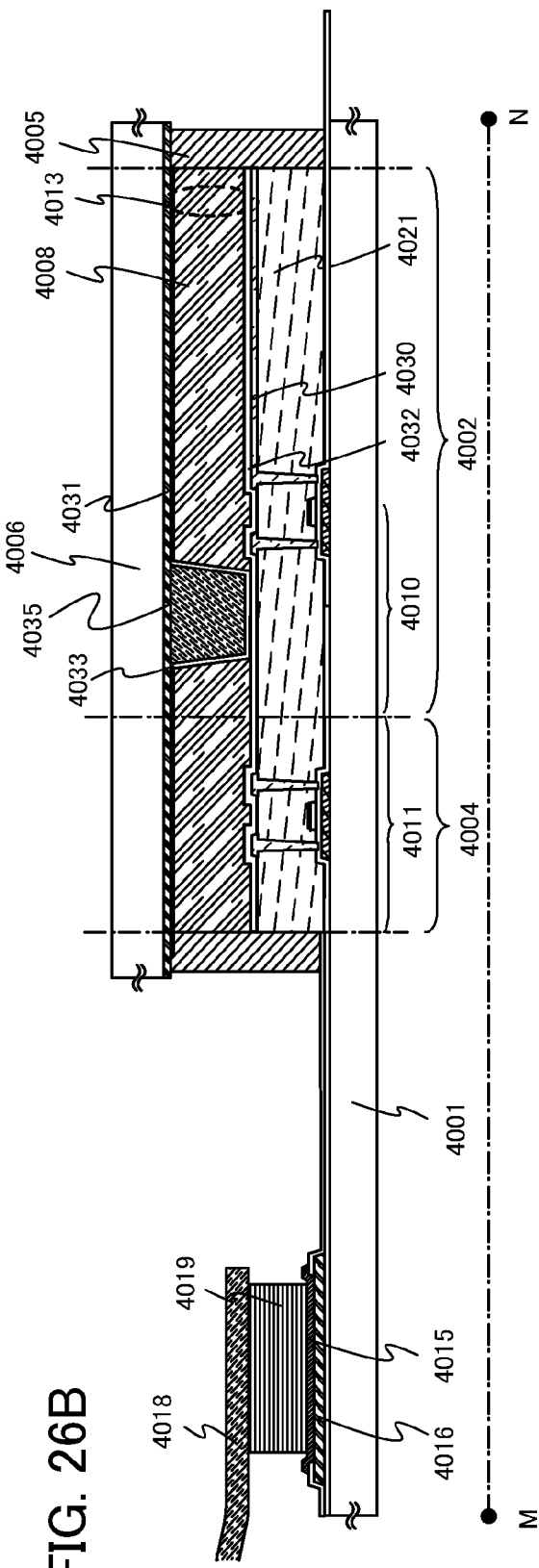
FIG. 26B

SEMICONDUCTOR DEVICE

BACKGROUND OF THE INVENTION

1. Field of the Invention

The present invention relates to a semiconductor device provided with a circuit including a thin film transistor (hereinafter referred to as a TFT) using an oxide semiconductor film for a channel formation region and a method for manufacturing the semiconductor device. For example, the present invention relates to an electronic appliance having as a component an electro-optical device typified by a liquid crystal display panel or a light-emitting display device including an organic light-emitting element.

2. Description of the Related Art

As typically seen in a liquid crystal display device, a thin film transistor formed over a flat plate such as a glass substrate is manufactured using amorphous silicon or polycrystalline silicon. A thin film transistor manufactured using amorphous silicon has low field effect mobility, but can be formed over a large glass substrate. In contrast, a thin film transistor manufactured using crystalline silicon has high field effect mobility, but is not always suitable for being formed over a large glass substrate due to a crystallization step such as laser annealing.

In view of the foregoing, a technique by which a thin film transistor is formed using an oxide semiconductor and such a thin film transistor is applied to an electronic device or an optical device has attracted attention. For example, Patent Document 1 and Patent Document 2 disclose a technique by which a thin film transistor is formed using zinc oxide or an In—Ga—Zn—O-based oxide semiconductor for an oxide semiconductor film and such a thin film transistor is used as a switching element or the like of an image display device. Further, a technique by which an aperture ratio is increased with the use of light-transmitting electrodes as gate electrodes and source and drain electrodes has been considered (Patent Documents 3 and 4).

REFERENCE

[Patent Document 1] Japanese Published Patent Application No. 2007-123861
[Patent Document 2] Japanese Published Patent Application No. 2007-096055
[Patent Document 3] Japanese Published Patent Application No. 2007-123700
[Patent Document 4] Japanese Published Patent Application No. 2007-81362

SUMMARY OF THE INVENTION

In general, a wiring for connecting elements such as transistors to each other is formed by extending conductive layers for forming a gate electrode and source and drain electrodes, whereby the wiring is formed in the same island as the conductive layers. Accordingly, a wiring for connecting a gate of a transistor to a gate of another transistor (such a wiring is called a gate wiring) is formed using the same layer structure and material as a gate electrode of the transistor; and a wiring for connecting a source of the transistor to a source of the another transistor (such a wiring is called a source wiring) is formed using the same layer structure and material as a source electrode of the transistor, in many cases. Therefore, in the case where the gate electrode and the source and drain electrodes are formed using a light-transmitting material, the gate wiring and the source wiring are also formed using the light-transmitting material in many cases, like the gate electrode and the source and drain electrodes.

However, in general, as compared to a material having a light-blocking property and a reflecting property, such as aluminum, molybdenum, titanium, tungsten, neodymium, copper, or silver, a light-transmitting conductive material such as indium tin oxide, indium zinc oxide, or indium tin zinc oxide has low conductivity. Accordingly, if a wiring is formed using a light-transmitting material, wiring resistance is high. For example, in the case where a large display device is manufactured, wiring resistance is significantly high because a wiring is long. As wiring resistance increases, the waveform of a signal which is transmitted through the wiring becomes distorted, and a voltage drop due to the wiring resistance results in a low voltage supply. Therefore, it is difficult to supply a normal voltage and a normal current, whereby normal display and operation are difficult.

In addition, in terms of display performance, large capacitors and higher aperture ratios are demanded for pixels. Pixels each having a high aperture ratio increase the use efficiency of light, so that power saving and miniaturization of a display device can be achieved. In recent years, the size of pixels has been miniaturized and images with higher definition are demanded. The miniaturization of the size of pixels causes a decrease in the aperture ratio of the pixel because of the large formation area for transistors and wirings which occupies one pixel. Accordingly, in order to obtain a high aperture ratio in each pixel in a regulation size, it is necessary to efficiently lay out circuit components needed for the circuit configuration of the pixel.

In view of the foregoing problems, an object is to provide a semiconductor device with high aperture ratio and a manufacturing method thereof. In addition, an object is to provide a semiconductor device with low power consumption and a manufacturing method thereof.

An embodiment of the invention to be disclosed is a semiconductor device including an oxide semiconductor layer provided over a substrate having an insulating surface; a gate insulating film covering the oxide semiconductor layer; a gate wiring including a gate electrode, being formed by stacking a first conductive layer and a second conductive layer in this order, and being provided over the gate insulating film; an insulating film covering the oxide semiconductor layer and the gate wiring including the gate electrode; and a source wiring including a source electrode, being formed by stacking a third conductive layer and a fourth conductive layer in this order, being provided over the insulating film, and being electrically connected to the oxide semiconductor layer. The gate electrode is formed using the first conductive layer. The gate wiring is formed using the first conductive layer and the second conductive layer. The source electrode is formed using the third conductive layer. The source wiring is formed using the third conductive layer and the fourth conductive layer.

Another embodiment of the invention to be disclosed is a semiconductor device including an oxide semiconductor layer provided over a substrate having an insulating surface; a gate insulating film covering the oxide semiconductor layer; a gate wiring including a gate electrode, being formed by stacking a first conductive layer and a second conductive layer in this order, and being provided over the gate insulating film; an insulating film covering the oxide semiconductor layer and the gate wiring including the gate electrode; a source wiring including a source electrode, being formed by stacking a third conductive layer and a fourth conductive layer in this order, being provided over the insulating film, and being electrically connected to the oxide semiconductor layer; and a capacitor wiring. The gate electrode is formed using the first conductive layer. The gate wiring is formed using the first conductive layer and the second conductive layer. The source electrode is formed using the third conductive layer. The source wiring is formed using the third conductive layer and the fourth conductive layer. The capacitor wiring is formed using a fifth conductive layer and a sixth conductive layer.

Another embodiment of the invention to be disclosed is a semiconductor device including an oxide semiconductor layer provided over a substrate having an insulating surface; a gate insulating film covering the oxide semiconductor layer; a gate wiring including a gate electrode, being formed by stacking a first conductive layer and a second conductive layer in this order, and being provided over the gate insulating film; an insulating film covering the oxide semiconductor layer and the gate wiring including the gate electrode; a source wiring including a source electrode, being formed by stacking a third conductive layer and a fourth conductive layer in this order, being provided over the insulating film, and being electrically connected to the oxide semiconductor layer; a capacitor wiring; and a storage capacitor portion. The gate electrode is formed using the first conductive layer. The gate wiring is formed using the first conductive layer and the second conductive layer. The source electrode is formed using the third conductive layer. The source wiring is formed using the third conductive layer and the fourth conductive layer. The capacitor wiring is formed using a fifth conductive layer and a sixth conductive layer. The storage capacitor portion is formed using the oxide semiconductor layer, the third conductive layer, the fifth conductive layer, the gate insulating film, and the insulating film.

In the above, the first conductive layer and the third conductive layer each preferably have a light-transmitting property. Further, the second conductive layer and the fourth conductive layer each preferably have a light-blocking property.

Further, in the above, the oxide semiconductor layer preferably contains at least one of indium, gallium, and zinc.

As an example of an oxide semiconductor that can be used in this specification, an oxide semiconductor denoted by $InMO_3(ZnO)_m$ (m>0) is given. Here, M denotes one metal element or a plurality of metal elements selected from gallium (Ga), iron (Fe), nickel (Ni), manganese (Mn), and cobalt (Co). The case where Ga is selected as M includes the case where Ga and any of the above metal elements other than Ga, such as Ni or Fe, are selected as well as the case where only Ga is selected. Moreover, in the oxide semiconductor, in some cases, a transition metal element such as Fe or Ni or an oxide of the transition metal is contained as an impurity element in addition to a metal element contained as M. In this specification, of the above oxide semiconductors, an oxide semiconductor containing at least gallium as M is referred to as an In—Ga—Zn—O-based oxide semiconductor and a thin film using the material is referred to as an In—Ga—Zn—O-based non-single-crystal film, in some cases.

Further, in the above, by using a multi-tone mask, a light-transmitting region (a region with high light transmissivity) and a light-blocking region (a region with low light transmissivity) can be formed with one mask (reticle). Accordingly, the light-transmitting region (the region with high light transmissivity) and the light-blocking region (the region with low light transmissivity) can be formed without increasing the number of masks.

Note that semiconductor devices in this specification mean all devices which can function by utilizing semiconductor characteristics, and semiconductor circuits, display devices, electro-optical devices, light-emitting display devices, and electronic appliances are all semiconductor devices.

Note that a display device in this specification means an image display device, a light-emitting device, or a light source (including a lighting device). Furthermore, the display device also includes the following modules in its category: a module to which a connector such as a flexible printed circuit (FPC), a tape automated bonding (TAB) tape, or a tape carrier package (TCP) is attached; a module having a TAB tape or a TCP at the tip of which a printed wiring board is provided; and a module in which an integrated circuit (IC) is directly mounted on a display element by a chip on glass (COG) method.

According to an embodiment of the invention disclosed, a light-transmitting transistor or a light-transmitting capacitor can be formed. Therefore, even if a transistor or a capacitor is provided in a pixel, the aperture ratio can be high because light can be transmitted also in a portion where the transistor or the capacitor is formed. Further, since a wiring for connecting the transistor and an element (e.g., another transistor) or a wiring for connecting a capacitor and an element (e.g., another capacitor) can be formed using a material with low resistivity and high conductivity, the distortion of the waveform of a signal and a voltage drop due to wiring resistance can be reduced.

BRIEF DESCRIPTION OF THE DRAWINGS

In the accompanying drawings:

FIGS. 2A to 2H are cross-sectional views illustrating a method for manufacturing a semiconductor device;

FIGS. 3A to 3H are cross-sectional views illustrating the method for manufacturing a semiconductor device;

FIGS. 4A to 4F are cross-sectional views illustrating the method for manufacturing a semiconductor device;

FIGS. 5A to 5F are cross-sectional views illustrating the method for manufacturing a semiconductor device;

FIGS. 14A to 14F are cross-sectional views illustrating a method for manufacturing a semiconductor device;

FIGS. 16A to 16D are cross-sectional views illustrating the method for manufacturing a semiconductor device;

FIGS. 17A to 17D are cross-sectional views illustrating the method for manufacturing a semiconductor device;

FIGS. 18A to 18D are cross-sectional views illustrating the method for manufacturing a semiconductor device;

FIGS. 19A1 to 19B2 are views of multi-tone masks;

FIGS. 26A1, 26A2, and 26B are top views and a cross-sectional view of a semiconductor device;

DETAILED DESCRIPTION OF THE INVENTION

Figure 1A:
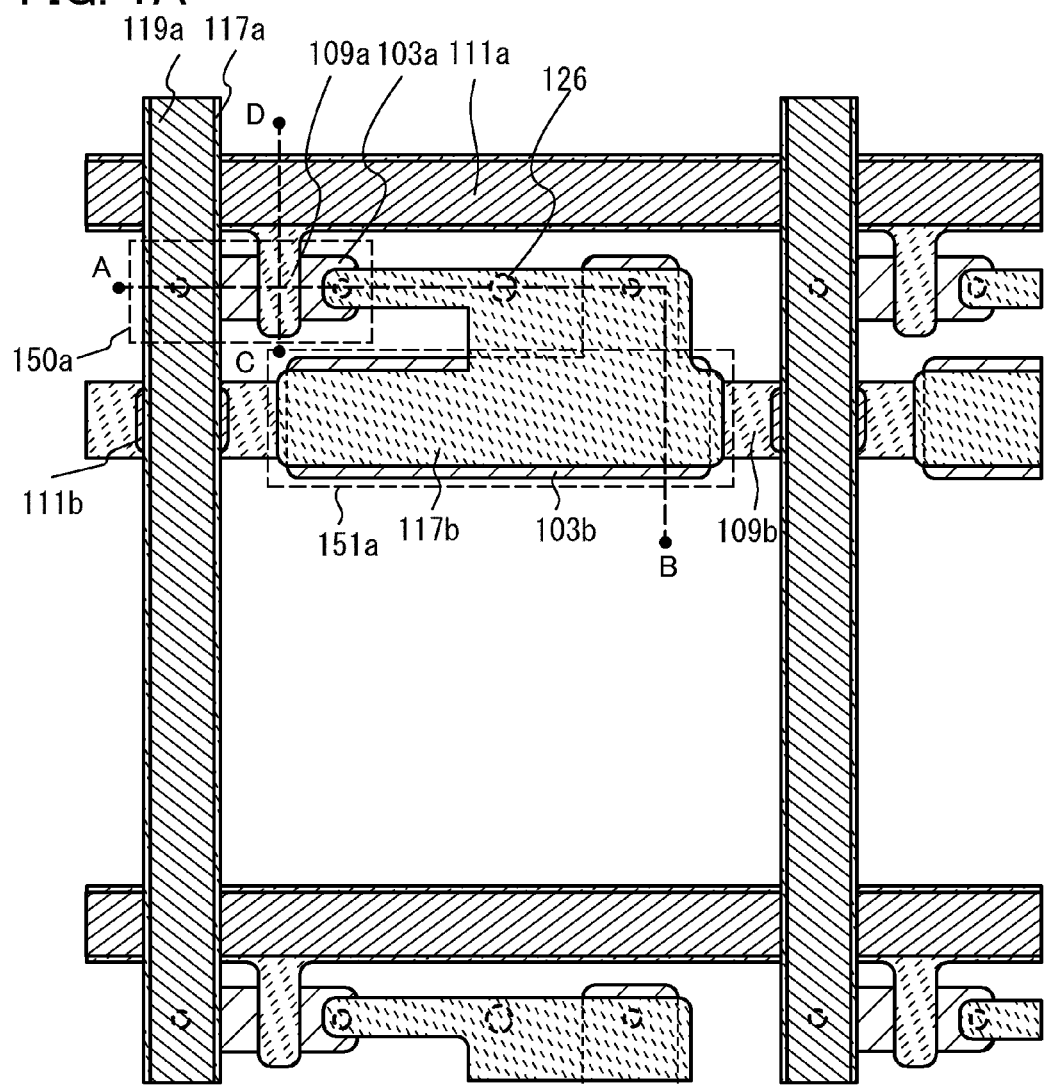
FIGS. 1A and 1B are a top view and a cross-sectional view of a semiconductor device.

The embodiments of the present invention will be described in detail with reference to drawings. Note that the present invention is not limited to the description below, and it is apparent to those skilled in the art that modes and details can be modified in various ways without departing from the spirit of the present invention. The structures according to different embodiments can be implemented in appropriate combination. Note that in the structures of the present invention described below, like reference numerals refer to like portions or portions having similar functions, and the description thereof is omitted.

In this specification, a "film" means what has been formed over an entire surface and has not been patterned. A "layer" means what has been patterned to have a desired shape with the use of a resist mask or the like. This distinction between "film" and "layer" is for convenience, and they are not particularly distinguished in some cases. Also as for each layer in a layered film, the "film" and the "layer" are not particularly distinguished in some cases.

Further, in this specification, a numeral such as "first", "second", or "third" which is included in a term is given for convenience in order to distinguish elements, does not limit the number, and does not limit the arrangement and the order of the steps.

(Embodiment 1)

In this embodiment, a semiconductor device and a manufacturing process thereof will be described with reference to FIGS. 1A and 1B, FIGS. 2A to 2H, FIGS. 3A to 3H, FIGS. 4A to 4F, FIGS. 5A to 5F, FIG. 6, FIGS. 7A to 7C, FIGS. 8A to 8C, FIG. 9, FIGS. 10A and 10B, FIGS. 11A and 11B, and FIG. 12.

Figure 1B:
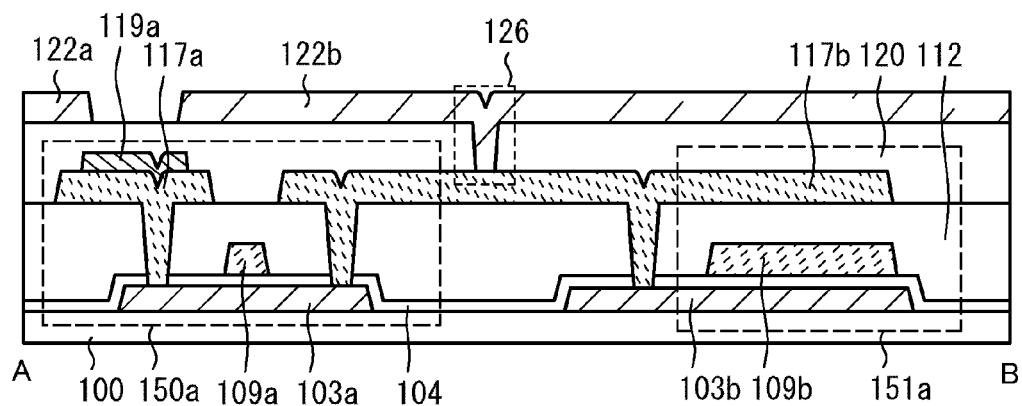

FIGS. 1A and 1B illustrate a semiconductor device according to this embodiment. FIG. 1A is a top view and FIG. 1B is a cross-sectional view taken along line A-B of FIG. 1A.

A semiconductor device illustrated in FIG. 1A includes a pixel portion which has a gate wiring and a capacitor wiring provided in a direction 1, a source wiring provided in a direction 2, which intersects with the gate wiring and the capacitor wiring, and a transistor 150a in the vicinity of an intersection of the gate wiring and the source wiring. Note that in this specification, the pixel portion refers to a region surrounded by a plurality of gate wirings and a plurality of source wirings.

The transistor 150a illustrated in FIGS. 1A and 1B is a so-called top-gate transistor including, over a substrate 100 having an insulating surface, an oxide semiconductor layer 103a, a gate insulating film 104 covering the oxide semiconductor layer 103a, a conductive layer 109a functioning as a gate electrode and being provided over the gate insulating film 104, an insulating film 112 covering the oxide semiconductor layer 103a and the conductive layer 109a, and conductive layers 117a and 117b and functioning as source and drain electrodes and being provided over the insulating film 112 and electrically connected to the oxide semiconductor layer 103a.

Further, as for the transistor 150a, the oxide semiconductor layer 103a, the conductive layer 109a functioning as a gate electrode, and the conductive layers 117a and 117b functioning as source and drain electrodes are formed using light-transmitting materials. By thus forming the oxide semiconductor layer 103a, the gate electrode, and the source and drain electrodes of the transistor 150a with the use of light-transmitting materials, light can be transmitted also in a portion where the transistor is formed; therefore, the aperture ratio of a pixel can be improved.

The gate wiring electrically connected to the gate electrode of the transistor 150a is formed by stacking the conductive layer 109a having a light-transmitting property and the conductive layer 111a having a light-blocking property in this order, and the source wiring electrically connected to the source or drain electrode of the transistor 150a is formed by stacking the conductive layer 117a having a light-transmitting property and a conductive layer 119a having a light-blocking property in this order. That is to say, the gate electrode of the transistor 150a is formed using part of the conductive layer 109a having a light-transmitting property, which is included in the gate wiring, and the source or drain electrode is formed using part of the conductive layer 117a having a light-transmitting property, which is included in the source wiring.

By stacking the light-transmitting conductive layer and the light-blocking conductive layer in this order to form each of the gate wiring and the source wiring, wiring resistance and power consumption can be reduced. In addition, since the gate wiring and the source wiring are each formed using the light-blocking conductive layer, a space between pixels can be shielded from light. That is, with the gate wirings provided in a row direction and the source wirings provided in a column direction, the space between the pixels can be shielded from light without using a black matrix.

Further, the capacitor wiring is provided in the direction 1 which is the same as that of the gate wiring. A portion of the capacitor wiring, which is in a pixel region, is desirably formed using a conductive layer 109b having a light-transmitting property and a portion of the capacitor wiring, which is overlapped with the source wiring, may be formed by stacking the conductive layer 109b having a light-transmitting property and a conductive layer 111b having a light-blocking property in this order. A storage capacitor portion 151a is formed in the capacitor wiring. The storage capacitor portion 151a is connected to the source or drain electrode of the transistor 150a. The storage capacitor portion 151a includes the gate insulating film 104 and the insulating film 112 functioning as dielectrics and the oxide semiconductor layer 103b, the conductive layer 109b, and the conductive layer 117b functioning as electrodes.

In this embodiment, an example is described in which the width of the capacitor wiring and the gate wiring are equal to each other; however, the width of the capacitor wiring and the width of the gate wiring may be different. The width of the capacitor wiring is preferably larger than that of the gate wiring. When the width of the capacitor wiring is large, the area of the storage capacitor portion 151a can be large.

By thus forming the storage capacitor portion 151a using the oxide semiconductor layer 103b, the conductive layer 109b having a light-transmitting property, and the conductive layer 117b, light can be transmitted also in a portion where the storage capacitor portion 151a is formed. Therefore, the aperture ratio can be improved. Further, by being formed using the light-transmitting conductive layer, the storage capacitor portion 151a can be formed to be large without reducing the aperture ratio. Therefore, even when the transistor is off, potential holding characteristics of a pixel electrode can be favorable and thus display quality can be favorable. Further, a feedthrough potential can be low.

Further, the transistor 150a illustrated in FIGS. 1A and 1B can be used as a pixel transistor provided in a pixel portion of a light-emitting display device typified by a liquid crystal display device or an EL display device. Therefore, in the illustrated example, a contact hole 126 is formed in the insulating film 120, a pixel electrode layer (a conductive layer 122b having a light-transmitting property) is formed over the insulating film 120, and the pixel electrode layer (the conductive layer 122b having a light-transmitting property) and the conductive layer 117b are connected to each other through the contact hole 126 formed in the insulating film 120.

Next, an example of a manufacturing process of a semiconductor device will be described with reference to FIGS. 2A to 2H, FIGS. 3A to 3H, FIGS. 4A to 4F, and FIGS. 5A to 5F.

First, an oxide semiconductor film 101 is formed over the substrate 100 having an insulating surface (see FIGS. 2A and 2B).

As the substrate 100 having an insulating surface, a visible light-transmitting glass substrate used for a liquid crystal display device or the like can be used, for example. The glass substrate is preferably a non-alkali glass substrate. As a material of the non-alkali glass substrate, a glass material such as aluminosilicate glass, aluminoborosilicate glass, or barium borosilicate glass is used. Alternatively, an insulating substrate which is formed of an insulator, such as a ceramic substrate, a quartz substrate, or a sapphire substrate; a semiconductor substrate which is formed of a semiconductor material such as silicon and whose surface is covered with an insulating material; a conductive substrate which is formed of a conductor such as metal or stainless steel and whose surface is covered with an insulating material; or the like may be used as the substrate 100 having an insulating surface.

An insulating film serving as a base film may be formed over the substrate 100 having an insulating surface. The insulating film has a function of preventing diffusion of impurities such as alkali metal (Li, Cs, Na, or the like), alkaline earth metal (Ca, Mg, or the like), or any other metal element from the substrate 100. Note that the concentration of Na is $5\times10^{19}/cm^3$ or lower, preferably $1\times10^{18}/cm^3$ or lower. The insulating film can be formed to have a single-layer structure of a silicon nitride film, a silicon oxide film, a silicon nitride oxide film, a silicon oxynitride film, an aluminum oxide film, an aluminum nitride film, an aluminum oxynitride film, or an aluminum nitride oxide film or a layered structure of any of the above films.

The oxide semiconductor film 101 can be formed using an In—Ga—Zn—O-based non-single-crystal film. For example, the oxide semiconductor film 101 is formed by a sputtering method using a target of an oxide semiconductor containing In, Ga, and Zn ($In_2O_3:Ga_2O_3:ZnO=1:1:1$). The conditions for sputtering can be, for example, as follows: the distance between the substrate 100 and the target is 30 mm to 500 mm; the pressure is 0.1 Pa to 2.0 Pa; the DC power is 0.25 kW to 5.0 kW (in the case where the target is 8 inch in diameter); and the atmosphere is an argon atmosphere, an oxygen atmosphere, or a mixed atmosphere of argon and oxygen. Note that as the oxide semiconductor film, a ZnO-based non-single-crystal film may be used. Further, the thickness of the oxide semiconductor film 101 may be about 5 nm to 200 nm.

As a sputtering method, employed can be an RF sputtering method in which a high-frequency power supply is used as a sputtering power supply, a DC sputtering method, or a pulsed DC sputtering method in which a DC bias is applied in a pulsed manner. An RF sputtering method is mainly employed in the case of forming an insulating film, and a DC sputtering method is mainly used in the case of forming a metal film.

Note that in the case where the insulating film is formed, plasma treatment may be performed on a surface of the insulating film before the oxide semiconductor film 101 is formed. By performing plasma treatment, dust attached to a surface of the insulating film can be removed.

A pulsed DC power supply is preferably used because dust can be reduced and the film thickness distribution can be uniform. Further, the oxide semiconductor film 101 is formed without being exposed to the air after the plasma treatment is performed, so that attachment of dust or moisture to the interface between the insulating film and the oxide semiconductor film 101 can be suppressed.

A multi-source sputtering apparatus in which a plurality of targets of different materials can be placed may be used. With the multi-source sputtering apparatus, different films can be formed to be stacked in the same chamber, or a film can be formed by sputtering a plurality of kinds of materials at the same time in the same chamber. Alternatively, a method using a magnetron sputtering apparatus provided with a magnetic field generating mechanism inside the chamber (magnetron sputtering method), an ECR sputtering method using plasma generated with the use of microwaves, or the like may be employed. Still alternatively, a reactive sputtering method in which a target substance and a sputtering gas component are chemically reacted with each other during deposition to form a compound thereof, a bias sputtering method in which a voltage is applied also to a substrate during deposition, or the like may be employed.

Next, resist masks 102a and 102b are formed over the oxide semiconductor film 101 and the oxide semiconductor film 101 is selectively etched using the resist masks 102a and 102b, so that island-shaped oxide semiconductor layers 103a and 103b are formed (see FIGS. 2C and 2D). In the case of forming the resist masks by a spin coating method, large quantities of resist materials and a large amount of developing solution are used in order to improve uniformity of a resist film; thus, large quantities of surplus materials are consumed. In a film formation method using a spin coating method, the increase in size of a substrate will be particularly disadvantageous in mass production because a mechanism for rotating a large substrate is large and a loss and waste amount of a material liquid are large. Moreover, when a film is formed by spin-coating a rectangular substrate, circular unevenness is likely to appear on the film with a rotating axis as a center. Therefore, it is preferable to form the resist masks by selectively forming a resist material film by a droplet discharge method such as an ink-jet method, a screen printing method, or the like and exposing the resist material film to light. By selectively forming a resist material film, the usage of resist materials can be reduced and thus significant cost reduction can be achieved. Accordingly, a large substrate having a size of 1000×1200 mm, 1100×1250 mm, 1150×1300 mm, or the like can be used.

Either wet etching or dry etching can be employed as an etching method in this case. Here, an unnecessary portion of the oxide semiconductor film 101 is removed by wet etching using a mixed solution of acetic acid, nitric acid, and phosphoric acid, so that island-shaped oxide semiconductor layers 103a and 103b are formed. Note that the resist masks 102a and 102b are removed after the etching. Further, an etchant used for wet etching is not limited to the above as long as it can etch the oxide semiconductor film 101. In the case of performing dry etching, a gas containing chlorine or a gas containing chlorine to which oxygen is added is preferably used. By using a gas containing chlorine and oxygen, the etching selectivity of the insulating film serving as a base film to the oxide semiconductor film 101 is likely to be high and thus, the insulating film can be sufficiently prevented from being damaged.

Further, an etching apparatus for which a reactive ion etching method (RIE method) is employed or a dry etching apparatus for which a high-density plasma source such as ECR (electron cyclotron resonance) or ICP (inductively coupled plasma) is used can be used for dry etching. Furthermore, as a dry etching apparatus by which electric discharge is likely to be homogeneous in a large area as compared to the case of an ICP etching apparatus, there is an ECCP (enhanced capacitively coupled plasma) mode etching apparatus in which an upper electrode is grounded, a high-frequency power source of 13.56 MHz is connected to a lower electrode, and a low-frequency power source of 3.2 MHz is connected to the lower electrode. This ECCP mode etching apparatus can be applied, for example, even when a substrate of the tenth generation with a side of larger than 3 m is used.

After that, heat treatment at 200° C. to 600° C., typically 300° C. to 500° C., is preferably performed. Here, heat treatment is performed in a nitrogen atmosphere at 350° C. for an hour. This heat treatment involves the rearrangement of the In—Ga—Zn—O-based oxide semiconductor used for forming the oxide semiconductor layers 103a and 103b at the atomic level. This heat treatment (including light annealing) is important because the strain that inhibits the movement of carriers in the oxide semiconductor layers 103a and 103b can be released by the heat treatment. Note that the timing when the heat treatment is performed is not particularly limited as long as it is after the formation of the oxide semiconductor layers 103a and 103b.

Next, a gate insulating film 104 is formed over the island-shaped oxide semiconductor layers 103a and 103b and then, a conductive film 105 is formed over the gate insulating film 104 (see FIGS. 2E and 2F).

The gate insulating film 104 can be formed to have a single-layer structure of a silicon oxide film, a silicon oxynitride film, a silicon nitride film, a silicon nitride oxide film, an aluminum oxide film, an aluminum nitride film, an aluminum oxynitride film, an aluminum nitride oxide film, or a tantalum oxide film or a layered structure of any of the above films. The gate insulating film 104 can be formed to a thickness from 50 nm to 250 nm by a sputtering method or the like. For example, a 100-nm-thick oxide silicon film may be formed as the gate insulating film 104 by a sputtering method. Alternatively, a 100-nm-thick aluminum oxide film may be formed by a sputtering method. Note that the gate insulating film 104 preferably has a light-transmitting property.

By forming the gate insulating film 104 using a dense film, moisture or oxygen can be prevented from entering the oxide semiconductor layers 103a and 103b from the substrate 100 side. Further, impurities such as alkali metal (Li, Cs, Na, or the like), alkaline earth metal (Ca, Mg, or the like), or any other metal elements, which are contained in the substrate 100, can be prevented from entering the oxide semiconductor layers from the substrate 100 side. Note that the concentration of Na is $5 \times 10^{19}/cm^3$ or lower, preferably $1 \times 10^{18}/cm^3$ or lower. Thus, a change in semiconductor characteristics of a semiconductor device using the oxide semiconductor can be suppressed. Further, reliability of the semiconductor device can be increased.

As the conductive film 105, indium tin oxide (ITO), indium tin oxide containing silicon oxide (ITSO), organic indium, organic tin, zinc oxide (ZnO), titanium nitride, or the like can be used. Alternatively, indium zinc oxide (IZO) containing zinc oxide, zinc oxide doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used. Such a material can be used to form the conductive film 105 with a single-layer structure or a layered structure by a sputtering method. However, in the case of the layered structure, the light transmissivity of each of a plurality of films is desirably sufficiently high.

Next, resist masks 107a and 107b are formed over the conductive film 105 and the conductive film 105 is selectively etched using the resist masks 107a and 107b, so that conductive layers 109a and 109b are formed (see FIGS. 2G and 2H). Note that the resist masks 107a and 107b are removed after the etching. In this case, to increase coverage of the insulating film 112 to be formed later and prevent breakage of the insulating film 112, the etching is preferably performed so that end portions of the gate electrode have tapered shapes. Note that the gate electrode includes the electrode and the wiring formed using the conductive film, such as the gate wiring.

Next, a conductive film 106 is formed over the gate insulating film 104 and the conductive layers 109a and 109b (see FIGS. 3A and 3B).

The conductive film 106 can be formed to have a single-layer structure or a layered structure using a metal material such as aluminum (Al), tungsten (W), titanium (Ti), tantalum (Ta), molybdenum (Mo), nickel (Ni), platinum (Pt), copper (Cu), gold (Au), silver (Ag), manganese (Mn), or neodymium (Nd), an alloy material containing any of the above metal materials as its main component, or a nitride containing any of the above metal materials as its component. It is desirable to use a low resistance conductive material such as aluminum.

When the conductive film 106 is formed over the conductive film 105 (or the conductive layers 109a and 109b), both the films react with each other in some cases. For example, when the conductive film 105 is formed using ITO and the conductive film 106 is formed using aluminum, a chemical reaction occurs therebetween. Accordingly, to avoid such a chemical reaction, a refractory material is preferably sandwiched between the conductive film 105 and the conductive film 106. For example, as the refractory material, molybdenum, titanium, tungsten, tantalum, chromium, and the like can be given. Further, it is preferable to form the conductive film 106 to be a multi-layer film by using a material with high conductivity over a film formed using the refractory material. As the material with high conductivity, aluminum, copper, silver, and the like can be given. For example, in the case where the conductive film 106 is formed to have a layered structure, a stack of molybdenum as a first layer, aluminum as a second layer, and molybdenum as a third layer, or a stack of molybdenum as a first layer, aluminum containing a small amount of neodymium as a second layer, and molybdenum as a third layer can be used.

Next, a resist mask 110 is formed over the conductive film 106 and the conductive film 106 is etched using the resist mask 110 (see FIGS. 3C and 3D). The resist mask 110 is removed after the etching. Accordingly, part of the conductive film 106, over which the resist mask 110 is not formed, is removed, so that the conductive layer 109a is exposed. Thus, the surface areas of the conductive layer 111a and the conductive layer 109a are different from each other. That is, the surface area of the conductive layer 109a is larger than that of the conductive layer 111a. Alternatively, as for the conductive layers 111a and 109a, there are a region in which the conductive layers 111a and 109a are overlapped with each other and a region in which the conductive layers 111a and 109a are not overlapped with each other.

A region including at least the conductive layer 111a having a light-blocking property functions as the gate wiring and a region including the conductive layer 109a having a light-transmitting property functions as the gate electrode. By forming the conductive layer 109a functioning as the gate electrode with the use of a light-transmitting material, light can be transmitted also in a portion where the gate electrode is formed; therefore, the aperture ratio of a pixel can be improved. Further, by forming the conductive layer 111a functioning as a gate wiring with the use of a light-blocking conductive layer, wiring resistance and power consumption can be reduced. Further, since the gate wiring is formed using the light-blocking conductive layer, a space between pixels can be shielded from light. Further, a contrast can be improved.

Note that although the steps in which the conductive layers 109a and 109b are formed and then the conductive layer 111a having a light-blocking property is formed are described, the order of formation may be inverted. That is, after the conductive layer 111a having a light-blocking property which functions as the gate wiring is formed, the conductive layers 109a and 109b each having a light-transmitting property which function as the gate electrodes may be formed (see FIGS. 8A and 8C).

Further, as illustrated in FIGS. 3C and 3D, the capacitor wiring is provided in the same direction as that of the gate wiring. Although part of the capacitor wiring, which is in a pixel region, is desirably formed using the conductive layer 109b having a light-transmitting property, part of the capacitor wiring, which is overlapped with the source wiring to be formed later may be formed by stacking the conductive layer 109b having a light-transmitting property and the conductive layer 111b having a light-blocking property in this order (see FIG. 1A). With such a structure, resistance can be reduced.

Although in this embodiment, an example is described in which the capacitor wiring and the gate wiring are formed so as to have an equal width, the capacitor wiring and the gate wiring may have different widths. The width of the capacitor wiring is preferably larger than that of the gate wiring. The surface area of the storage capacitor portion 151a can be increased.

Note that treatment for increasing conductivity in part of or whole regions of the oxide semiconductor layers 103a and 103b may be performed after formation of the oxide semiconductor layers 103a and 103b, after formation of the gate insulating film 104, or after formation of the gate electrode. For example, hydrogenation treatment can be given as the treatment for increasing conductivity. By providing silicon nitride containing hydrogen in an upper layer of the oxide semiconductor layer 103b and applying heat, the oxide semiconductor layer can be hydrogenated. Alternatively, by applying heat in a hydrogen atmosphere, hydrogenation may be performed. Alternatively, as illustrated in FIG. 6, by forming a channel protective layer 127 in a region overlapping a channel formation region of the oxide semiconductor layer 103a, a region where conductivity is increased can be selectively formed in the oxide semiconductor layer 103a.

The channel protective layer 127 is desirably formed using silicon oxide. By forming the channel protective layer 127 using silicon oxide, entry of hydrogen into a channel portion of the oxide semiconductor layer 103a can be suppressed. Note that the channel protective layer 127 may be removed after the treatment for increasing conductivity is performed. Alternatively, the channel protective layer 127 may be formed using a resist. In this case, the resist is preferably removed after hydrogenation treatment. By thus performing the treatment for increasing conductivity on the oxide semiconductor layers 103a and 103b, a current of a transistor can flow easily and thus resistance of an electrode of a capacitor can be reduced.

Figure 6:
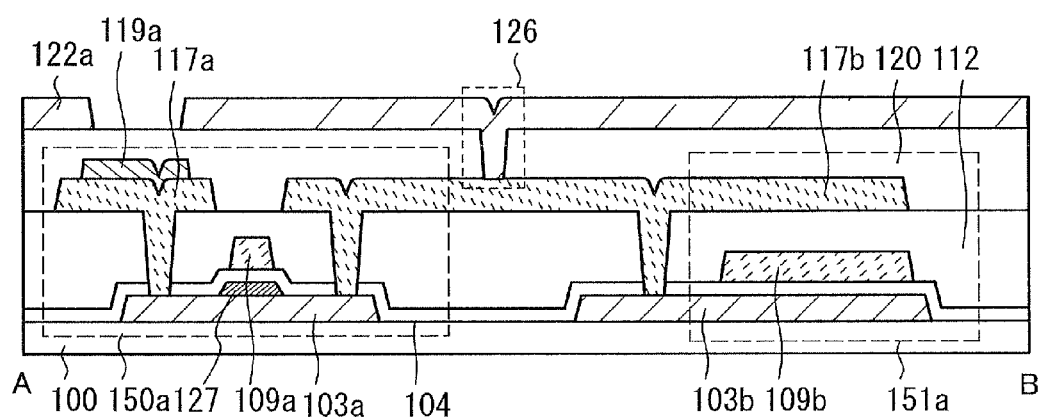
FIG. 6 is a cross-sectional view of a semiconductor device.

Although FIG. 6 illustrates an example in which the channel protective layer 127 is formed in contact with the oxide semiconductor layer 103a, the channel protective layer 127 may be provided over the gate insulating film 104. Further, by adjusting the shapes of the channel protective layer 127 and the conductive layer 109a functioning as the gate electrode so that the channel protective layer 127 is larger than the conductive layer 109a, an offset region can be formed.

Next, after the insulating film 112 functioning as an interlayer insulating film is formed so as to cover the conductive layers 109a and 109b and the gate insulating film 104, contact holes reaching the oxide semiconductor layer are formed in the insulating film 112 so that parts of a surface of the oxide semiconductor layer are exposed (see FIGS. 3E and 3F).

The insulating film 112 can be formed to have a single-layer or layered structure using any of an insulating film containing oxygen or nitrogen, such as silicon oxide, silicon nitride, silicon oxynitride, or silicon nitride oxide; a film containing carbon such as DLC (diamond-like carbon); and a film formed using an organic material such as epoxy, polyimide, polyamide, polyvinyl phenol, benzocyclobutene, or acrylic or a siloxane material such as a siloxane resin. Note that the insulating film 112 preferably has a light-transmitting property.

Next, a conductive film 113 is formed over the insulating film 112 (see FIGS. 3G and 3H).

The conductive film 113 is desirably formed using a material substantially the same as that used for the conductive film 105. The material substantially the same as that of the conductive film 105 means a material whose element of a main component is the same as that of the material used for the conductive film 105. In terms of impurities, the kinds, the concentrations, and the like of elements contained are different in some cases. In this manner, when the conductive film 113 is formed using the material substantially the same as that of the conductive film 105 by sputtering or evaporation, there is an advantage that the material can be shared between the conductive films 105 and 113. When the material can be shared, the same manufacturing apparatus can be used, manufacturing steps can proceed smoothly, and throughput can be improved, which lead to cost reduction.

Next, resist masks 115a and 115b are formed over the conductive film 113 and the conductive film 113 is selectively etched using the resist masks 115a and 115b, so that conductive layers 117a and 117b are formed (see FIGS. 4A and 4B). Note that after the etching, the resist masks 115a and 115b are removed.

Next, a conductive film 114 is formed over the conductive layers 117a and 117b and the insulating film 112 (see FIGS. 4C and 4D).

The conductive film 114 can be formed to have a single-layer structure or a layered structure using a metal material such as aluminum (Al), tungsten (W), titanium (Ti), tantalum (Ta), molybdenum (Mo), nickel (Ni), platinum (Pt), copper (Cu), gold (Au), silver (Ag), manganese (Mn), or neodymium (Nd), an alloy material containing any of the above metal materials as its main component, or a nitride containing any of the above metal materials as its component. It is desirable to use a low resistance conductive material such as aluminum.

Further, the conductive film 114 is desirably formed using a material different from that used for the conductive film 106. Alternatively, the conductive film 114 is desirably formed to have a layered structure different from that of the conductive film 106. This is because in manufacturing steps of a semiconductor device, temperatures of heat applied to the conductive film 114 and the conductive film 106 are different from each other in many cases. In general, the conductive film 106 tends to have a higher temperature. Accordingly, the conductive film 106 is desirably formed using a material or layered structure with a higher melting point. Alternatively, the conductive film 106 is desirably formed using a material or layered structure in which hillocks are less likely to occur. Alternatively, since the conductive film 114 is included in a signal line through which a video signal is supplied in some cases, the conductive film 114 is desirably formed using a material or layered structure having wiring resistance lower than that of the conductive film 106.

When the conductive film 114 is formed over the conductive film 113 (or the conductive layers 117a and 117b) as in the case where the conductive film 106 is formed over the conductive film 105 (or the conductive layers 109a and 109b), both the films react with each other in some cases. Thus, also in the case where the conductive film 114 is formed over the conductive film 113, a refractory material is desirably sandwiched between the conductive film 113 and the conductive film 114. For example, as the refractory material, molybdenum, titanium, tungsten, tantalum, chromium, and the like can be given. Further, it is preferable to form the conductive film 114 to be a multi-layer film by using a material with high conductivity over a film formed using the refractory material. As the material with high conductivity, aluminum, copper, silver, and the like can be given.

Next, a resist mask 118 is formed over the conductive film 114 and the conductive film 114 is etched using the resist mask 118 (see FIGS. 4E and 4F). The resist mask 118 is removed after the etching. Accordingly, part of the conductive film 114, over which the resist mask 118 is not formed, is removed, so that the conductive layer 117a is exposed. Thus, the surface areas of the conductive layer 119a and the conductive layer 117a are different from each other. That is, the surface area of the conductive layer 117a is larger than that of the conductive layer 119a. Alternatively, as for the conductive layers 119a and 117a, there are a region in which the conductive layers 119a and 117a are overlapped with each other and a region in which the conductive layers 119a and 117a are not overlapped with each other.

A region including at least the conductive layer 119a having a light-blocking property functions as the source wiring and a region including the conductive layer 117a having a light-transmitting property functions as the source or drain electrode. By forming the conductive layers 117a and 117b functioning as source and drain electrodes with the use of a light-transmitting conductive layer, light can be transmitted also in a portion where the source or drain electrode is formed; therefore, the aperture ratio of a pixel can be improved. Further, by forming the conductive layer 119a functioning as the source wiring with the use of the light-blocking conductive layer, wiring resistance and power consumption can be reduced. Further, since the source wiring is formed using the conductive layer 119a having a light-blocking property, a space between pixels can be shielded from light. That is, with the gate wirings provided in a row direction and the source wirings provided in a column direction, a space between pixels can be shielded from light without using a black matrix.

Note that although the steps in which the conductive layers 117a and 117b are formed and then the conductive layer 119a having a light-blocking property is formed are described, the order of formation may be inverted. That is, after the conductive layer 119a having a light-blocking property which functions as the source wiring is formed, the conductive layers 117a and 117b each having a light-transmitting property which function as the source and drain electrodes may be formed (see FIGS. 8A and 8B).

Further, in FIGS. 4E and 4F, the conductive layer 117b functions also as an electrode of the storage capacitor portion 151a. In the capacitor wiring, the storage capacitor portion 151a includes the gate insulating film 104 and the insulating film 112 functioning as dielectrics and the oxide semiconductor layer 103b, the conductive layer 109b, and the conductive layer 117b functioning as electrodes. With such a structure, resistance can be reduced.

By thus forming the storage capacitor portion 151a using the light-transmitting conductive layer, light can be transmitted also in a portion where the storage capacitor portion 151a is formed. Therefore, the aperture ratio can be improved. Further, when the storage capacitor portion 151a is formed using the light-transmitting material, the storage capacitor portion 151a can be large. Thus, even when the transistor is off, potential holding characteristics of a pixel electrode can be favorable and thus display quality can be favorable. Further, a feedthrough potential can be low.

In this manner, the transistor 150a and the storage capacitor portion 151a can be formed. Further, the transistor 150a and the storage capacitor portion 151a can be light-transmitting elements. Note that in the case where the storage capacitor portion is formed using the oxide semiconductor layer 103b and the gate insulating film 104 as a dielectric, a potential of the capacitor wiring formed using the conductive layer 109b can be higher than a potential of a counter electrode (a potential of a common line). Electric charges of the oxide semiconductor layer 103b can be induced and thus the oxide semiconductor layer 103b can function as an electrode of the storage capacitor portion. On the other hand, in the case where the storage capacitor portion is formed without using the oxide semiconductor layer 103b or the case where the oxide semiconductor layer 103b is subjected to treatment for increasing conductivity such as hydrogenation treatment, the potential of the capacitor wiring may be equal to that of the counter electrode (common electrode). Thus, the number of wirings can be reduced.

Next, after the insulating film 120 is formed, a resist mask (not illustrated) is formed over the insulating film 120, and the insulating film 120 is etched using the resist mask to form a contact hole in the insulating film 120 (see FIGS. 5A and 5B). The insulating film 120 can serve as an insulating film planarizing a surface over which the transistor 150a, the storage capacitor portion 151a, the wiring, or the like is formed. Since the transistor 150a and the storage capacitor portion 151a can be formed as light-transmitting elements, regions where they are provided can also be utilized as opening regions. Therefore, it is advantageous to relieve unevenness due to the transistor 150a, the storage capacitor portion 151a, the wiring, or the like, so that an upper portion over which these elements are formed is planarized.

Further, the insulating film 120 can serve as an insulating film which protects the transistor 150a from impurities or the like. The insulating film 120 can be formed using, for example, a film containing silicon nitride. A film containing silicon nitride is preferable because it is highly effective in blocking impurities. Alternatively, the insulating film 120 may be formed using a film containing an organic material. As examples of the organic material, acrylic, polyimide, polyamide, and the like are preferable. Such organic materials are preferable in terms of a high functionality of flattening unevenness. Accordingly, in the case where the insulating film 120 is formed to have a layered structure of a film containing silicon nitride and a film containing an organic material, it is preferable to provide the film containing silicon nitride and the film containing an organic material in the lower side and in the upper side, respectively. Note that in the case where the insulating film 120 is formed to have a layered structure, the light transmittance of each of films is preferably sufficiently high. Alternatively, a photosensitive material may be used. In this case, it is not necessary to etch the insulating film 120 to form a contact hole.

Further, the insulating film 120 can serve as a color filter. When a color filter is provided on the substrate 100 side, it is not necessary to provide a color filter on the counter substrate side. Therefore, a margin for adjusting the positions of two substrates is not necessary, which can facilitate manufacture of a panel. Note that the insulating film 120 is not necessarily formed. The pixel electrode may be formed over the same layer as the source electrode and the source wiring.

Next, a conductive film 121 is formed over the insulating film 120 and the contact hole (see FIGS. 5C and 5D). The conductive film 121 is desirably formed using a material substantially the same as that used for forming the conductive film 105 and the conductive film 113. In this manner, when the conductive film 121 is formed using the material substantially the same as that of the conductive film 105 and the conductive film 113 by sputtering or evaporation, there is an advantage that the material can be shared among the conductive films 105 and 113 and the conductive film 121. When the material can be shared, the same manufacturing apparatus can be used, manufacturing steps can proceed smoothly, and throughput can be improved, which lead to cost reduction.

Next, a resist mask (not illustrated) is formed over the conductive film 121, and the conductive film 121 is selectively etched using the resist mask, so that conductive layers 122a and 122b are formed (see FIGS. 5E and 5F). Note that the resist mask is removed after the etching.

The conductive layers 122a and 122b can function as pixel electrodes. Further, the conductive layers 122a and 122b can connect the source wiring, the source electrode, the gate wiring, the gate electrode, the pixel electrode, the capacitor wiring, the electrode of the storage capacitor portion, and the like to each other through the contact hole. Therefore, the conductive layers 122a and 122b can function as wirings for connecting conductors.

As described above, a semiconductor device can be manufactured. According to the manufacturing method described in this embodiment, the transistor 150a having a light-transmitting property and the storage capacitor portion 151a having a light-transmitting property can be formed. Therefore, even if a transistor or a storage capacitor portion is provided in a pixel, the aperture ratio can be high because light can be transmitted also in a portion where the transistor or the storage capacitor portion is formed. Further, since a wiring for connecting the transistor and an element (e.g., another transistor) can be formed using a material with low resistivity and high conductivity, the distortion of the waveform of a signal and a voltage drop due to wiring resistance can be reduced.

Next, another example of a semiconductor device will be described with reference to FIGS. 7A to 7C. Note that many portions are common to the semiconductor device illustrated in FIGS. 7A to 7C and the semiconductor device in FIGS. 1A and 1B. Therefore, description of common portions is omitted and different points will be described. Further, FIG. 7A is a plan view, FIG. 7B is a cross-sectional view taken along A-B in FIG. 7A, and FIG. 7C is a cross-sectional view taken along C-D in FIG. 7A.

Figure 7A:
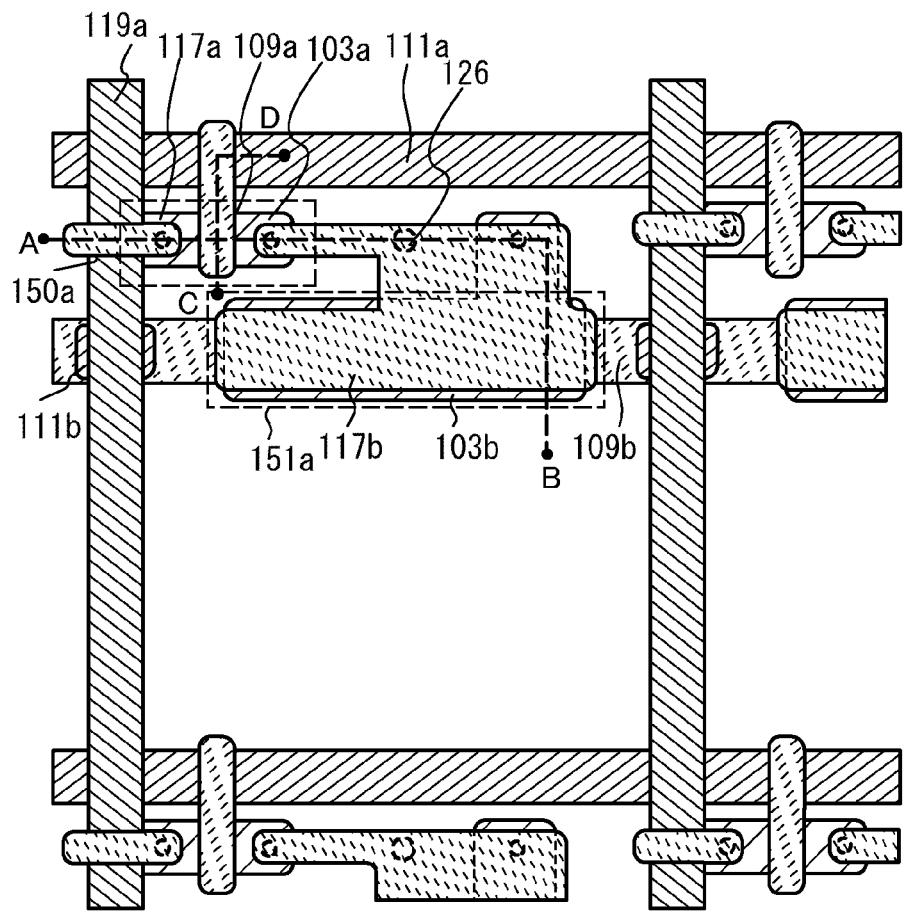
FIGS. 7A to 7C are a top view and cross-sectional views of a semiconductor device.
Figure 7B:
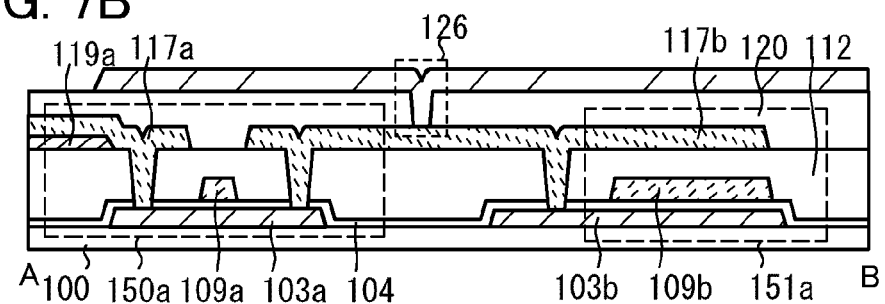
Figure 7C:
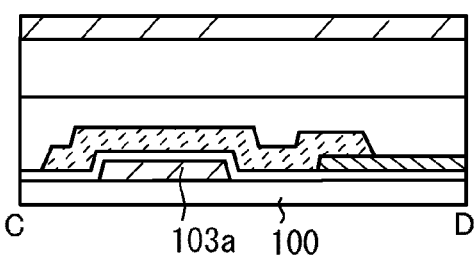

In FIGS. 1A and 1B, an example is illustrated in which the gate wiring and the source wiring are each formed by stacking a light-blocking conductive layer over a light-transmitting conductive layer; however, the gate wiring and the source wiring may be formed by stacking a light-blocking conductive layer and a light-transmitting conductive layer in this order (see FIGS. 7A to 7C). The conductive layer 109a having a light-transmitting property, which functions as a gate electrode, may be connected to the conductive layer 111a having a light-blocking property, which functions as a gate wiring. Like the gate wiring, the conductive layer 117a having a light-transmitting property, which functions as a source or drain electrode, may be connected to the conductive layer 119a having a light-blocking property, which functions as a source wiring.

Next, another example of a semiconductor device will be described with reference to FIGS. 8A to 8C. Note that many portions are common to the semiconductor device illustrated in FIGS. 8A to 8C and the semiconductor device in FIGS. 1A and 1B. Therefore, description of common portions is omitted and different points will be described. Further, FIG. 8A is a plan view, FIG. 8B is a cross-sectional view taken along A-B in FIG. 8A, and FIG. 8C is a cross-sectional view taken along C-D in FIG. 8A.

Figure 8A:
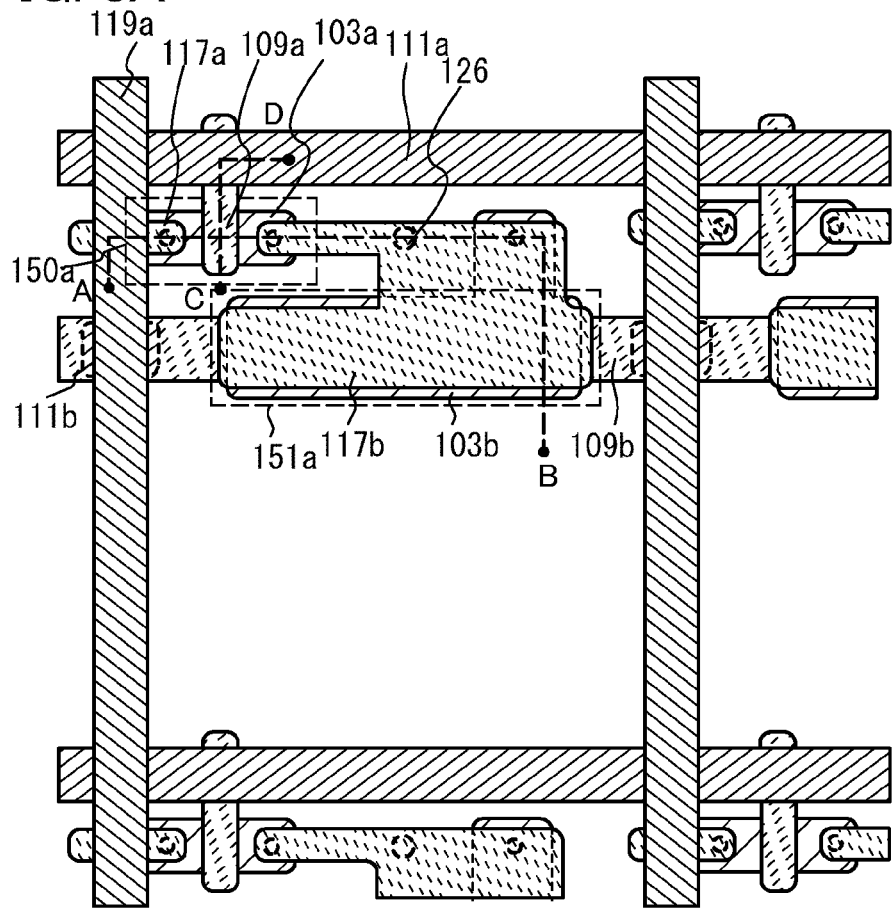
FIGS. 8A to 8C are a top view and cross-sectional views of a semiconductor device.
Figure 8B:
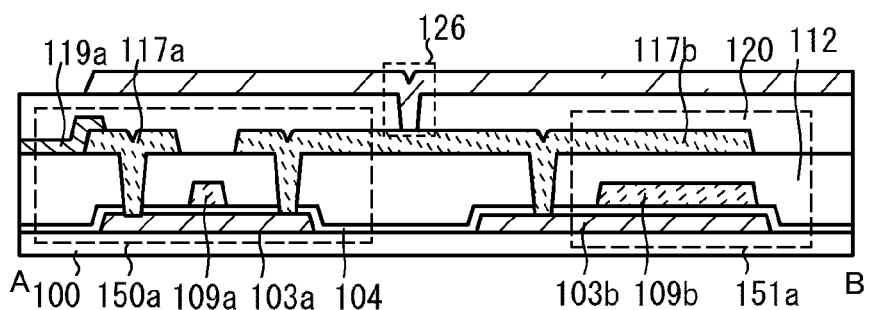
Figure 8C:
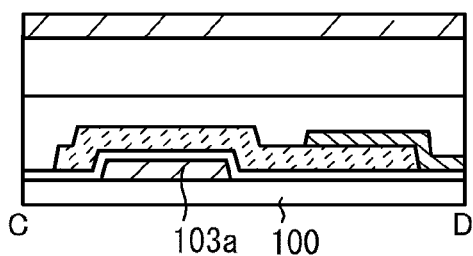

In FIGS. 1A and 1B, an example is illustrated in which the gate wiring and the source wiring are each formed by stacking a light-transmitting conductive layer and a light-blocking conductive layer in this order; however, the gate wiring and the source wiring may be formed using a light-blocking conductive layer (see FIGS. 8A to 8C). The conductive layer 109a having a light-transmitting property, which functions as a gate electrode, may be connected to the conductive layer 111a having a light-blocking property, which functions as a gate wiring. Like the gate wiring, the conductive layer 117a having a light-transmitting property, which functions as a source or drain electrode, may be connected to the conductive layer 119a having a light-blocking property, which functions as a source wiring.

Figure 9:
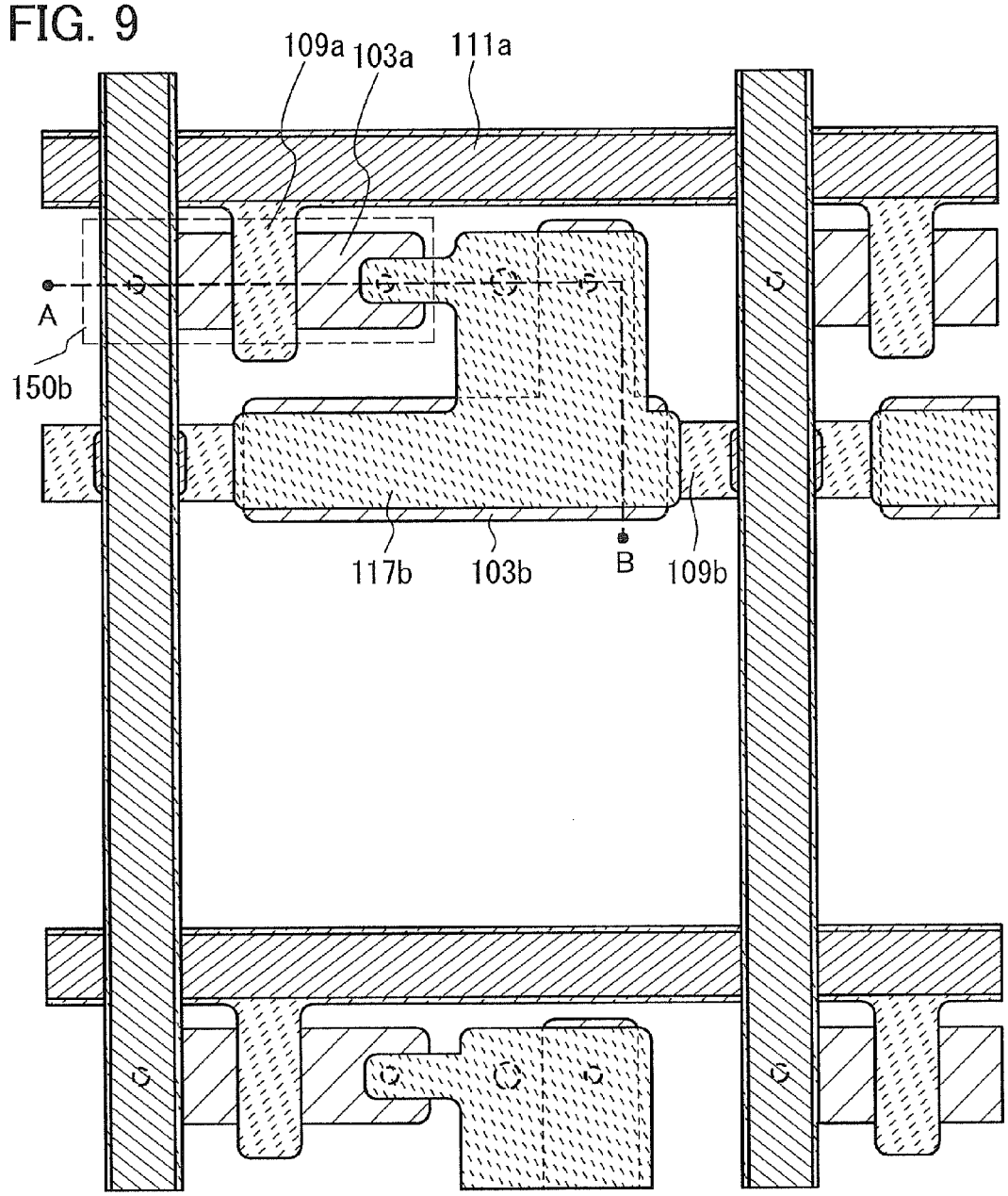
FIG. 9 is a top view of a semiconductor device.

Further, in the case where the transistor is formed over the gate wiring, the size of the transistor depends on the width of the gate wiring of the transistor. However, in this embodiment, since the transistor can be formed in a pixel, the size of the transistor can be large. For example, as illustrated in FIG. 9, a transistor whose channel width W or channel length L is larger than the width of the gate wiring can be formed. By forming a large transistor, its current capability can be sufficiently high and thus a signal writing time to a pixel can be shortened. Further, an off current can be reduced and thus flickers can be reduced. Accordingly, a display device with high definition can be provided.

Figure 10A:
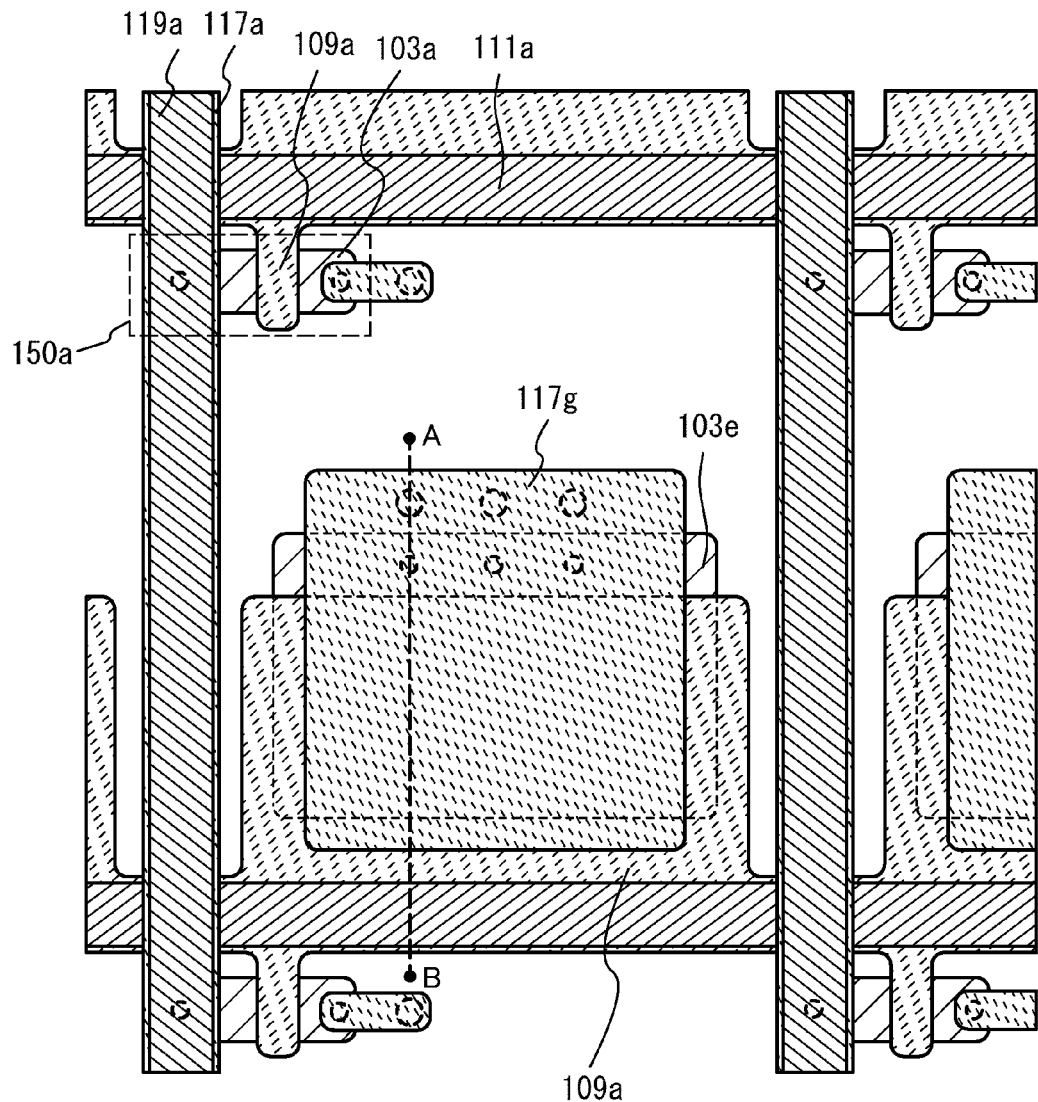
FIGS. 10A and 10B are a top view and a cross-sectional view of a semiconductor device.
Figure 10B:
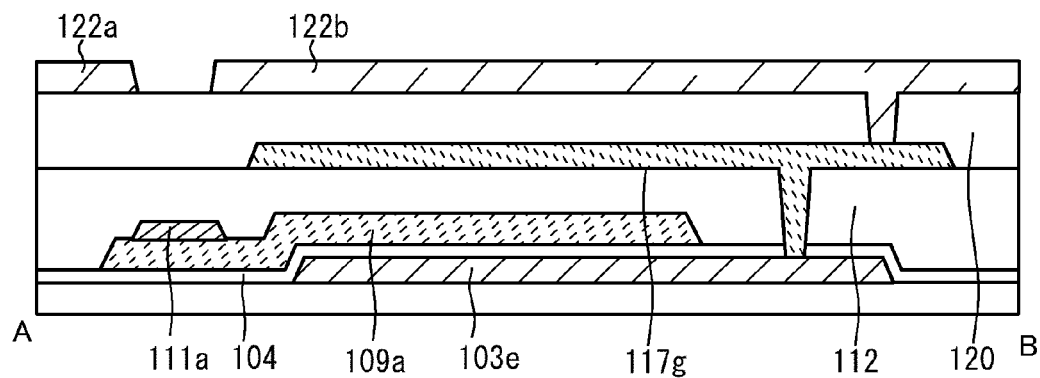

Note that the pixel configuration is not limited to that of FIGS. 1A and 1B. For example, as illustrated in FIGS. 10A and 10B, a storage capacitor can be provided by providing a pixel electrode and a gate wiring of an adjacent pixel so that they are overlapped with each other with an insulating film and a gate insulating film interposed therebetween, without providing a capacitor wiring.

Next, another example of a semiconductor device will be described with reference to FIGS. 11A and 11B. Note that many portions are common to the semiconductor device illustrated in FIGS. 11A and 11B and the semiconductor device in FIGS. 1A and 1B. Therefore, description of common portions is omitted and different points will be described. Further, FIG. 11A is a plan view and FIG. 11B is a cross-sectional view taken along A-B in FIG. 11A.

Figure 11A:
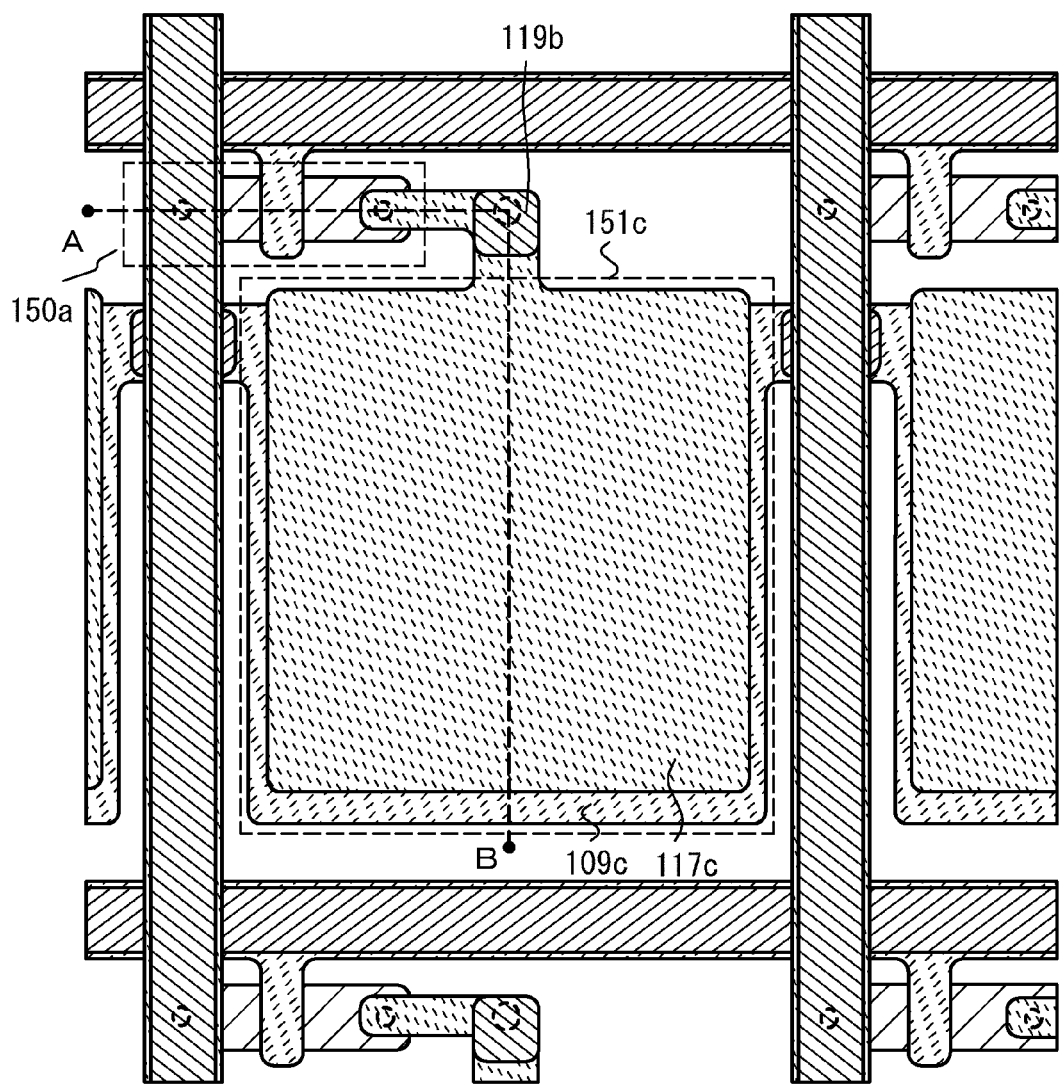
FIGS. 11A and 11B are a top view and a cross-sectional view of a semiconductor device.
Figure 11B:
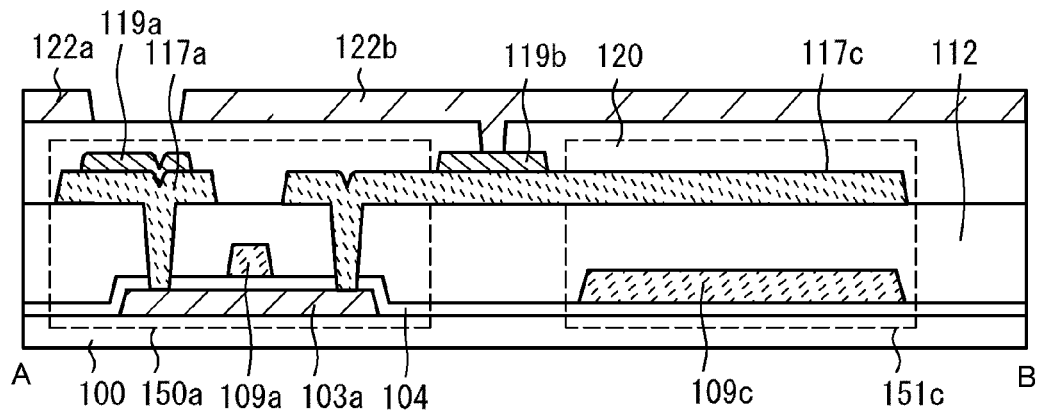

FIGS. 11A and 11B are different from FIGS. 1A and 1B in that the conductive layer 109c having a light-transmitting property included in the capacitor wiring and a conductive layer 117c functioning as a source or drain electrode are used as an electrode of a storage capacitor portion 151c, instead of an oxide semiconductor layer. Therefore, the capacitor wiring can be at a potential equal to that of a counter electrode. Further, since an oxide semiconductor layer is not used for the storage capacitor portion 151c, a capacitance value is small; therefore, the surface area of the conductive layer 109c and the conductive layer 117c illustrated in FIGS. 11A and 11B is preferably larger than that of the conductive layer 109b and the conductive layer 117b illustrated in FIGS. 1A and 1B. The size of the storage capacitor portion 151c is preferably 70% or more or 80% or more of pixel pitch. Further, the pixel electrode has contact with the conductive layer 119b over the conductive layer 117c. Since the structure is similar to that of FIGS. 1A and 1B, the specific description is omitted.

By employing such a structure, the large storage capacitor portion 151c with high light transmissivity can be formed. By forming the large storage capacitor portion 151c, even when the transistor is off, potential holding characteristics of a pixel electrode can be favorable and thus display quality can be favorable. Further, a feedthrough potential can be low. Further, even in the case where the storage capacitor portion 151c is formed to be large, light can be transmitted also in a portion where the storage capacitor portion 151c is formed. Therefore, the aperture ratio can be improved and power consumption can be reduced. In addition, even if disorder of the alignment of liquid crystal is caused by unevenness due to the contact hole in the pixel electrode, leakage of light can be prevented by the conductive layer 119b having a light-blocking property.

Next, another example of a semiconductor device will be described with reference to FIG. 12. Note that many portions are common to the semiconductor device illustrated in FIG. 12 and the semiconductor device in FIGS. 1A and 1B. Therefore, description of common portions is omitted and different points will be described. Further, FIG. 12 is a plan view.

Figure 12:
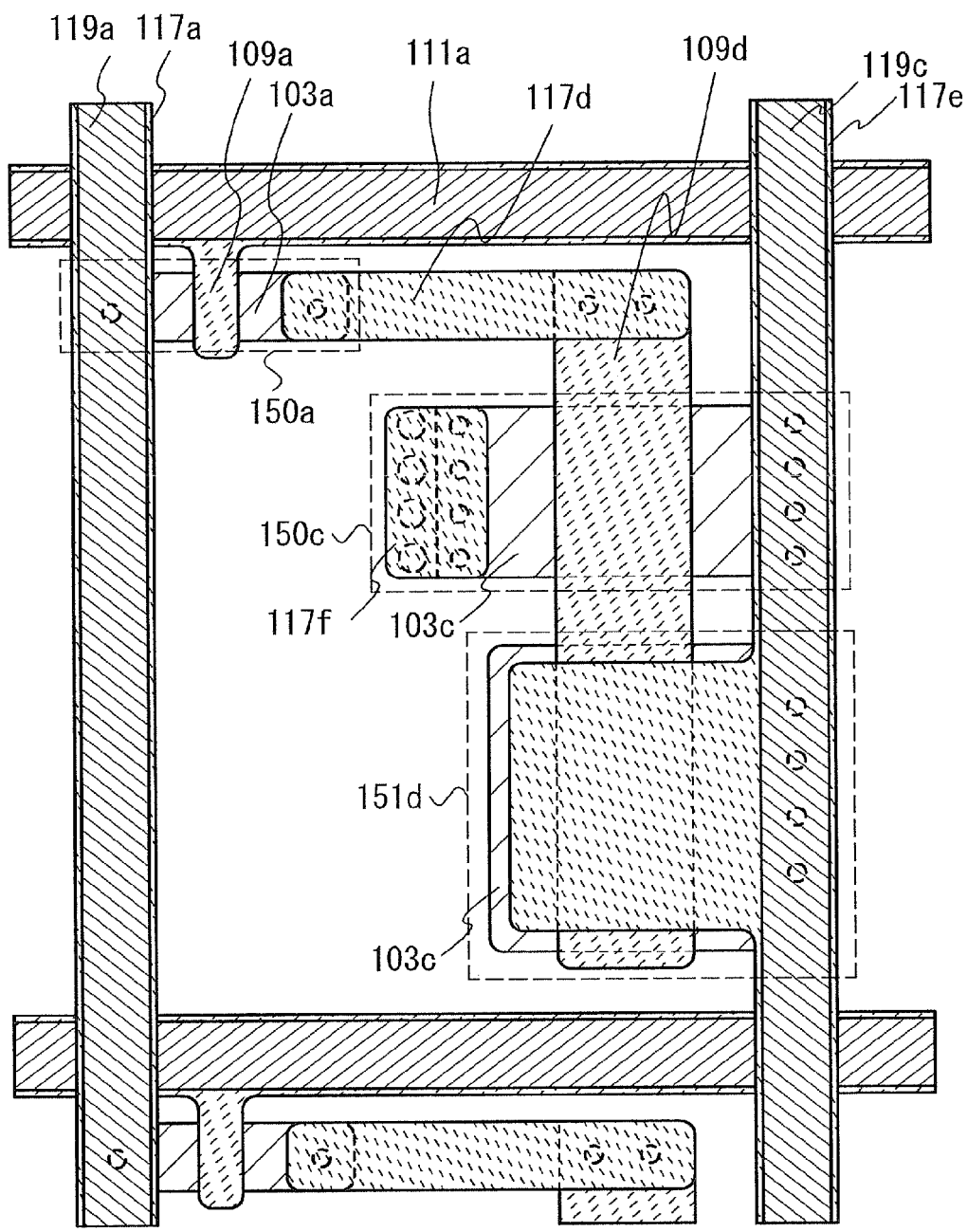
FIG. 12 is a top view of a semiconductor device.

In FIG. 12, a pixel structure of an EL display device will be described as an example of a pixel structure. A pixel illustrated in FIG. 12 includes a gate wiring formed by stacking the conductive layer 109a and the conductive layer 111a in this order, a source wiring formed by stacking the conductive layer 117a and the conductive layer 119a in this order, a switching transistor 150a, a driving transistor 150c, a storage capacitor portion 151d, and a power supply line formed by stacking a conductive layer 117e and a conductive layer 119c in this order.

The transistor 150a illustrated in FIG. 12 is similar to the transistor 150a illustrated in FIG. 1B and includes, over a substrate having an insulating surface, the oxide semiconductor layer 103a, a gate insulating film covering the oxide semiconductor layer 103a, the conductive layer 109a functioning as a gate electrode and being provided over the gate insulating film, an insulating film covering the oxide semiconductor layer 103a and the conductive layer 109a, and the conductive layers 117a and 117b functioning as source and drain electrodes and being provided over the insulating film and electrically connected to the oxide semiconductor layer 103a. Further, the driving transistor 150c includes, over the substrate having an insulating surface, an oxide semiconductor layer 103c, a gate insulating film covering the oxide semiconductor layer 103c, a conductive layer 109d functioning as a gate electrode and being provided over the gate insulating film, the insulating film 112 covering the oxide semiconductor layer 103c and the conductive layer 109d, and conductive layers 117e and 117f functioning as source and drain electrodes and being provided over the insulating film 112 and electrically connected to the oxide semiconductor layer 103c. The storage capacitor portion 151d includes a gate insulating film and an insulating film as dielectrics and the oxide semiconductor layer 103d, the conductive layer 109d, and the conductive layer 117e functioning as electrodes.

Although the semiconductor device in FIG. 12 includes two transistors the switching transistor 150a and the driving transistor 150c, one pixel may be provided with three or more transistors.

Even in the case where two or more transistors are provided in one pixel, light can be transmitted also in portions where the transistors are formed. Therefore, the aperture ratio can be improved.

Note that it is not necessary that light is transmitted through a transistor portion in a protective circuit or a peripheral driver circuit portion such as a gate driver or a source driver. Thus, a transistor and a capacitor of a pixel portion may be formed using light-transmitting materials and a transistor of the peripheral driver circuit portion may be formed using a light-blocking material.

This embodiment can be implemented in combination with any of the other embodiments as appropriate.

(Embodiment 2)

In this embodiment, an example of a manufacturing process of a semiconductor device will be described with reference to FIGS. 13A and 13B, 14A to 14F, 15A to 15D, 16A to 16D, 17A to 17D, 18A to 18D, 19A1 to 19B2, 20A and 20B, 21A and 21B, and 22A and 22B. Note that many portions are common to a semiconductor device according to this embodiment and a manufacturing process thereof and the semiconductor device according to Embodiment 1 and the manufacturing process thereof. Therefore, description of common portions is omitted and different points will be described in detail.

Figure 13A:
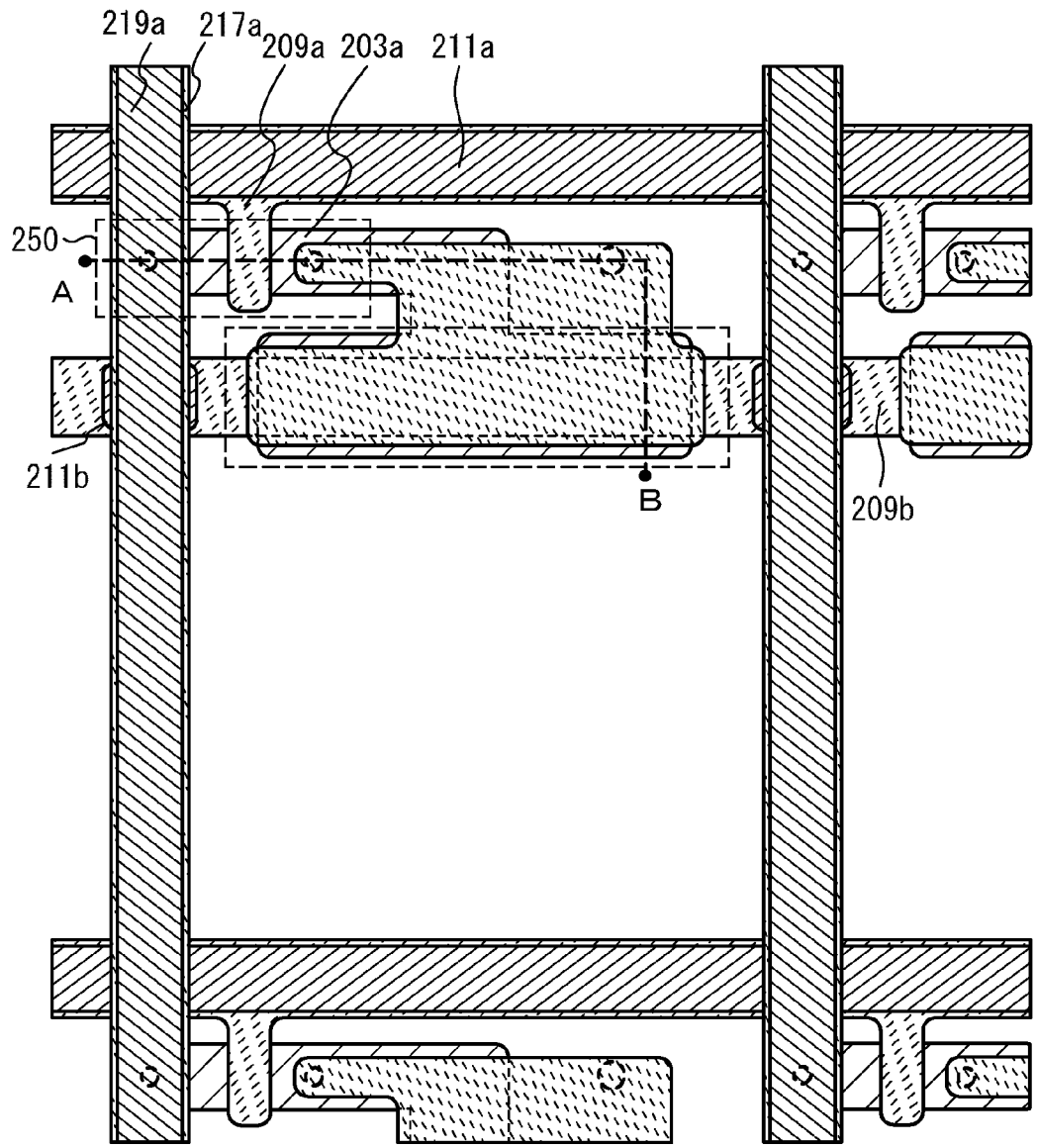
FIGS. 13A and 13B are a top view and a cross-sectional view of a semiconductor device.
Figure 13B:
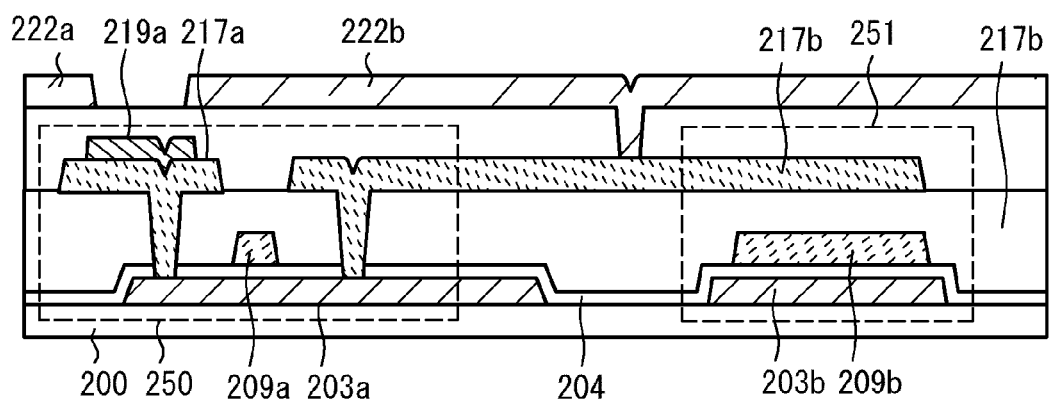

FIGS. 13A and 13B illustrate the semiconductor device of this embodiment. FIG. 13A is a plan view and FIG. 13B is a cross-sectional view taken along line A-B of FIG. 13A.

FIGS. 13A and 13B are different from FIGS. 1A and 1B as follows. In FIGS. 1A and 1B, the oxide semiconductor layer 103a and the oxide semiconductor layer 103b are formed for the transistor 150a and the storage capacitor portion 151a, respectively, whereas in FIGS. 13A and 13B, an oxide semiconductor layer of the transistor 250 and an oxide semiconductor layer of the storage capacitor portion 251 are formed in one island.

By employing such a structure, the layout for forming the oxide semiconductor layer can be simple. Further, since the number of contact holes can be reduced, contact resistance can be reduced. Further, defective contact can be suppressed.

Next, an example of a manufacturing process of a semiconductor device will be described with reference to FIGS. 14A to 14F, 15A to 15D, 16A to 16D, 17A to 17D, 18A to 18D, and 19A1 to 19B2. Further, in this embodiment, the case will be described in which a semiconductor device is formed using a multi-tone mask.

First, oxide semiconductor layers 203a and 203b are formed over a substrate 200 having an insulating surface (see FIGS. 14A and 14B).

As for a material of the substrate 200 and a material and a manufacturing method of the oxide semiconductor layers 203a and 203b, those of the substrate 100 and the oxide semiconductor layers 103a and 103b which are described in Embodiment 1 can be referred to. An insulating film serving as a base film may be formed over the substrate 200 having an insulating surface.

Next, a gate insulating film 204, a conductive film 205, and a conductive film 206 are formed over the oxide semiconductor layers 203a and 203b (see FIGS. 14C and 14D).

As for materials and manufacturing methods of the gate insulating film 204, the conductive film 205, and the conductive film 206, those of the gate insulating film 104, the conductive film 105, and the conductive film 106 which are described in Embodiment 1 can be referred to.

Next, resist masks 207a and 207b are formed over the conductive film 206. The resist masks 207a and 207b can be formed to have regions with different thicknesses by using a multi-tone mask. By using the multi-tone mask, the number of photomasks used and the number of manufacturing steps can be reduced, which is preferable. In this embodiment, a multi-tone mask can be used in a step for forming the pattern of the conductive film 205 and the conductive film 206 and a step for forming the pattern of the conductive films 213 and 214.

The multi-tone mask is a mask with which exposure can be performed with the amount of light at a plurality of levels. Typically, exposure is performed with the amount of light at three levels: an exposed region, a semi-exposed region, and an unexposed region. By using the multi-tone mask, a resist mask with a plurality of thicknesses (typically two thicknesses) can be formed through one exposure step and one development step. Thus, the number of photomasks can be reduced by using the multi-tone mask.

FIGS. 19A1 and 19B1 are cross-sectional views of typical multi-tone masks. FIG. 19A1 illustrates a gray-tone mask 403 and FIG. 19B1 illustrates a half-tone mask 414.

The gray-tone mask 403 illustrated in FIG. 19A1 includes, on a light-transmitting substrate 400, a light-blocking portion 401 formed using a light-blocking layer and a diffraction grating portion 402 formed by the pattern of the light-blocking layer.

The diffraction grating portion 402 controls the light transmissivity by using slits, dots, meshes, or the like provided at intervals which are equal to or smaller than the limit of the resolution of light used for exposure. Note that the slits, dots, or meshes may be provided in the diffraction grating portion 402 at periodic intervals or non-periodic intervals.

As the light-transmitting substrate 400, quartz or the like can be used. The light-blocking layer forming the light-blocking portion 401 and the diffraction grating portion 402 may be formed using a metal film: preferably chromium, chromium oxide, or the like.

When the gray-tone mask 403 is irradiated with light for exposure, as shown in FIG. 19A2, the light transmissivity of a region which overlaps with the light-blocking portion 401 is 0% and the light transmissivity of a region which is not provided with the light-blocking portion 401 or the diffraction grating portion 402 is 100%. In addition, the light transmissivity of the diffraction grating portion 402 is approximately 10% to 70% and can be adjusted by intervals between slits, dots, or meshes in the diffraction grating, or the like.

The half-tone mask 414 illustrated in FIG. 19B1 includes, on a light-transmitting substrate 411, a semi-light-transmitting portion 412 and a light-blocking portion 413 which are formed using a semi-light-transmitting layer and a light-blocking layer, respectively.

The semi-light-transmitting portion 412 can be formed using a layer of MoSiN, MoSi, MoSiO, MoSiON, CrSi, or the like. The light-blocking portion 413 may be formed using the same metal film as the light-blocking layer for the gray-tone mask: preferably chromium, chromium oxide, or the like.

When the half-tone mask 414 is irradiated with light for exposure, as shown in FIG. 19B2, the light transmissivity of a region which overlaps the light-blocking portion 413 is 0% and the light transmissivity of a region which is not provided with the light-blocking portion 413 or the semi-light-transmitting portion 412 is 100%. In addition, the light transmissivity of the semi-light-transmitting portion 412 is approximately 10% to 70% and can be adjusted by the kind of material or the thickness of a film to be formed, or the like.

Since a multi-tone photomask can achieve three levels of light exposure to obtain an exposed portion, a semi-exposed portion, and an unexposed portion, a resist mask with a plurality of thicknesses (typically two thicknesses) can be formed through one exposure step and one development step. Thus, the number of photomasks can be reduced by using the multi-tone mask.

A half-tone mask illustrated in FIGS. 14E and 14F includes semi-light-transmitting layers 301a and 301b and a light-blocking layer 301c on a light-transmitting substrate 300. Accordingly, over the conductive film 206, the resist masks 207a and 207b are formed so as to be thin over a portion to be an electrode of the storage capacitor portion 251 and a portion to be a gate electrode, and the resist mask 207a is formed so as to be thick over a portion to be a gate wiring (see FIGS. 14E and 14F).

Figure 15A:
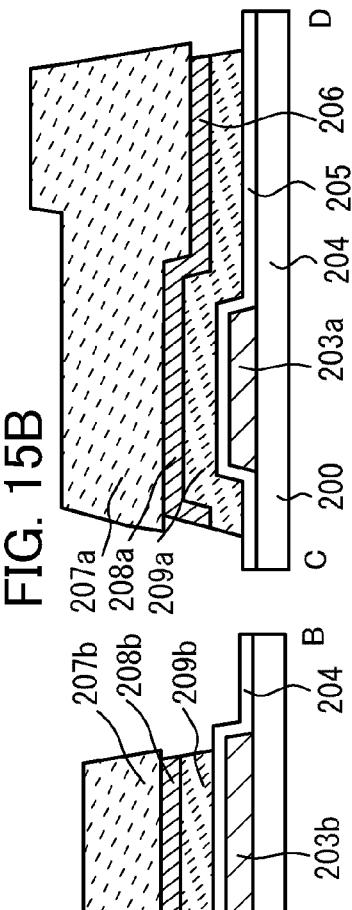
FIGS. 15A to 15D are cross-sectional views illustrating the method for manufacturing a semiconductor device.
Figure 15B:
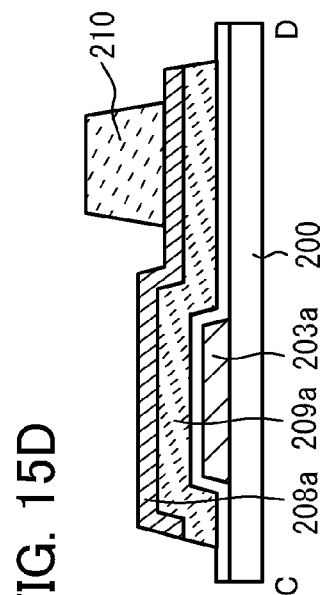
Figure 15C:
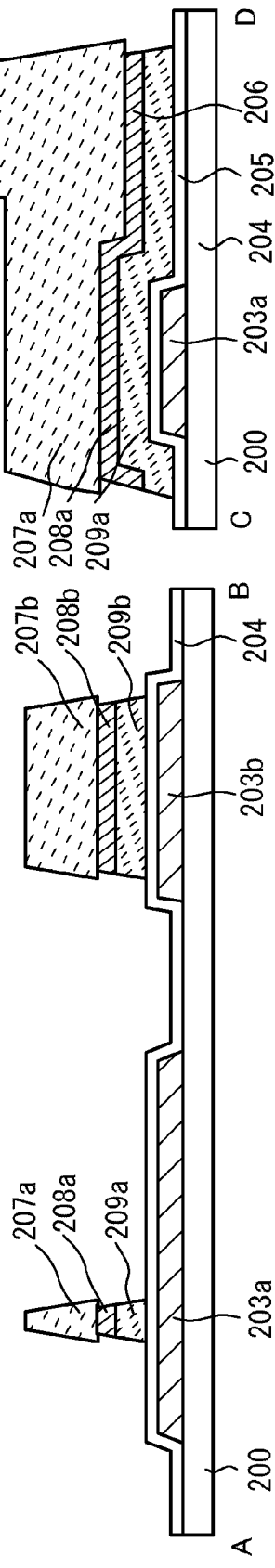
Figure 15D:
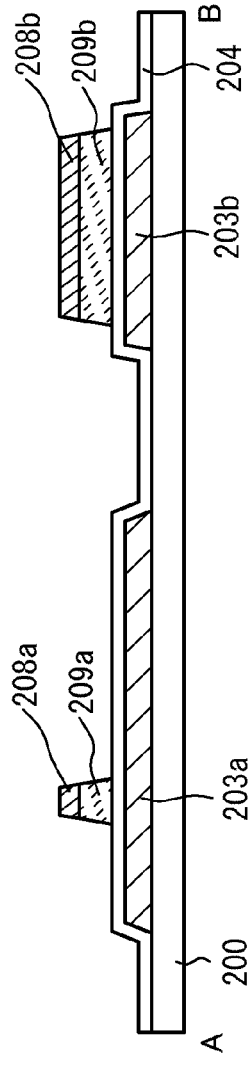

Unnecessary portions of the conductive films 205 and 206 are selectively etched to be removed using resist masks 207a and 207b, so that the conductive layers 208a and 209a and the conductive layers 208b and 209b are formed (see FIGS. 15A and 15B).

Next, the resist masks 207a and 207b are ashed by oxygen plasma. By ashing the resist masks 207a and 207b by the oxygen plasma, the resist mask 207b is removed and the conductive layer 208b is exposed. In addition, the resist mask 207a is reduced in size and remains as a resist mask 210 (see FIGS. 15C and 15D). In this manner, by using the resist mask formed using the multi-tone mask, a resist mask is not additionally used, so that steps can be simplified.

Next, the conductive layers 208a and 208b are etched using the resist mask 210 (see FIGS. 16A and 16B). The resist mask 210 is removed after the etching. As a result, the conductive layer 208b is removed and thus the conductive layer 209b is exposed. In addition, part of the conductive layer 208a, over which the resist mask 210 is not formed, is removed and thus the conductive layer 209a is exposed. Accordingly, the surface areas of the conductive layer 208a and the conductive layer 209a are largely different from each other. That is, the surface area of the conductive layer 209a is larger than that of the conductive layer 208a. Alternatively, as for the conductive layers 208a and 209a, there are a region in which the conductive layers 208a and 209a are overlapped with each other and a region in which the conductive layers 208a and 209a are not overlapped with each other.

A region including at least the conductive layer 211a having a light-blocking property functions as a gate wiring and a region including the conductive layer 209a having a light-transmitting property functions as a gate electrode. By forming the conductive layer 209a functioning as the gate electrode with the use of a light-transmitting material, the aperture ratio of a pixel can be improved. Further, by stacking a light-transmitting conductive layer and a light-blocking conductive layer in this order to form the conductive layers 209a and 211a functioning as the gate wiring, wiring resistance and power consumption can be reduced. Further, since the gate wiring is formed using the light-blocking conductive layer, a space between pixels can be shielded from light.

Further, a capacitor wiring is provided in the same direction as that of the gate wiring. Although part of the capacitor wiring, which is in a pixel region, is desirably formed using the conductive layer 209b having a light-transmitting property, part of the capacitor wiring, which is overlapped with a source wiring to be formed later, may be formed by stacking the conductive layer 209b having a light-transmitting property and the conductive layer 211b having a light-blocking property in this order.

By thus using a multi-tone mask, a light-transmitting region (a region with high light transmissivity) and a light-blocking region (a region with low light transmissivity) can be formed with one mask. Accordingly, the light-transmitting region (the region with high light transmissivity) and the light-blocking region (the region with low light transmissivity) can be formed without increasing the number of masks.

Next, after the insulating film 212 functioning as an interlayer insulating film is formed so as to cover the conductive layers 209a and 209b and the gate insulating film 204, contact holes reaching the oxide semiconductor layer are formed in the insulating film 212 so that parts of a surface of the oxide semiconductor layer are exposed. As for a material and a manufacturing method of the insulating film 212, those of the insulating film 112 described in Embodiment 1 can be referred to.

Next, a conductive film 213 and a conductive film 214 are formed over the insulating film 212 (see FIGS. 16C and 16D). As for materials and manufacturing methods of the conductive film 213 and the conductive film 214, those of the conductive film 113 and the conductive film 114 described in Embodiment 1 can be referred to.

Next, resist masks 215a and 215b are formed over the conductive film 214 with the use of a half-tone mask (see FIGS. 17A and 17B). The half-tone mask includes a semi-light-transmitting layer 303b and a light-blocking layer 303a on a light-transmitting substrate 302. Accordingly, over the conductive film 214, the resist mask 215b which is thin is formed over a portion to be a source or drain electrode, and the resist mask 215a which is thick is formed over a portion to be a source wiring.

Unnecessary portions of the conductive films 213 and 214 are selectively etched to be removed using the resist masks 215a and 215b, so that the conductive layers 216a and 217a and the conductive layers 216b and 217b are formed (see FIGS. 17C and 17D).

Next, the resist masks 215a and 215b are ashed by oxygen plasma. By ashing the resist masks 215a and 215b by the oxygen plasma, the resist mask 215b is removed and thus the conductive layer 217b is exposed. In addition, the resist mask 215a is reduced in size and thus remains as a resist mask 218. In this manner, by using the resist mask formed using a multi-tone mask, a resist mask is not additionally used, so that steps can be simplified.

Next, the conductive layers 216a and 216b are etched using the resist mask 218 (see FIGS. 18A and 18B). As a result, the conductive layer 216b is removed and thus the conductive layer 217b is exposed. In addition, part of the conductive layer 216a, over which the resist mask 218 is not formed, is removed, so that the conductive layer 219a is formed. Thus, the surface areas of the conductive layer 219a and the conductive layer 217a are largely different from each other. That is, the surface area of the conductive layer 217a is larger than that of the conductive layer 219a. Alternatively, as for the conductive layers 219a and 217a, there are a region in which the conductive layers 219a and 217a are overlapped with each other and a region in which the conductive layers 219a and 217a are not overlapped with each other. Note that the resist mask 218 is removed after the etching.

A region including at least the conductive layer 219a having a light-blocking property functions as a source wiring and a region including the conductive layer 217a having a light-transmitting property functions as a source or drain electrode. By forming the conductive layers 217a and 217b functioning as source and drain electrodes with the use of a light-transmitting conductive layer, the aperture ratio of a pixel can be improved. Further, by stacking a light-transmitting conductive layer and a light-blocking conductive layer in this order to form the conductive layers 217a and 219a functioning as the source wiring, wiring resistance and power consumption can be reduced. Further, since the source wiring is formed using the conductive layer 219a having a light-blocking property, a space between pixels can be shielded from light. That is, with the gate wirings provided in a row direction and the source wirings provided in a column direction, the space between the pixels can be shielded from light without using a black matrix.

Further, the conductive layer 217a functions also as an electrode of the storage capacitor portion 251. In the capacitor wiring, the storage capacitor portion 251 includes the gate insulating film 204 and the insulating film 212 functioning as dielectrics and the oxide semiconductor layer 203a, the conductive layer 209b, and the conductive layer 217b functioning as electrodes.

By thus forming the storage capacitor portion 251 using the light-transmitting conductive layer, light can be transmitted also in a portion where the storage capacitor portion 251 is formed. Therefore, the aperture ratio can be improved. Further, when the storage capacitor portion 251 is formed using the light-transmitting conductive material, the storage capacitor portion 251 can be large. Therefore, even when the transistor is off, potential holding characteristics of a pixel electrode can be favorable and thus display quality can be favorable. Further, a feedthrough potential can be low.

In this manner, the transistor 250 and the storage capacitor portion 251 can be formed. Further, the transistor 250 and the storage capacitor portion 251 can be light-transmitting elements.

Next, after the insulating film 220 is formed, a resist mask (not illustrated) is formed over the insulating film 220, and the insulating film 220 is etched using the resist mask to form a contact hole in the insulating film 220. Then, a conductive film 221 is formed over the insulating film 220 and the contact hole. As for materials and manufacturing methods of the insulating film 220 and the conductive film 221, those of the insulating film 120 and the conductive film 121 in Embodiment 1 can be referred to. Note that the insulating film 220 is not necessarily formed. A pixel electrode may be formed over the same layer as the source electrode and the source wiring.

Next, a resist mask (not illustrated) is formed over the conductive film 221, and the conductive film 221 is selectively etched using the resist mask, so that conductive films 222a and 222b are formed (see FIGS. 18C and 18D). Note that the resist mask is removed after the etching.

Thus, a semiconductor device can be formed. Since a multi-tone photomask can achieve three levels of light exposure to obtain an exposed portion, a semi-exposed portion, and an unexposed portion, a resist mask with a plurality of thicknesses (typically two thicknesses) can be formed through one exposure step and one development step. Thus, the number of photomasks can be reduced by using the multi-tone mask. Further, by the manufacturing method described in this embodiment, the transistor 250 having a light-transmitting property and the storage capacitor portion 251 having a light-transmitting property can be formed. Therefore, since a wiring for connecting the transistor and an element (e.g., another transistor) can be formed using a material with low resistivity and high conductivity, the distortion of the waveform of a signal and a voltage drop due to wiring resistance can be reduced. Further, since a semiconductor layer of the transistor 250 and an oxide semiconductor layer of the storage capacitor portion 251 are formed in one island, the layout for forming the oxide semiconductor layer can be simple. Further, since the number of contact holes can be reduced, contact resistance can be reduced. Further, defective contact can be suppressed. Note that although the case is described in which a multi-tone mask is used in both the step of forming a gate wiring and the step of forming the source wiring in this embodiment, a multi-tone mask may be used in either one step.

Next, another example of a semiconductor device will be described with reference to FIGS. 20A and 20B. Note that many parts are common to the semiconductor device illustrated in FIGS. 20A and 20B and the semiconductor device in FIGS. 1A and 1B. Therefore, description of common portions is omitted and different points will be described. Further, FIG. 20A is a plan view and FIG. 20B is a cross-sectional view taken along line A-B in FIG. 20A.

Figure 20A:
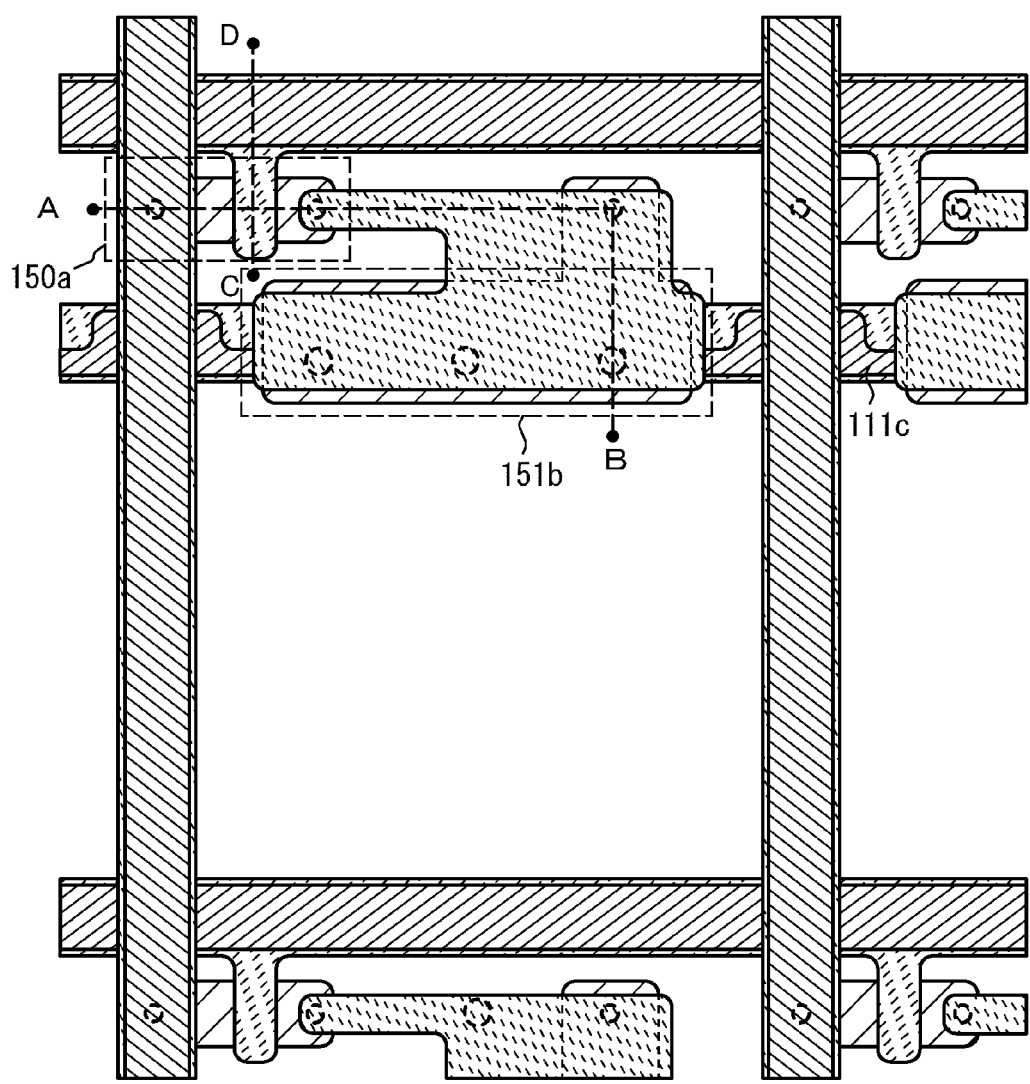
FIGS. 20A and 20B are a top view and a cross-sectional view of a semiconductor device.
Figure 20B:
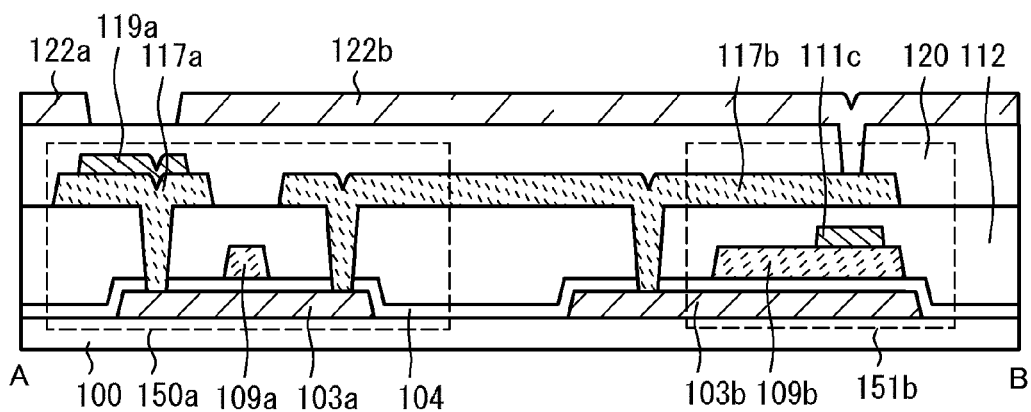

FIGS. 20A and 20B are different from FIGS. 1A and 1B in that in a capacitor wiring, the conductive layer 109b having a light-transmitting property and a conductive layer 111c having a light-blocking property are stacked in this order and the area of the conductive layer 111c having a light-blocking property is larger than the conductive layer 111b of FIGS. 1A and 1B. Further, the pixel electrode has contact with the conductive layer 117b over the conductive layer 111c having a light-blocking property of the capacitor wiring. Since the structure is similar to that in FIGS. 1A and 1B, the specific description is omitted.

By employing such a structure, the capacitor wiring can be formed using a material with low resistivity and high conductivity; thus, the distortion of the waveform of a signal and a voltage drop due to wiring resistance can be reduced. In addition, even if disorder of the alignment of liquid crystal is caused by unevenness due to the contact hole in the pixel electrode, leakage of light can be prevented by the conductive layer 111c having a light-blocking property of the capacitor wiring.

Note that it is not necessary that light is transmitted through a transistor portion in a protective circuit or a peripheral driver circuit portion such as a gate driver or a source driver. Thus, a transistor and a capacitor of a pixel portion may be formed using light-transmitting materials and a transistor of the peripheral driver circuit portion may be a light-blocking material.

This embodiment can be implemented in combination with any of the other embodiments as appropriate.

(Embodiment 3)

In this embodiment, an example will be described in which at least part of a driver circuit and a thin film transistor provided in a pixel portion are formed over one substrate.

Figure 21A:
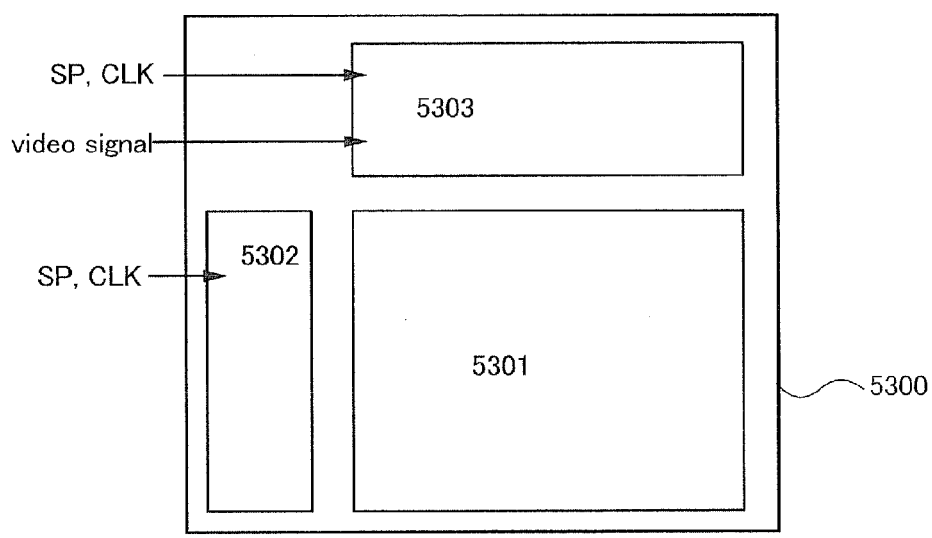
FIGS. 21A and 21B are diagrams of semiconductor devices.

FIG. 21A is an example of a block diagram of an active matrix liquid crystal display device which is an example of display devices. The display device illustrated in FIG. 21A includes, over a substrate 5300, a pixel portion 5301 which includes a plurality of pixels each provided with a display element, a scan line driver circuit 5302 which selects a pixel, and a signal line driver circuit 5303 which controls input of a video signal to the selected pixel.

Figure 21B:
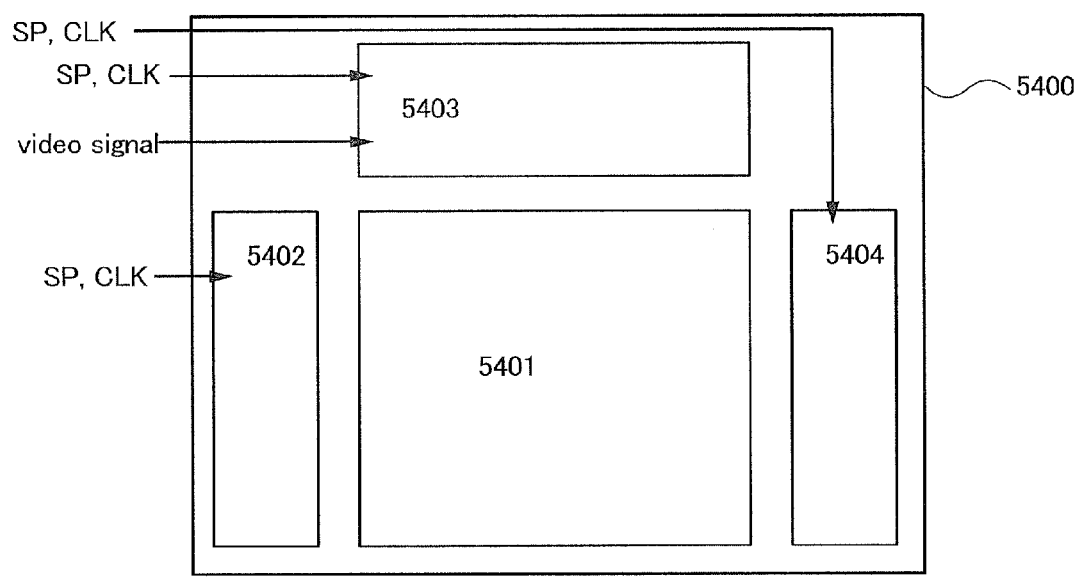

A light-emitting display device illustrated in FIG. 21B includes, over a substrate 5400, a pixel portion 5401 which includes a plurality of pixels each provided with a display element, a first scan line driver circuit 5402 which selects a pixel, a second scan line driver circuit 5404 which selects a pixel, and a signal line driver circuit 5403 which controls input of a video signal to the selected pixel.

When the video signal input to a pixel of the light-emitting display device illustrated in FIG. 21B is a digital signal, the pixel emits or does not emit light by switching of on/off of a transistor. Thus, grayscale can be displayed using an area ratio grayscale method or a time ratio grayscale method. An area ratio grayscale method refers to a driving method by which one pixel is divided into a plurality of subpixels and the subpixels are driven independently based on video signals so that grayscale is displayed. Further, a time ratio grayscale method refers to a driving method by which a period during which a pixel emits light is controlled so that grayscale is displayed.

Since the response speed of light-emitting elements is higher than that of liquid crystal elements or the like, the light-emitting elements are more suitable for a time ratio grayscale method than liquid-crystal display elements. In the case of performing display with a time ratio grayscale method, one frame period is divided into a plurality of sub-frame periods. Then, in accordance with video signals, the light-emitting element in the pixel is set in a light-emitting state or a non-light-emitting state in each subframe period. By dividing one frame into a plurality of subframes, the total length of time, in which pixels actually emit light in one frame period, can be controlled with video signals so that grayscale can be displayed.

In the light-emitting display device illustrated in FIG. 21B, in the case where two switching TFTs are arranged in one pixel, the first scan line driver circuit 5402 generates a signal which is input to a first scan line functioning as a gate wiring of one of the switching TFTs, and the second scan line driver circuit 5404 generates a signal which is input to a second scan line functioning as a gate wiring of the other of the switching TFTs; however, one scan line driver circuit may generate both the signal which is input to the first scan line and the signal which is input to the second scan line. In addition, for example, there is a possibility that a plurality of scan lines used for controlling the operation of the switching element are provided in each pixel, depending on the number of switching TFTs included in one pixel. In this case, one scan line driver circuit may generate all signals that are input to the plurality of scan lines, or a plurality of scan line driver circuits may generate signals that are input to the plurality of scan lines.

The thin film transistor to be provided in the pixel portion of the liquid crystal display device is formed according to any of Embodiments 1 and 2. Further, the thin film transistors described in Embodiments 1 and 2 is an n-channel TFT, and thus part of a driver circuit that can include an n-channel TFT among driver circuits is formed over the same substrate as the thin film transistor of the pixel portion.

In addition, also in the light-emitting display device, a part of the driver circuit that can include an n-channel TFT among driver circuits can be formed over the same substrate as the thin film transistor of the pixel portion. Alternatively, the signal line driver circuit and the scan line driver circuit can be formed using only the n-channel TFTs described in any of Embodiments 1 and 2.

Note that it is not necessary that light is transmitted through a transistor in a protective circuit or a peripheral driver circuit portion such as a gate driver or a source driver. Thus, in a pixel portion, light is transmitted through a transistor and a capacitor, and in the peripheral driver circuit portion, light is not necessarily transmitted through a transistor.

Figure 22A:
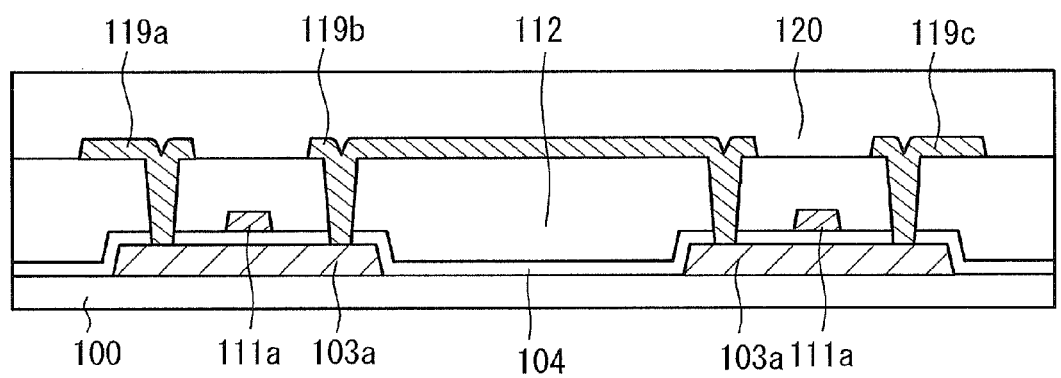
FIGS. 22A and 22B are cross-sectional views of semiconductor devices.
Figure 22B:
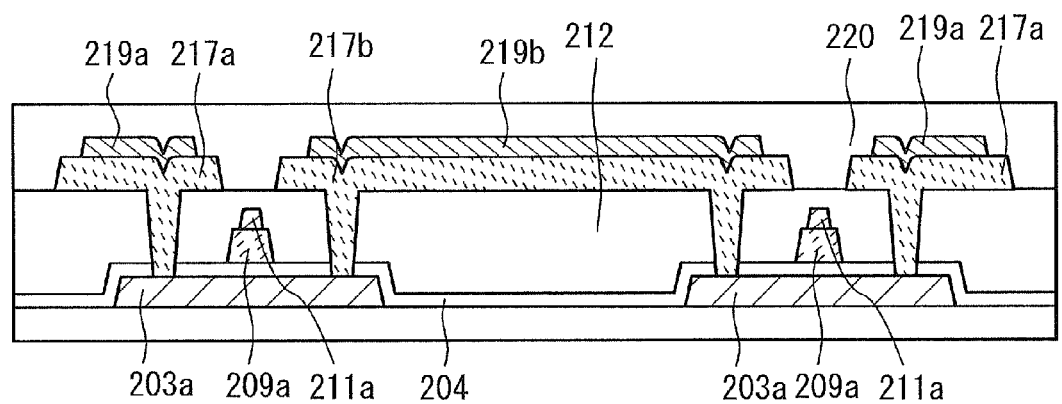

FIG. 22A illustrates the case where a thin film transistor is formed without using a multi-tone mask and FIG. 22B illustrates the case where a thin film transistor is formed using a multi-tone mask. In the case where a thin film transistor is formed without using a multi-tone mask, the conductive layer 111a functioning as a gate electrode and the conductive layers 119a and 119b functioning as source and drain electrodes can be formed using a light-blocking conductive layer (see FIG. 22A). In the case where a thin film transistor is formed using a multi-tone mask, a gate electrode and source and drain electrodes can be formed using a light-transmitting conductive layer and a light-blocking conductive layer, respectively.

Moreover, the above-described driver circuit can be used for electronic paper that drives electronic ink using an element electrically connected to a switching element, without being limited to applications to a liquid crystal display device or a light-emitting display device. Electronic paper is also referred to as an electrophoretic display device (electrophoretic display) and has advantages in that it has the same level of readability as plain paper, it has lower power consumption than other display devices, and it can be made thin and lightweight.

This embodiment can be implemented in combination with any of the structures described in the other embodiments, as appropriate.

(Embodiment 4)

Next, a structure of a display device which is an embodiment of a semiconductor device will be described. In this embodiment, a light-emitting display device including a light-emitting element utilizing electroluminescence will be described as a display device. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of a voltage to a light-emitting element, electrons and holes are separately injected from a pair of electrodes into a layer containing a light-emitting organic compound, and a current flows. The carriers (electrons and holes) are recombined and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that description is given here using an organic EL element as a light-emitting element.

Next, a structure and an operation of a pixel to which digital time ratio grayscale driving can be applied will be described.

Figure 23:
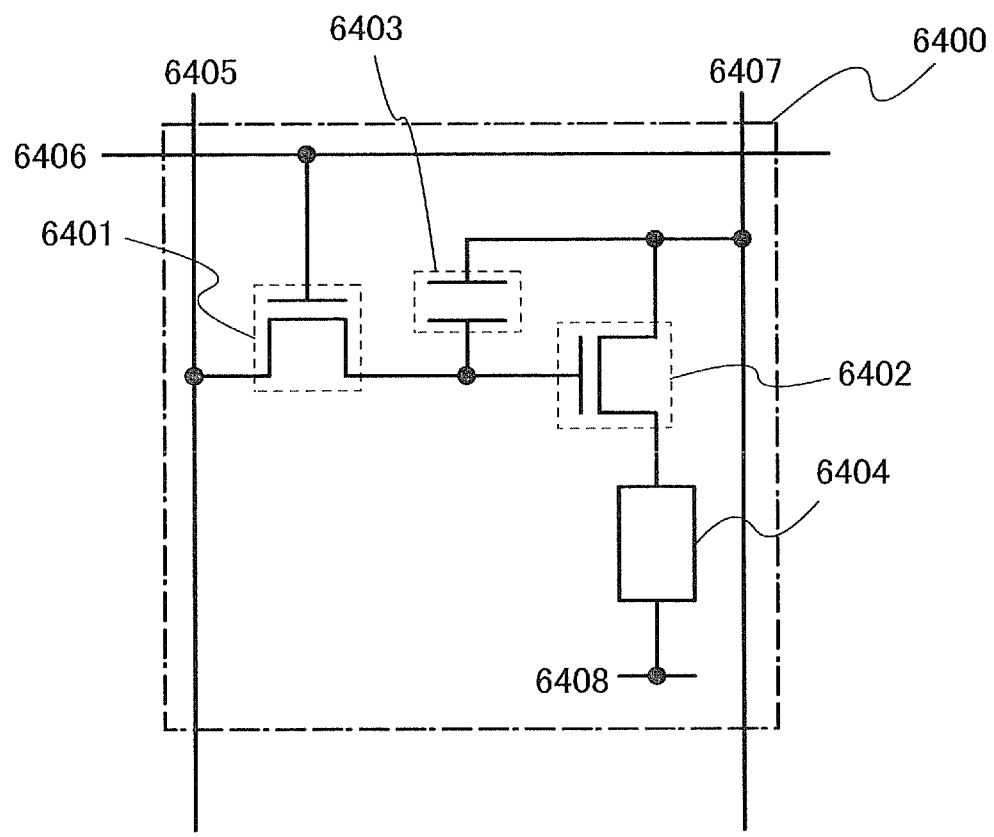
FIG. 23 is a diagram of a pixel equivalent circuit of a semiconductor device.

FIG. 23 is a diagram illustrating an example of a pixel structure to which digital time ratio grayscale driving can be applied.

Here, an example will be described in which one pixel includes two n-channel transistors each using an oxide semiconductor layer (In—Ga—Zn—O-based non-single-crystal film) for a channel formation region.

A pixel 6400 includes a switching transistor 6401, a driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402. The gate of the driving transistor 6402 is connected to a power supply line 6407 through the capacitor 6403, a first electrode of the driving transistor 6402 is connected to the power supply line 6407, and a second electrode of the driving transistor 6402 is connected to a first electrode (pixel electrode) of the light-emitting element 6404. A second electrode of the light-emitting element 6404 corresponds to a common electrode 6408.

The second electrode of the light-emitting element 6404 (the common electrode 6408) is set at a low power supply potential. Note that the low power supply potential is a potential satisfying the low power supply potential < a high power supply potential with the high power supply potential set to the power supply line 6407 as a reference. As the low power supply potential, GND, 0 V, or the like may be employed, for example. A potential difference between the high power supply potential and the low power supply potential is applied to the light-emitting element 6404, and a current is supplied to the light-emitting element 6404. Here, in order to make the light-emitting element 6404 emit light, each potential is set so that the potential difference between the high power supply potential and the low power supply potential is a forward threshold voltage of the light-emitting element 6404 or higher.

Note that gate capacitance of the driving transistor 6402 may be used as a substitute for the capacitor 6403, so that the capacitor 6403 can be omitted. The gate capacitance of the driving transistor 6402 may be formed between a channel region and the gate electrode.

Here, in the case of a voltage-input voltage driving method, a video signal is input to the gate of the driving transistor 6402 so that the driving transistor 6402 is sufficiently turned on or turned off. That is, the driving transistor 6402 operates in a linear region. Since the driving transistor 6402 operates in a linear region, a voltage higher than the voltage of the power supply line 6407 is applied to the gate of the driving transistor 6402. Note that a voltage higher than or equal to (power supply line voltage $+V_{th}$ of the driving transistor 6402) is applied to the signal line 6405.

Further, in the case of using analog grayscale driving instead of the digital time ratio grayscale driving, the pixel structure the same as that of FIG. 23 can be employed by inputting signals in a different way.

In the case of performing the analog grayscale driving, a voltage higher than or equal to (a forward voltage of the light-emitting element 6404+$V_{th}$ of the driving transistor 6402) is applied to the gate of the driving transistor 6402. The forward voltage of the light-emitting element 6404 refers to a voltage for obtaining a desired luminance, and includes at least a forward threshold voltage. Note that by inputting the video signal which allows the driving transistor 6402 to operate in a saturation region, a current can be supplied to the light-emitting element 6404. In order that the driving transistor 6402 may operate in the saturation region, the potential of the power supply line 6407 is set to be higher than the gate potential of the driving transistor 6402. When the video signal is an analog signal, a current corresponding to the video signal is supplied to the light-emitting element 6404, so that the analog grayscale driving can be performed.

Note that a pixel structure of the present invention is not limited to that illustrated in FIG. 23. For example, a switch, a resistor, a capacitor, a transistor, a logic circuit, or the like may be added to the pixel illustrated in FIG. 23.

Next, structures of the light-emitting element will be described with reference to FIGS. 24A to 24C. A cross-sectional structure of a pixel will be described by taking the case where a transistor 150c illustrated in FIG. 12 is used as a driving TFT as an example. Driving TFTs 7001, 7011, and 7021 used for the semiconductor devices illustrated in FIGS. 24A to 24C can be manufactured similarly to the thin film transistors described in Embodiments 1 and 2 and are thin film transistors with favorable electric characteristics each having an In—Ga—Zn—O-based non-single-crystal film as a semiconductor layer.

In order to extract light emitted from the light-emitting element, at least one of the anode and the cathode is required to transmit light. A thin film transistor and a light-emitting element are formed over a substrate. A light-emitting element can have a top emission structure, in which light emission is extracted through the surface on the side opposite to the substrate side; a bottom emission structure, in which light emission is extracted through the surface on the substrate side; or a dual emission structure, in which light emission is extracted through the surface on the side opposite to the substrate side and the surface on the substrate side. The pixel structure illustrated in FIG. 23 can be applied to a light-emitting element having any of these emission structures.

A light-emitting element having a top emission structure will be described with reference to FIG. 24A.

Figure 24A:
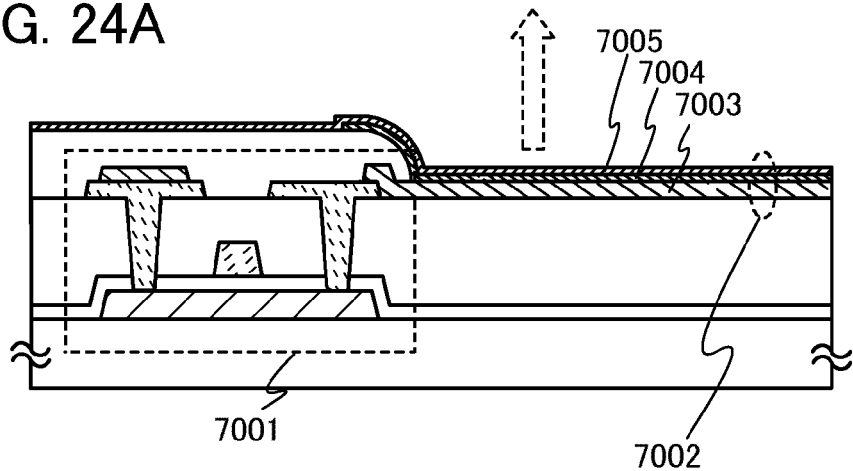
FIGS. 24A to 24C are cross-sectional views of semiconductor devices.

FIG. 24A is a cross-sectional view of a pixel in the case where the driving TFT 7001 is the transistor 150c illustrated in FIG. 12 and light is emitted from a light-emitting element 7002 to an anode 7005 side. In FIG. 24A, a cathode 7003 of the light-emitting element 7002 is electrically connected to the driving TFT 7001, and a light-emitting layer 7004 and the anode 7005 are stacked in this order over the cathode 7003. The cathode 7003 can be formed using any of a variety of materials as long as it is a conductive film that has a low work function and reflects light. For example, Ca, Al, CaF, MgAg, AlLi, or the like is desirably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. Note that it is not necessary to form all of these layers. The anode 7005 is formed using a light-transmitting conductive material such as a light-transmitting conductive film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

The light-emitting element 7002 corresponds to a region where the cathode 7003 and the anode 7005 sandwich the light-emitting layer 7004. In the case of the pixel illustrated in FIG. 24A, light is emitted from the light-emitting element 7002 to the anode 7005 side as shown by an arrow.

Note that the gate electrode provided over the oxide semiconductor layer in the driver circuit is preferably formed using the material used for the cathode 7003 because the process can be simplified.

Next, a light-emitting element having a bottom emission structure will be described with reference to FIG. 24B. FIG. 24B is a cross-sectional view of a pixel in the case where the driving TFT 7011 is the transistor 150c illustrated in FIG. 12 and light is emitted from a light-emitting element 7012 to the cathode 7013 side. In FIG. 24B, the cathode 7013 of the light-emitting element 7012 is formed over a light-transmitting conductive film 7017 that is electrically connected to the driving TFT 7011, and a light-emitting layer 7014 and an anode 7015 are stacked in this order over the cathode 7013. Note that a light-blocking film 7016 for reflecting or blocking light may be formed so as to cover the anode 7015 when the anode 7015 has a light-transmitting property. For the cathode 7013, any of a variety of materials can be used as in the case of FIG. 24A as long as it is a conductive film having a low work function. It is to be noted that the cathode 7013 is formed to a thickness that allows light transmission (preferably, approximately 5 nm to 30 nm). For example, an aluminum film with a thickness of 20 nm can be used as the cathode 7013. As in the case of FIG. 24A, the light-emitting layer 7014 may be formed using either a single layer or a plurality of layers stacked. The anode 7015 is not required to transmit light, but can be formed using a light-transmitting conductive material as in the case of FIG. 24A. As the light-blocking film 7016, metal or the like that reflects light can be used for example; however, it is not limited to a metal film. For example, a resin or the like to which black pigments are added may alternatively be used.

The light-emitting element 7012 corresponds to a region where the cathode 7013 and the anode 7015 sandwich the light-emitting layer 7014. In the case of the pixel illustrated in FIG. 24B, light is emitted from the light-emitting element 7012 to the cathode 7013 side as shown by an arrow.

Note that the gate electrode provided over the oxide semiconductor layer in the driver circuit is preferably formed using the material used for the cathode 7013 because the process can be simplified.

Next, a light-emitting element having a dual emission structure will be described with reference to FIG. 24C. In FIG. 24C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. As in the case of FIG. 24A, the cathode 7023 can be formed using any of a variety of materials as long as it is a conductive film having a low work function. It is to be noted that the cathode 7023 is formed to a thickness that allows light transmission. For example, a film of Al having a thickness of 20 nm can be used as the cathode 7023. As in FIG. 24A, the light-emitting layer 7024 may be formed using either a single layer or a plurality of layers stacked. The anode 7025 can be formed using a light-transmitting conductive material as in the case of FIG. 24A.

The light-emitting element 7022 corresponds to a region where the cathode 7023, the light-emitting layer 7024, and the anode 7025 are overlapped with one another. In the case of the pixel illustrated in FIG. 24C, light is emitted from the light-emitting element 7022 to both the anode 7025 side and the cathode 7023 side as shown by arrows.

Note that the gate electrode provided over the oxide semiconductor layer in the driver circuit is preferably formed using the material used for the conductive film 7027 because the process can be simplified. Further, the gate electrode provided over the oxide semiconductor layer in the driver circuit is preferably formed by stacking the material used for the conductive film 7027 and the material used for the cathode 7023 because the process can be simplified and in addition, wiring resistance can be reduced.

Note that, although an organic EL element is described here as a light-emitting element, an inorganic EL element can alternatively be provided as a light-emitting element.

Note that in this embodiment, the example is described in which a thin film transistor (driving TFT) which controls the driving of a light-emitting element is electrically connected to the light-emitting element; however, a structure may be employed in which a TFT for current control is connected between the driving TFT and the light-emitting element.

Figure 24B:
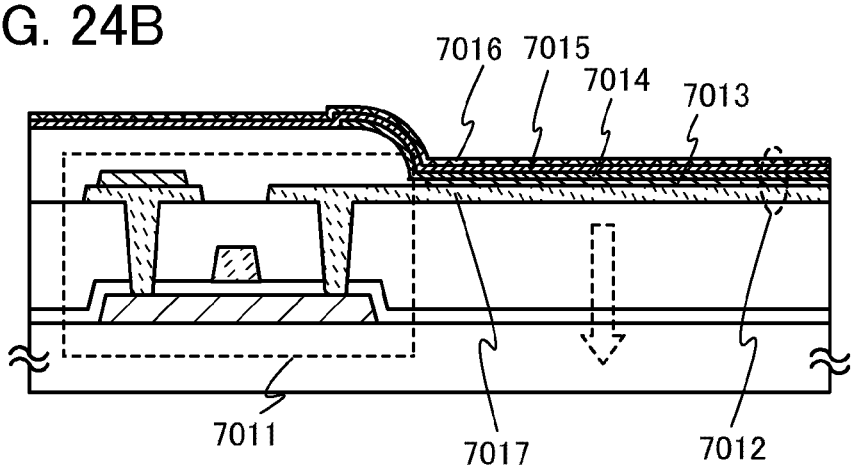
Figure 24C:
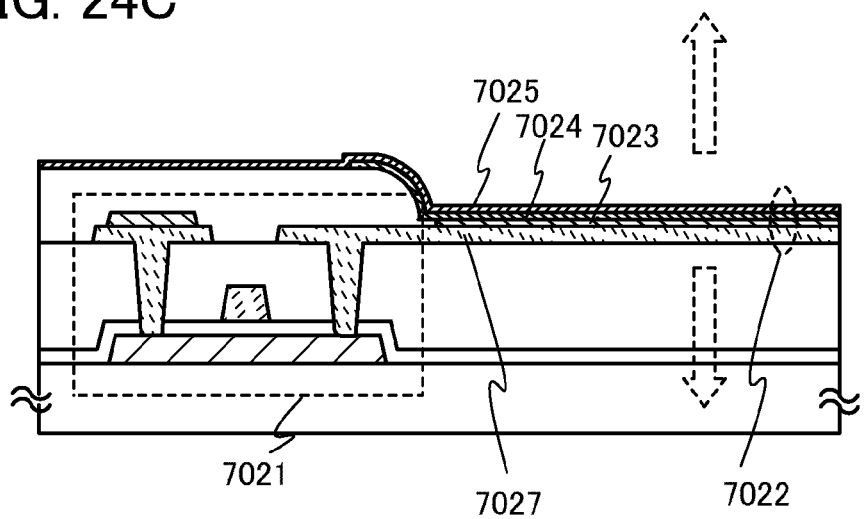

The semiconductor device described in this embodiment is not limited to the structures illustrated in FIGS. 24A to 24C and can be modified in various ways based on the spirit of techniques disclosed.

Figure 25A:
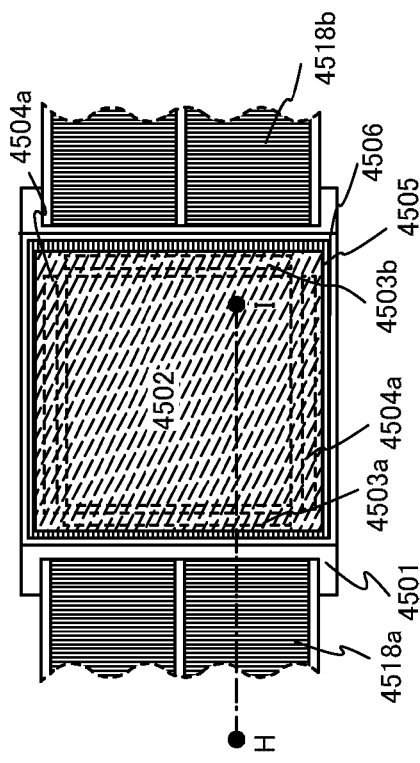
FIGS. 25A and 25B are a top view and a cross-sectional view of a semiconductor device.
Figure 25B:
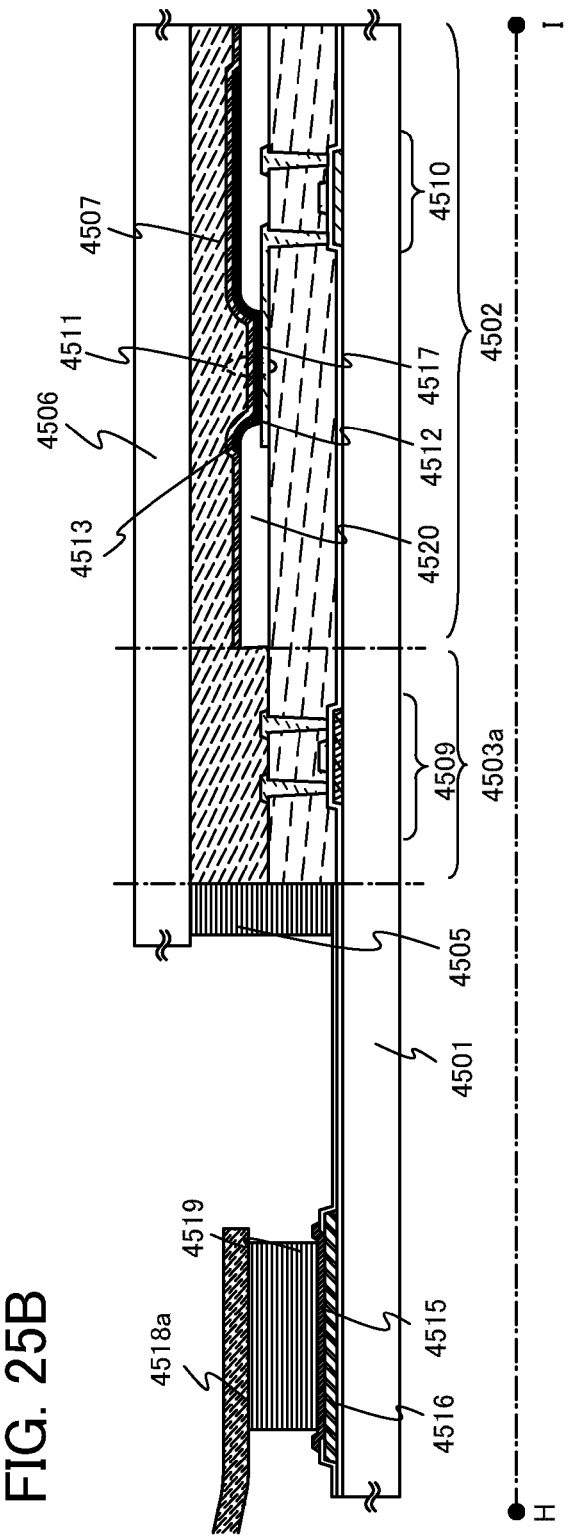

Next, the upper aspect and the cross section of a light-emitting display panel (also referred to as a light-emitting panel) which corresponds to one embodiment of a semiconductor device will be described with reference to FIGS. 25A and 25B. FIG. 25A is a top view of a panel in which thin film transistors and a light-emitting element, which are formed over a first substrate, are sealed between the first substrate and a second substrate with a sealant. FIG. 25B corresponds to a cross-sectional view taken along line H-I of FIG. 25A.

The sealant 4505 is provided so as to surround a pixel portion 4502, a signal line driver circuits 4503a and 4503b, and scan line driver circuits 4504a and 4504b which are provided over the first substrate 4501. In addition, the second substrate 4506 is formed over the pixel portion 4502, the signal line driver circuits 4503a and 4503b, and scan line driver circuits 4504a and 4504b. Accordingly, the pixel portion 4502, the signal line driver circuits 4503a and 4503b, and the scan line driver circuits 4504a and 4504b are sealed, together with a filler 4507, with the first substrate 4501, the sealant 4505, and the second substrate 4506. In this manner, it is preferable that the pixel portion 4502, the signal line driver circuits 4503a and 4503b, and the scan line driver circuits 4504a and 4504b be packaged (sealed) with a protective film (such as an attachment film or an ultraviolet curable resin film) or a cover material with high air-tightness and little degasification so that the pixel portion 4502, the signal line driver circuits 4503a and 4503b, and the scan line driver circuits 4504a and 4504b are not exposed to the outside air.

The pixel portion 4502, the signal line driver circuits 4503a and 4503b, and the scan line driver circuits 4504a and 4504b formed over the first substrate 4501 each include a plurality of thin film transistors, and the thin film transistor 4510 included in the pixel portion 4502 and the thin film transistor 4509 included in the signal line driver circuit 4503a are illustrated as an example in FIG. 25B. As the thin film transistors 4509 and 4510, highly reliable thin film transistors described in any of Embodiments 1 to 3 including In—Ga—Zn—O-based non-single-crystal films as semiconductor layers can be used.

Note that it is not necessary that light is transmitted through a transistor portion in a protective circuit or a peripheral driver circuit portion such as a gate driver or a source driver. Thus, a transistor and a capacitor of the pixel portion 4502 may be formed using light-transmitting materials and a transistor of the peripheral driver circuit portion may be formed using a light-blocking material.

Moreover, reference numeral 4511 denotes a light-emitting element. A first electrode layer 4517 which is a pixel electrode included in the light-emitting element 4511 is electrically connected to a source or drain electrode layer of the thin film transistor 4510. Note that although the light-emitting element 4511 has a layered structure of the first electrode layer 4517, an electric field light-emitting layer 4512, and the second electrode layer 4513, the structure of the light-emitting element 4511 is not limited to the structure described in this embodiment. The structure of the light-emitting element 4511 can be changed as appropriate depending on a direction in which light is extracted from the light-emitting element 4511, or the like.

The partition wall 4520 is formed using an organic resin film, an inorganic insulating film, or organic polysiloxane. It is particularly preferable that the partition wall 4520 be formed using a photosensitive material to have an opening portion on the first electrode layer 4517 so that a sidewall of the opening portion is formed as an inclined surface with a continuous curvature.

The electric field light-emitting layer 4512 may be formed using a single layer or a plurality of layers stacked.

In order to prevent entry of oxygen, hydrogen, moisture, carbon dioxide, or the like into the light-emitting element 4511, a protective film may be formed over the second electrode layer 4513 and the partition wall 4520. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, and the pixel portion 4502 from FPCs 4518a and 4518b.

In this embodiment, a connection terminal electrode 4515 is formed using a conductive film the same as that of the first electrode layer 4517 included in the light-emitting element 4511. A terminal electrode 4516 is formed using a conductive film the same as that of the source and drain electrode layers included in the thin film transistors 4509 and 4510.

The connection terminal electrode 4515 is electrically connected to a terminal included in the FPC 4518a through an anisotropic conductive film 4519.

As the second substrate located in the direction in which light is extracted from the light-emitting element 4511 needs to have a light-transmitting property. In this case, a light-transmitting material such as a glass plate, a plastic plate, a polyester film, or an acrylic film is used.

As the filler 4507, an inert gas such as nitrogen or argon, an ultraviolet curable resin, or a thermosetting resin can be used. For example, polyvinyl chloride (PVC), acrylic, polyimide, an epoxy resin, a silicone resin, polyvinyl butyral (PVB), or ethylene vinyl acetate (EVA) can be used.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Driver circuits formed using a single crystal semiconductor film or polycrystalline semiconductor film over a single crystal semiconductor substrate or an insulating substrate separately prepared may be mounted as the signal line driver circuits 4503a and 4503b and the scan line driver circuits 4504a and 4504b. Alternatively, only the signal line driver circuits or part thereof, or the scan line driver circuits or part thereof may be separately formed and mounted. This embodiment is not limited to the structure illustrated in FIGS. 25A and 25B.

Through the above process, a light-emitting display device can be manufactured at low manufacturing cost.

This embodiment can be implemented in combination with any of the structures described in the other embodiments, as appropriate.

(Embodiment 5)

Next, another structure of a display device, which is an embodiment of a semiconductor device, will be described. In this embodiment, a liquid crystal display device including a liquid crystal element will be described as a display device.

First, the upper aspect and the cross section of a liquid crystal display panel (also referred to as a liquid crystal panel), which is one embodiment of a liquid crystal display device, will be described with reference to FIGS. 26A1, 26A2, and 26B. FIGS. 26A1 and 26A2 are each a top view of a panel in which thin film transistors 4010 and 4011 each including the In—Ga—Zn—O-based non-single-crystal film described in any of Embodiments 1 to 3 as semiconductor layers and a liquid crystal element 4013, which are formed over a first substrate 4001, are sealed between the first substrate 4001 and a second substrate 4006 with a sealant 4005. FIG. 26B is a cross-sectional view taken along line M-N of FIGS. 26A1 and 26A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with liquid crystal 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 26A1 illustrates an example of mounting the signal line driver circuit 4003 by a COG method, and FIG. 26A2 illustrates an example of mounting the signal line driver circuit 4003 by a TAB method.

The pixel portion 4002 and the scan line driver circuit 4004 provided over the first substrate 4001 include a plurality of thin film transistors. FIG. 26B illustrates the thin film transistor 4010 included in the pixel portion 4002 and the thin film transistor 4011 included in the scan line driver circuit 4004, as an example. An insulating layer 4021 is formed over the thin film transistors 4010 and 4011. As the thin film transistors 4010 and 4011, thin film transistors described in any of Embodiments 1 to 3 including In—Ga—Zn—O-based non-single-crystal films as semiconductor layers can be used.

Note that it is not necessary that light is transmitted through a transistor portion in a protective circuit or a peripheral driver circuit portion such as a gate driver or a source driver. Thus, a transistor and a capacitor of the pixel portion 4002 may be formed using light-transmitting materials and a transistor of the peripheral driver circuit portion may be formed using a light-blocking material.

A pixel electrode 4030 included in the liquid crystal element 4013 is electrically connected to the thin film transistor 4010. A counter electrode layer 4031 of the liquid crystal element 4013 is formed on the second substrate 4006. A portion where the pixel electrode 4030, the counter electrode layer 4031, and the liquid crystal layer 4008 are overlapped with one another corresponds to the liquid crystal element 4013. Note that the pixel electrode 4030 and the counter electrode layer 4031 are provided with an insulating layer 4032 and an insulating layer 4033 respectively which each function as an alignment film, and sandwich the liquid crystal layer 4008 with the insulating layers 4032 and 4033 interposed between the pixel electrode layer 4030 and the counter electrode layer 4031.

In the pixel portion 4002 except a lattice-like wiring portion, light can be transmitted, so that the aperture ratio can be improved. Further, a space is necessarily provided between pixel electrodes and an electric field is not applied to liquid crystal in the space portion. Therefore, it is desirable that light is not transmitted in the space portion. Here, the lattice-like wiring portion can be utilized as a black matrix.

Note that the first substrate 4001 and the second substrate 4006 can be formed by using glass, metal (typically, stainless steel), ceramic, or plastic. As plastic, a fiberglass-reinforced plastics (FRP) plate, a polyvinyl fluoride (PVF) film, a polyester film, or an acrylic resin film can be used. Alternatively, a sheet with a structure in which an aluminum foil is sandwiched between PVF films or polyester films may be used.

Reference numeral 4035 denotes a columnar spacer obtained by selectively etching an insulating film and is provided to control the distance between the pixel electrode 4030 and the counter electrode layer 4031 (a cell gap). Alternatively, a spherical spacer may be used. The counter electrode layer 4031 is electrically connected to a common potential line provided over the same substrate as the thin film transistor 4010. With the use of the common connection portion, the counter electrode layer 4031 is electrically connected to the common potential line through conductive particles provided between the pair of substrates. Note that the conductive particles are contained in the sealant 4005.

Alternatively, liquid crystal exhibiting a blue phase for which an alignment film is unnecessary may be used. A blue phase is one of the liquid crystal phases, which is generated just before a cholesteric phase changes into an isotropic phase while a temperature of cholesteric liquid crystal is increased. Since the blue phase is generated only within a narrow range of temperature, a liquid crystal composition containing a chiral agent at 5 wt % or more is used for the liquid crystal layer 4008 in order to increase the temperature range. The liquid crystal composition containing liquid crystal exhibiting a blue phase and a chiral agent has a small response time of 10 μs to 100 μs, has optical isotropy, which makes the alignment process unneeded, and has small viewing angle dependence.

Although an example of a transmissive liquid crystal display device is described in this embodiment, an embodiment of the present invention can also be applied to a reflective liquid crystal display device or a transflective liquid crystal display device.

In this embodiment, an example of the liquid crystal display device is described in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The layered structure of the polarizing plate and the coloring layer is not limited to that described in this embodiment and may be set as appropriate depending on materials of the polarizing plate and the coloring layer or conditions of manufacturing steps. Furthermore, a light-blocking film serving as a black matrix may be provided.

In this embodiment, in order to reduce the surface roughness of the thin film transistor and to improve the reliability of the thin film transistor, the thin film transistor obtained by any of Embodiments 1 to 3 is covered with a protective film or the insulating layer 4021 serving as a planarizing insulating film. The insulating layer 4021 can be formed to have a single-layer structure or a layered structure of two or more layers. Note that the protective film is provided to prevent entry of contamination impurities floating in the air, such as an organic substance, a metal substance, or moisture, and is preferably a dense film. The protective film may be formed by a sputtering method to have a single-layer structure or a layered structure of any of a silicon oxide film, a silicon nitride film, a silicon oxynitride film, a silicon nitride oxide film, an aluminum oxide film, an aluminum nitride film, an aluminum oxynitride film, and an aluminum nitride oxide film. Although this embodiment describes an example of forming the protective film by a sputtering method, the present invention is not particularly limited to this method and any of a variety of methods such as a plasma CVD method may be employed.

An insulating layer having a layered structure can be formed as the protective film. In the case of forming an insulating layer having a layered structure, as a first layer of the protective film, for example, a silicon oxide film is formed by a sputtering method. The use of the silicon oxide film as the protective film has an effect of preventing hillocks of an aluminum film used for the source and drain electrode layers.

Further, as a second layer of the protective film, for example, a silicon nitride film is formed by a sputtering method. The use of the silicon nitride film as the protective film can prevent mobile ions such as sodium ions from entering a semiconductor region, thereby suppressing changes in electrical characteristics of the TFT.

After the protective film is formed, the semiconductor layer may be annealed (at 300° C. to 400° C.). Further, after the protective film is formed, a back gate is formed.

The insulating layer 4021 is formed as the planarizing insulating film. For the insulating layer 4021, an organic material having heat resistance, such as polyimide, acrylic, benzocyclobutene, polyamide, or epoxy, can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed using any of these materials.

Note that a siloxane-based resin is a resin formed using a siloxane material as a starting material and having a Si—O—Si bond. The siloxane-based resin may include as a substituent at least one of fluorine, an alkyl group, and an aryl group, as well as hydrogen.

There is no particular limitation on the method for forming the insulating layer 4021, and the insulating layer 4021 can be formed, depending on the material, by a sputtering method, an SOG method, spin coating, dipping, spray coating, a droplet discharge method (an ink-jet method, screen printing, offset printing, or the like), doctor knife, roll coater, curtain coater, knife coater, or the like. In the case where the insulating layer 4021 is formed using a material solution, the annealing (at 300° C. to 400° C.) of the semiconductor layer may also be performed in a baking step. The baking step of the insulating layer 4021 also serves as the annealing step of the semiconductor layer, whereby a semiconductor device can be manufactured efficiently.

The pixel electrode 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive macromolecule (also referred to as a conductive polymer) can be used for the pixel electrode 4030 and the counter electrode layer 4031. The pixel electrode formed using the conductive composition preferably has a sheet resistance of 10000 Ω/□ or less and a light transmissivity of 70% or more at a wavelength of 550 nm. Further, the resistivity of the conductive macromolecule contained in the conductive composition is preferably 0.1 Ω·cm or less.

As the conductive macromolecule, a so-called π-electron conjugated conductive macromolecule can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, and the pixel portion 4002 from an FPC 4018.

In this embodiment, a connection terminal electrode 4015 is formed using a conductive film the same as that of the pixel electrode layer 4030 included in the liquid crystal element 4013, and a terminal electrode 4016 is formed using a conductive film the same as that of source and drain electrode layers of the thin film transistors 4010 and 4011.

The connection terminal electrode 4015 is electrically connected to a terminal included in the FPC 4018 through an anisotropic conductive film 4019.

Further, FIGS. 26A1 and 26A2 illustrate an example in which the signal line driver circuit 4003 is formed separately and mounted on the first substrate 4001; however, this embodiment is not limited to this structure. The scan line driver circuit may be formed separately and then mounted, or only part of the signal line driver circuit or part of the scan line driver circuit may be formed separately and then mounted.

Figure 27:
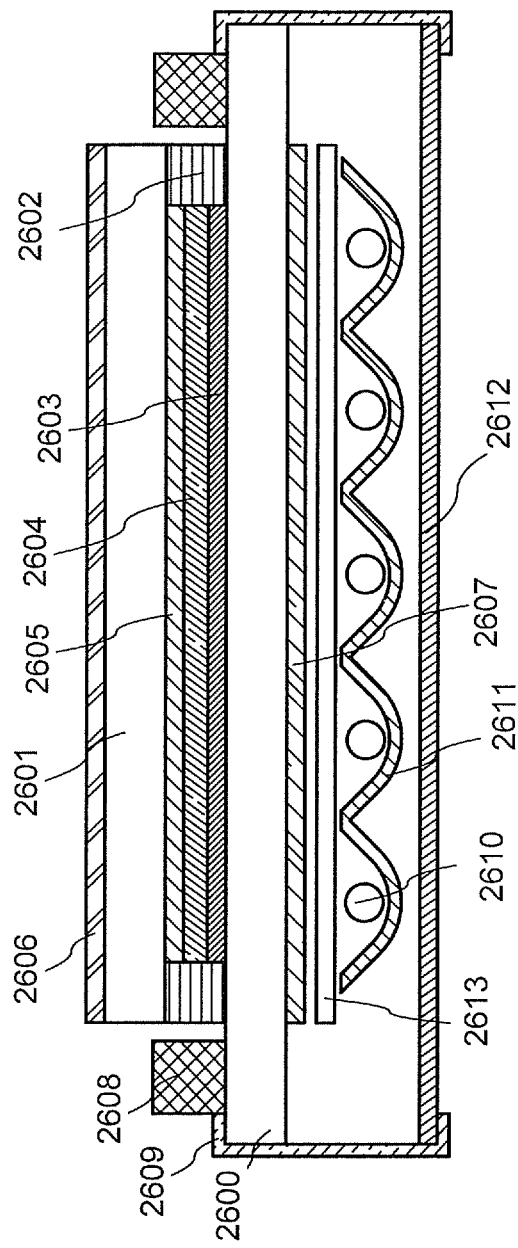
FIG. 27 is a cross-sectional view of a semiconductor device.

FIG. 27 illustrates an example in which a liquid crystal display module is formed as a semiconductor device by using a TFT substrate 2600.

FIG. 27 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, and a coloring layer 2605, are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611, and a circuit substrate 2612 is connected to a wiring circuit portion 2608 of the TFT substrate 2600 through a flexible wiring board 2609 and includes an external circuit such as a control circuit or a power supply circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Through the above process, a liquid crystal display device can be manufactured at low manufacturing cost.

This embodiment can be implemented in combination with any of the structures described in the other embodiments, as appropriate.

(Embodiment 6)

Next, electronic paper which is an embodiment of the semiconductor device will be described. Electronic paper has the same level of readability as plain paper, has lower power consumption than other display devices, and can be made thin and lightweight.

Figure 28:
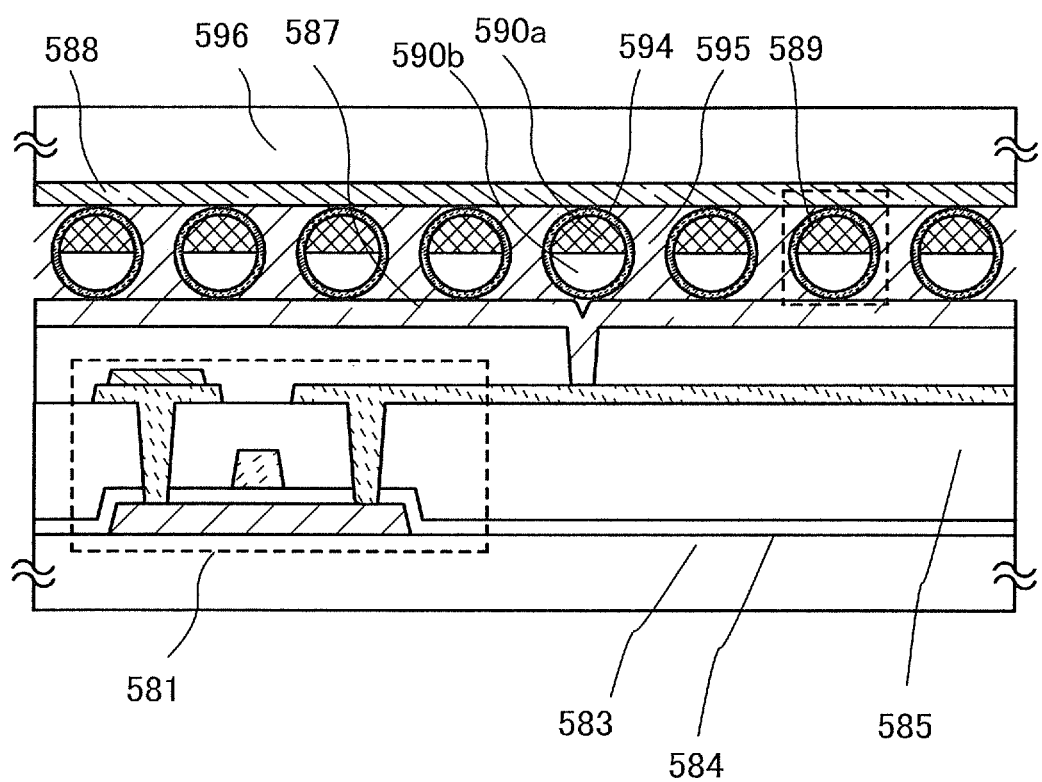
FIG. 28 is a cross-sectional view of a semiconductor device.

FIG. 28 illustrates active matrix electronic paper as an embodiment of a semiconductor device. A thin film transistor 581 used for a pixel portion of the semiconductor device can be manufactured in a manner similar to that of the thin film transistor of the pixel portion described in the above embodiment and is a thin film transistor including an In—Ga—Zn—O-based non-single-crystal film as a semiconductor layer.

The electronic paper in FIG. 28 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control the orientation of the spherical particles, so that display is performed.

The thin film transistor 581 is a bottom-gate thin film transistor, and a source or drain electrode layer is in contact with a first electrode layer 587 through an opening formed in an insulating layer 585, whereby the thin film transistor 581 is electrically connected to the first electrode layer 587. Between the first electrode layer 587 and a second electrode layer 588, spherical particles 589 each having a black region 590*a*, a white region 590*b*, and a cavity 594 around the regions which is filled with liquid are provided. A space around the spherical particles 589 is filled with a filler 595 such as a resin (see FIG. 28).

Instead of the twisting ball, an electrophoretic element may be used. A microcapsule having a diameter of about 10 μm to 200 μm in which transparent liquid, positively-charged white microparticles, and negatively-charged black microparticles are encapsulated, is used. In the microcapsule which is provided between the first electrode layer and the second electrode layer, when an electric field is applied between the first electrode layer and the second electrode layer, the white microparticles and the black microparticles move to opposite sides from each other, so that white or black can be displayed. A display element using this principle is an electrophoretic display element. The electrophoretic display element has higher reflectivity than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if electronic paper is distanced from a power supply source (for example, a source of radio waves).

Through the above process, electronic paper can be manufactured at low manufacturing cost.

This embodiment can be implemented in combination with any of the structures described in the other embodiments, as appropriate.

(Embodiment 7)

A semiconductor device according to an embodiment of the invention disclosed can be applied to a variety of electronic appliances (including an amusement machine). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 29A:
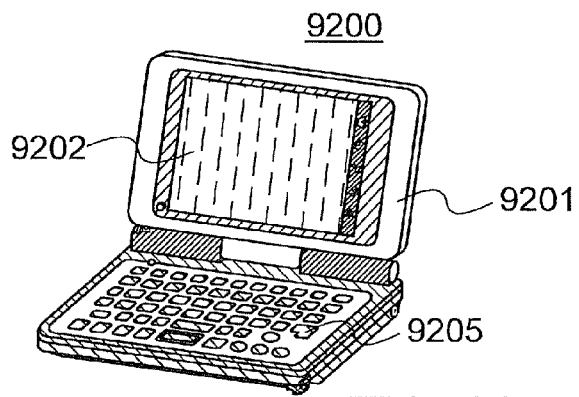
FIGS. 29A to 29D are views of electronic appliances.

FIG. 29A illustrates an example of a portable information terminal device 9200. The portable information terminal device 9200 incorporates a computer and thus can process various types of data. An example of the portable information terminal device 9200 is a personal digital assistant (PDA).

The portable information terminal device 9200 has two housings a housing 9201 and a housing 9203. The housing 9201 and the housing 9203 are joined with a joining portion 9207 such that the portable information terminal device 9200 is foldable. A display portion 9202 is incorporated in the housing 9201, and the housing 9203 is provided with a keyboard 9205. It is needless to say that the structure of the portable information terminal device 9200 is not limited to the above structure as long as the portable information terminal device 9200 includes at least a thin film transistor having a back gate electrode, and an additional accessory may be provided as appropriate. By forming a driver circuit and a pixel portion over one substrate, a portable information terminal device including a thin film transistor having favorable electric characteristics can be manufactured at low manufacturing cost.

Figure 29B:
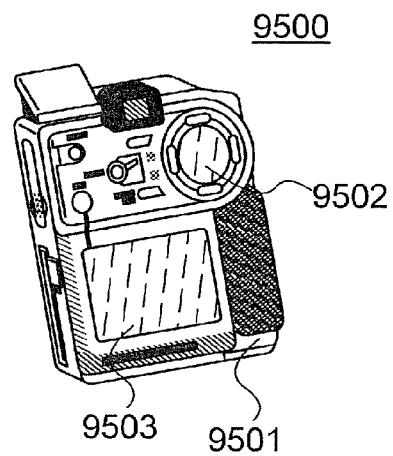

FIG. 29B illustrates an example of a digital video camera 9500. The digital video camera 9500 includes a display portion 9503 incorporated in a housing 9501 and various operation portions. It is needless to say that the structure of the digital video camera 9500 is not particularly limited to the above structure as long as the digital video camera 9500 includes at least a thin film transistor having a back gate electrode, and an additional accessory may be provided as appropriate. By forming a driver circuit and a pixel portion over one substrate, a digital video camera including a thin film transistor having favorable electric characteristics can be manufactured at low manufacturing cost.

Figure 29C:
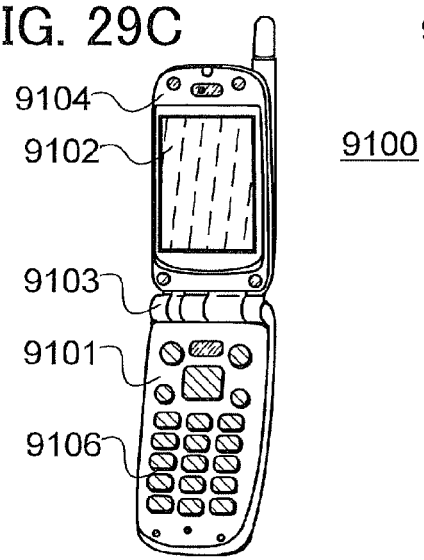

FIG. 29C illustrates an example of a mobile phone handset 9100. The mobile phone handset 9100 has two housings a housing 9102 and a housing 9101. The housing 9102 and the housing 9101 are joined with a joining portion 9103 such that the mobile phone handset is foldable. A display portion 9104 is incorporated in the housing 9102, and the housing 9101 is provided with operation keys 9106. It is needless to say that the structure of the mobile phone handset 9100 is not particularly limited to the above structure as long as the mobile phone handset 9100 includes at least a thin film transistor having a back gate electrode, and an additional accessory may be provided as appropriate. By forming a driver circuit and a pixel portion over one substrate, a mobile phone handset including a thin film transistor having favorable electric characteristics can be manufactured at low manufacturing cost.

Figure 29D:
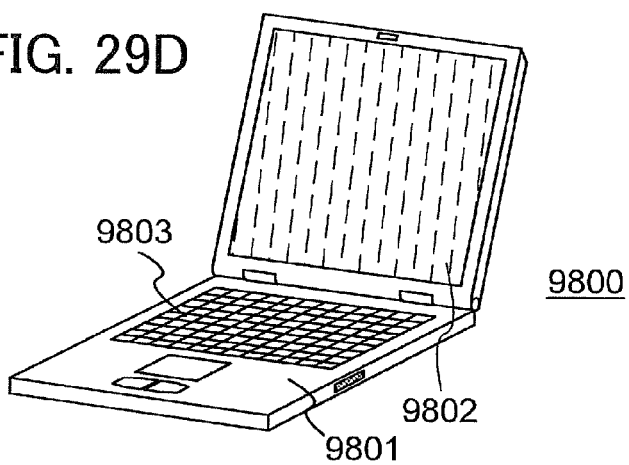

FIG. 29D illustrates an example of a portable computer 9800. The computer 9800 has two housings a housing 9801 and a housing 9804. The housing 9801 and the housing 9804 are joined such that the portable computer can be open and closed. A display portion 9802 is incorporated in the housing 9804, and the housing 9801 is provided with a keyboard 9803 and the like. It is needless to say that the structure of the computer 9800 is not particularly limited to the above structure as long as the portable computer 9800 includes at least a thin film transistor having a back gate electrode, and an additional accessory may be provided as appropriate. By forming a driver circuit and a pixel portion over one substrate, a portable computer including a thin film transistor having favorable electric characteristics can be manufactured at low manufacturing cost.

Figure 30A:
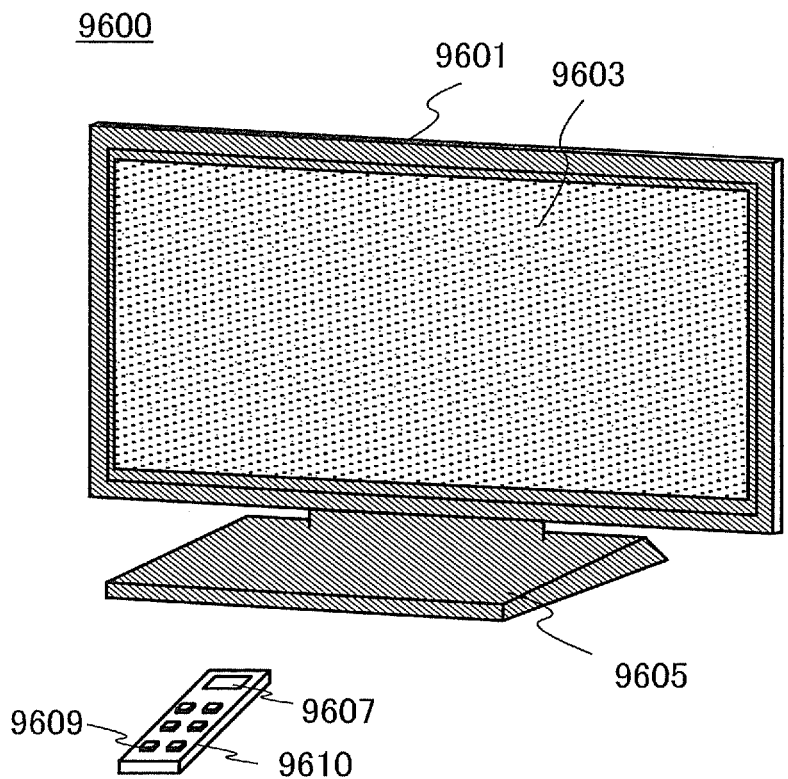
FIGS. 30A and 30B are views of electronic appliances.

FIG. 30A illustrates an example of a television set 9600. In the television set 9600, a display portion 9603 is incorporated in a housing 9601. The display portion 9603 can display an image. Further, the housing 9601 is supported by a stand 9605 here.

The television set 9600 can be operated by an operation switch of the housing 9601 or a separate remote controller 9610. Channels and volume can be controlled by operation keys 9609 of the remote controller 9610 so that an image displayed on the display portion 9603 can be controlled. Further, the remote controller 9610 may be provided with a display portion 9607 for displaying data output from the remote controller 9610.

Note that the television set 9600 is provided with a receiver, a modem, and the like. With the receiver, a general television broadcast can be received. Further, when the television set 9600 is connected to a communication network by wired or wireless connection via the modem, one-way (from a transmitter to a receiver) or two-way (between a transmitter and a receiver or between receivers) data communication can be performed.

Figure 30B:
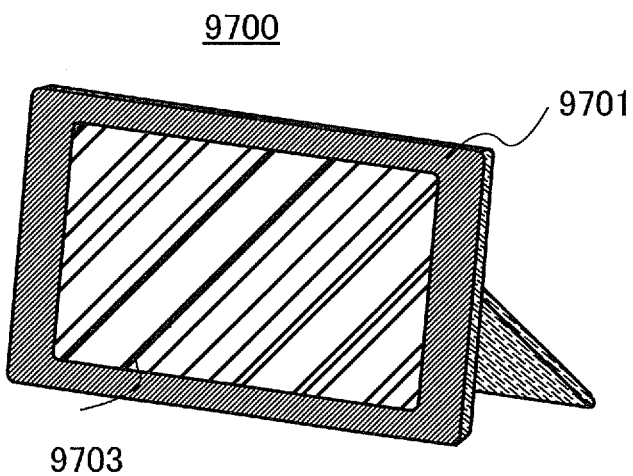

FIG. 30B illustrates an example of a digital photo frame 9700. For example, in the digital photo frame 9700, a display portion 9703 is incorporated in a housing 9701. The display portion 9703 can display various images. For example, the display portion 9703 can display data of an image shot by a digital camera or the like to function as a normal photo frame.

Note that the digital photo frame 9700 is provided with an operation portion, an external connection terminal (a USB terminal, a terminal that can be connected to various cables such as a USB cable, or the like), a recording medium insertion portion, and the like. Although they may be provided on the surface on which the display portion is provided, it is preferable to provide them on the side surface or the back surface for the design of the digital photo frame 9700. For example, a memory storing data of an image shot by a digital camera is inserted in the recording medium insertion portion of the digital photo frame, whereby the image data can be transferred and displayed on the display portion 9703.

The digital photo frame 9700 may transmit and receive data wirelessly. The structure may be employed in which desired image data is transferred wirelessly to be displayed.

Figure 31A:
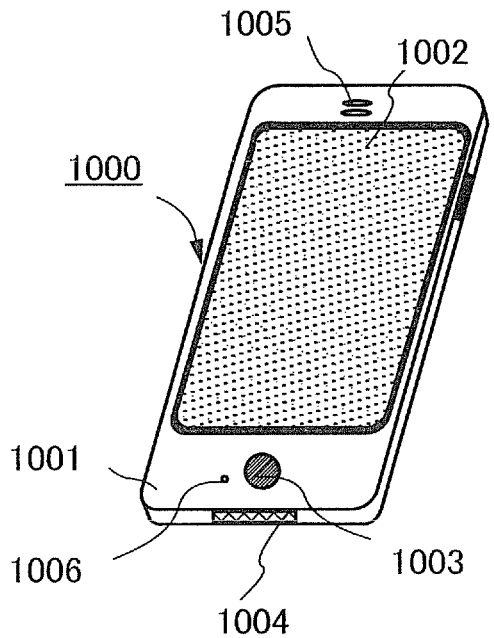
FIGS. 31A and 31B are views of electronic appliances.

FIG. 31A illustrates an example of a mobile phone handset 1000 which is different from that of FIG. 29C. The mobile phone handset 1000 is provided with a display portion 1002 incorporated in a housing 1001, an operation button 1003, an external connection port 1004, a speaker 1005, a microphone 1006, and the like.

When the display portion 1002 of the mobile phone handset 1000 illustrated in FIG. 31A is touched with a finger or the like, data can be input into the mobile phone handset 1000. Further, operations such as making calls and composing mails can be performed by touching the display portion 1002 with a finger or the like.

There are mainly three screen modes of the display portion 1002. The first mode is a display mode mainly for displaying an image. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be inputted. In this case, it is preferable to display a keyboard or number buttons on almost all area of the screen of the display portion 1002.

When a detection device including a sensor for detecting inclination, such as a gyroscope or an acceleration sensor, is provided inside the mobile phone handset 1000, display in the screen of the display portion 1002 can be automatically switched by determining the direction of the mobile phone handset 1000 (whether the mobile phone handset 1000 is placed horizontally or vertically for a landscape mode or a portrait mode).

The screen modes are switched by touching the display portion 1002 or operating the operation button 1003 of the housing 1001. Alternatively, the screen modes may be switched depending on the kind of the image displayed on the display portion 1002. For example, when a signal of an image displayed on the display portion is the one of moving image data, the screen mode is switched to the display mode. When the signal is the one of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of the palm print, the fingerprint, or the like is taken by touching the display portion 1002 with the palm or the finger, whereby personal authentication can be performed. Further, by providing a backlight or sensing light source emitting a near-infrared light for the display portion, an image of a finger vein, a palm vein, or the like can be taken.

Figure 31B:
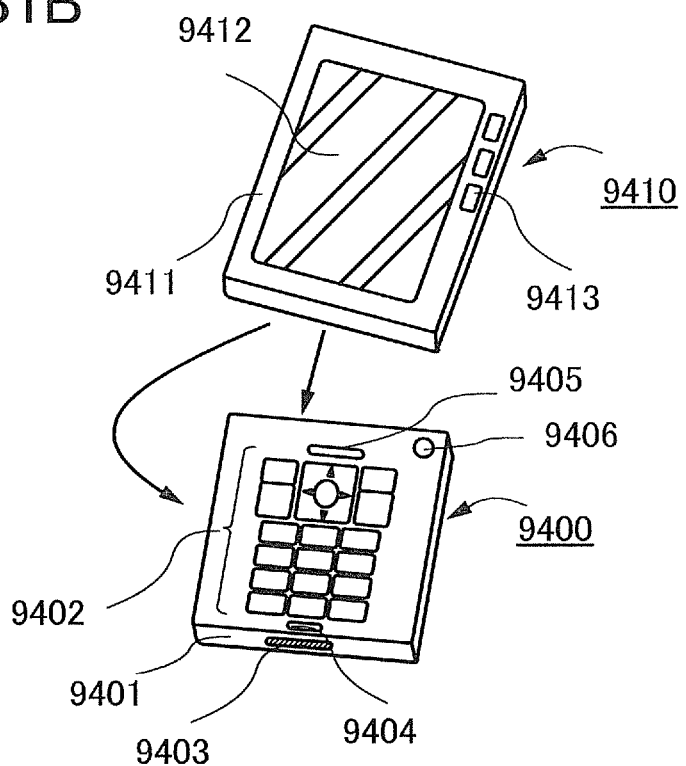

FIG. 31B illustrates another example of a mobile phone handset. The mobile phone handset illustrated in FIG. 31B is provided with a display device 9410 including a display portion 9412 and operation buttons 9413 in a housing 9411 and a communication device 9400 including scan buttons 9402, an external input terminal 9403, a microphone 9404, a speaker 9405, and a light-emitting portion 9406 which emits light when receiving a call in a housing 9401. The display device 9410 having a display function can be detached from or attached to the communication device 9400 having a telephone function in two directions shown by the arrows. Thus, the display device 9410 and the communication device 9400 may be attached to each other along their short sides or long sides. Further, when only the display function is needed, the display device 9410 can be detached from the communication device 9400 and used alone. Images or input data can be transmitted or received by wireless communication or wired communication between the communication device 9400 and the display device 9410, each of which has a rechargeable battery.

This application is based on Japanese Patent Application serial no. 2008-311146 filed with Japan Patent Office on Dec. 5, 2008, the entire contents of which are hereby incorporated by reference.

What is claimed is:

1. A semiconductor device comprising:
a semiconductor film over a substrate;
a first insulating film over the semiconductor film;
a first conductive film over the first insulating film;
a second insulating film over the first conductive film;
a second conductive film having a light-transmitting property and a third conductive film over the second insulating film;
a fourth conductive film having a light-blocking property over the second conductive film;
a third insulating film over the third conductive film and the fourth conductive film; and
a fifth conductive film over the third insulating film,
wherein the fourth conductive film includes a first layer including molybdenum in contact with the second conductive film at least partly and a second layer including aluminum in contact with the first layer at least partly,
wherein the first layer includes a region in contact with the second conductive film,
wherein the second layer includes a region in contact with the first layer,
wherein each of the second conductive film, the third conductive film, and the fifth conductive film includes indium tin oxide, and
wherein the fifth conductive film is in contact with the third conductive film at least partly.

2. The semiconductor device according to claim 1,
wherein both of the second conductive film and the third conductive film are in contact with the second insulating film and include same material.

3. A liquid crystal display module comprising:
the semiconductor device according to claim 1;
a polarizing plate; and
a light source.

4. An electronic appliance comprising:
the liquid crystal display module according to claim 3; and
an operation key.

5. A semiconductor device comprising:
a semiconductor film over a substrate;
a first insulating film over the semiconductor film;
a first conductive film over the first insulating film;
a second insulating film over the first conductive film;
a second conductive film having a light-transmitting property and a third conductive film over the second insulating film;
a fourth conductive film having a light-blocking property over the second conductive film;
a third insulating film over the third conductive film and the fourth conductive film; and
a fifth conductive film over the third insulating film;
wherein the fourth conductive film includes a first layer including titanium in contact with the second conductive film at least partly and a second layer including aluminum in contact with the first layer at least partly,
wherein the first layer includes a region in contact with the second conductive film,
wherein the second layer includes a region in contact with the first layer,
wherein each of the second conductive film, the third conductive film, and the fifth conductive film includes indium tin oxide, and
wherein the fifth conductive film is in contact with the third conductive film at least partly.

6. The semiconductor device according to claim 5,
wherein both of the second conductive film and the third conductive film are in contact with the second insulating film and include same material.

7. A liquid crystal display module comprising:
the semiconductor device according to claim 5;
a polarizing plate; and
a light source.

8. An electronic appliance comprising:
the liquid crystal display module according to claim 7; and
an operation key.

9. A semiconductor device comprising:
a semiconductor film over a substrate;
a first insulating film over the semiconductor film;
a first conductive film over the first insulating film;
a second insulating film over the first conductive film;
a second conductive film having a light-transmitting property and a third conductive film over the second insulating film;
a fourth conductive film having a light-blocking property over the second conductive film;
a third insulating film over the third conductive film and the fourth conductive film; and
a fifth conductive film over the third insulating film;
wherein the fourth conductive film includes a first layer including tungsten in contact with the second conductive film at least partly and a second layer including aluminum in contact with the first layer at least partly,
wherein the first layer includes a region in contact with the second conductive film,
wherein the second layer includes a region in contact with the first layer,
wherein each of the second conductive film, the third conductive film, and the fifth conductive film includes indium tin oxide, and
wherein the fifth conductive film is in contact with the third conductive film at least partly.

10. The semiconductor device according to claim 9,
wherein both of the second conductive film and the third conductive film are in contact with the second insulating film and include same material.

11. A liquid crystal display module comprising:
the semiconductor device according to claim 9;
a polarizing plate; and
a light source.

12. An electronic appliance comprising:
the liquid crystal display module according to claim 11; and
an operation key.

13. A semiconductor device comprising:
a semiconductor film over a substrate;
a first insulating film over the semiconductor film;
a first conductive film over the first insulating film;
a second insulating film over the first conductive film;
a second conductive film having a light-transmitting property and a third conductive film over the second insulating film;
a fourth conductive film having a light-blocking property over the second conductive film;
a third insulating film over the third conductive film and the fourth conductive film; and
a fifth conductive film over the third insulating film;
wherein the fourth conductive film includes a first layer including tantalum in contact with the second conductive film at least partly and a second layer including aluminum in contact with the first layer at least partly, wherein the first layer includes a region in contact with the second conductive film, wherein the second layer includes a region in contact with the first layer, wherein each of the second conductive film, the third conductive film, and the fifth conductive film includes indium tin oxide, and wherein the fifth conductive film is in contact with the third conductive film at least partly.

14. The semiconductor device according to claim 13, wherein both of the second conductive film and the third conductive film are in contact with the second insulating film and include same material.

15. A liquid crystal display module comprising:
the semiconductor device according to claim 13;
a polarizing plate; and
a light source.

16. An electronic appliance comprising:
the liquid crystal display module according to claim 15; and
an operation key.

17. A semiconductor device comprising:
a semiconductor film over a substrate;
a first insulating film over the semiconductor film;
a first conductive film over the first insulating film;
a second insulating film over the first conductive film;
a second conductive film having a light-transmitting property and a third conductive film over the second insulating film;
a fourth conductive film having a light-blocking property over the second conductive film;
a third insulating film over the third conductive film and the fourth conductive film; and
a fifth conductive film over the third insulating film;

wherein the fourth conductive film includes a first layer including chromium in contact with the second conductive film at least partly and a second layer including aluminum in contact with the first layer at least partly, wherein the first layer includes a region in contact with the second conductive film, wherein the second layer includes a region in contact with the first layer, wherein each of the second conductive film, the third conductive film, and the fifth conductive film includes indium tin oxide, and wherein the fifth conductive film is in contact with the third conductive film at least partly.

18. The semiconductor device according to claim 17, wherein both of the second conductive film and the third conductive film are in contact with the second insulating film and include same material.

19. A liquid crystal display module comprising:
the semiconductor device according to claim 17;
a polarizing plate; and
a light source.

20. An electronic appliance comprising:
the liquid crystal display module according to claim 19; and
an operation key.

* * * * *